US012573349B2

(12) United States Patent
Li et al.

(10) Patent No.: US 12,573,349 B2
(45) Date of Patent: Mar. 10, 2026

(54) EFFICIENT IMAGE DATA DELIVERY FOR AN ARRAY OF PIXEL MEMORY CELLS

(71) Applicant: GOOGLE LLC, Mountain View, CA (US)

(72) Inventors: Bo Li, Santa Clara, CA (US); Kaushik Sheth, Santa Clara, CA (US); Edwin Lyle Hudson, San Jose, CA (US)

(73) Assignee: GOOGLE LLC, Mountain View, CA (US)

( * ) Notice: Subject to any disclaimer, the term of this patent is extended or adjusted under 35 U.S.C. 154(b) by 0 days.

(21) Appl. No.: 18/150,724

(22) Filed: Jan. 5, 2023

(65) Prior Publication Data

US 2023/0147106 A1      May 11, 2023

Related U.S. Application Data

(63) Continuation-in-part of application No. 18/067,267, filed on Dec. 16, 2022, and a continuation of
(Continued)

(51) Int. Cl.
*G11C 7/12* (2006.01)
*G09G 3/3266* (2016.01)
(Continued)

(52) U.S. Cl.
CPC ......... *G09G 3/3688* (2013.01); *G09G 3/3266* (2013.01); *G09G 3/3275* (2013.01);
(Continued)

(58) Field of Classification Search
CPC .... G11C 7/12; G11C 8/08; G11C 7/14; G11C 7/227; G11C 11/4094; G11C 8/14;
(Continued)

(56) References Cited

U.S. PATENT DOCUMENTS

| | | | |
|---|---|---|---|
| 2,403,731 A | 7/1946 | Macneille | |
| 3,936,817 A | 2/1976 | Levy et al. | |

(Continued)

FOREIGN PATENT DOCUMENTS

| | | |
|---|---|---|
| EP | 0658870 A2 | 6/1995 |
| EP | 1187087 A1 | 3/2002 |

(Continued)

OTHER PUBLICATIONS

"2114A 1024 x4 Bit Static RAM", Component Data Catalog, Intel Corp., Santa Clara, CA, USA, 1982, 7 pages.
(Continued)

*Primary Examiner* — Dismery Mercedes
(74) *Attorney, Agent, or Firm* — Brake Hughes Bellermann LLP

(57) ABSTRACT
A backplane design for delivering image data in an efficient manner to a memory cell forming a part of a pixel driver comprises a word line design and a column data register release signal delivery design that are speed matched and a complementary bit line delivery design that is speed matched to a row decoder signal circuit operative to pull a word line driver to a state to enable the memory circuits of that row to receive data from the column drivers for each column. The speed matching is effective over a range of operating temperatures because the circuit designs are substantially identical.

21 Claims, 21 Drawing Sheets

Related U.S. Application Data application No. 17/568,831, filed on Jan. 5, 2022, now abandoned, said application No. 18/067,267 is a continuation of application No. 17/354,419, filed on Jun. 22, 2021, now Pat. No. 11,538,431, said application No. 17/568,831 is a continuation-in-part of application No. 17/354,419, filed on Jun. 22, 2021, now Pat. No. 11,538,431.

(60) Provisional application No. 63/045,252, filed on Jun. 29, 2020.

(51) Int. Cl.

| | |
|---|---|
| *G09G 3/3275* | (2016.01) |
| *G09G 3/36* | (2006.01) |
| *G11C 7/08* | (2006.01) |
| *G11C 7/14* | (2006.01) |
| *G11C 7/18* | (2006.01) |
| *G11C 7/22* | (2006.01) |
| *G11C 8/08* | (2006.01) |
| *G11C 16/08* | (2006.01) |
| *G11C 16/24* | (2006.01) |
| *G11C 16/28* | (2006.01) |
| *G11C 29/12* | (2006.01) |

(52) U.S. Cl.
CPC ................. *G11C 7/08* (2013.01); *G11C 7/12* (2013.01); *G11C 7/14* (2013.01); *G11C 7/18* (2013.01); *G11C 7/22* (2013.01); *G11C 7/227* (2013.01); *G11C 8/08* (2013.01); *G11C 16/08* (2013.01); *G11C 16/24* (2013.01); *G11C 16/28* (2013.01); *G09G 2300/0857* (2013.01); *G09G 2310/0264* (2013.01); *G09G 2360/12* (2013.01); *G11C 2029/1204* (2013.01)

(58) Field of Classification Search
CPC ....... G11C 7/18; G11C 11/4099; G11C 16/24; G11C 11/1657; G11C 7/1039; G11C 11/4085; G11C 29/24; G11C 11/419; G11C 2029/1204; G11C 7/08; G11C 16/06; G11C 11/413; G11C 7/22; G06F 12/0804; G09G 3/3688; G09G 2360/12; G09G 2300/0413; G09G 2300/0857; G09G 2310/0264; G09G 2300/0426; G09G 3/3233; G09G 3/3677; G09G 3/3225; G09G 3/3275; G09G 3/3266; H10D 89/10; H10D 86/60
See application file for complete search history.

(56) References Cited

U.S. PATENT DOCUMENTS

| | | |
|---|---|---|
| 4,432,610 A | 2/1984 | Kobayashi et al. |
| 4,825,201 A | 4/1989 | Watanabe et al. |
| 4,923,285 A | 5/1990 | Ogino et al. |
| 4,996,523 A | 2/1991 | Bell et al. |
| 5,018,838 A | 5/1991 | Barnes et al. |
| 5,144,418 A | 9/1992 | Brown et al. |
| 5,157,387 A | 10/1992 | Momose et al. |
| 5,189,406 A | 2/1993 | Humphries et al. |
| 5,317,334 A | 5/1994 | Sano |
| 5,359,342 A | 10/1994 | Nakai et al. |
| 5,471,225 A | 11/1995 | Parks |
| 5,473,338 A | 12/1995 | Prince et al. |
| 5,497,172 A | 3/1996 | Doherty et al. |
| 5,537,128 A | 7/1996 | Keene et al. |
| 5,548,347 A | 8/1996 | Melnik et al. |
| 5,566,010 A | 10/1996 | Ishii et al. |
| 5,602,559 A | 2/1997 | Kimura |
| 5,619,228 A | 4/1997 | Doherty |
| 5,731,802 A | 3/1998 | Aras et al. |
| 5,751,264 A | 5/1998 | Cavallerano et al. |
| 5,767,832 A | 6/1998 | Koyama et al. |
| 5,818,413 A | 10/1998 | Hayashi et al. |
| 5,905,482 A | 5/1999 | Hughes et al. |
| 5,926,158 A | 7/1999 | Yoneda et al. |
| 5,926,162 A | 7/1999 | Wood et al. |
| 5,929,162 A | 7/1999 | Horne et al. |
| 5,936,603 A | 8/1999 | Lippmann et al. |
| 5,936,604 A | 8/1999 | Endou |
| 5,945,972 A | 8/1999 | Okumura et al. |
| 5,959,598 A | 9/1999 | McKnight |
| 5,969,512 A | 10/1999 | Matsuyama |
| 5,969,701 A | 10/1999 | Numao et al. |
| 5,986,640 A | 11/1999 | Baldwin et al. |
| 6,005,558 A | 12/1999 | Hudson et al. |
| 6,034,659 A | 3/2000 | Wald et al. |
| 6,046,716 A | 4/2000 | McKnight |
| 6,067,065 A | 5/2000 | Worley et al. |
| 6,121,948 A | 9/2000 | Worley et al. |
| 6,127,991 A | 10/2000 | Uehara et al. |
| 6,144,356 A | 11/2000 | Weatherford et al. |
| 6,151,011 A | 11/2000 | Worley et al. |
| RE37,056 E | 2/2001 | Wortel et al. |
| 6,201,521 B1 | 3/2001 | Doherty |
| 6,262,703 B1 | 7/2001 | Perner |
| 6,285,360 B1 | 9/2001 | Li |
| 6,297,788 B1 | 10/2001 | Shigeta et al. |
| 6,317,112 B1 | 11/2001 | Handschy et al. |
| 6,369,782 B2 | 4/2002 | Shigeta |
| 6,424,330 B1 | 7/2002 | Johnson |
| 6,456,267 B1 | 9/2002 | Sato et al. |
| 6,476,792 B2 | 11/2002 | Hattori et al. |
| 6,518,945 B1 | 2/2003 | Pinkham |
| 6,567,138 B1 | 5/2003 | Krusius et al. |
| 6,587,084 B1 | 7/2003 | Alymov et al. |
| 6,603,452 B1 | 8/2003 | Serita |
| 6,621,488 B1 | 9/2003 | Takeuchi et al. |
| 6,690,432 B2 | 2/2004 | Janssen et al. |
| 6,717,561 B1 | 4/2004 | Pfeiffer et al. |
| 6,731,306 B2 | 5/2004 | Booth et al. |
| 6,744,415 B2 | 6/2004 | Waterman et al. |
| 6,762,739 B2 | 7/2004 | Bone |
| 6,784,898 B2 | 8/2004 | Lee et al. |
| 6,788,231 B1 | 9/2004 | Hsueh |
| 6,806,871 B1 | 10/2004 | Yasue |
| 6,831,626 B2 | 12/2004 | Nakamura et al. |
| 6,850,216 B2 | 2/2005 | Akimoto et al. |
| 6,862,012 B1 | 3/2005 | Funakoshi et al. |
| 6,924,824 B2 | 8/2005 | Adachi et al. |
| 6,930,667 B1 | 8/2005 | Ijima et al. |
| 6,930,692 B1 | 8/2005 | Coker et al. |
| 7,066,605 B2 | 6/2006 | Dewald et al. |
| 7,067,853 B1 | 6/2006 | Yao |
| 7,088,325 B2 | 8/2006 | Ishii |
| 7,088,329 B2 | 8/2006 | Hudson |
| 7,129,920 B2 | 10/2006 | Chow |
| 7,187,355 B2 | 3/2007 | Tam et al. |
| 7,379,043 B2 | 5/2008 | Worley et al. |
| 7,397,980 B2 | 7/2008 | Frisken |
| 7,443,374 B2 | 10/2008 | Hudson |
| 7,468,717 B2 | 12/2008 | Hudson |
| 7,692,671 B2 | 4/2010 | Ng |
| 7,852,307 B2 | 12/2010 | Hudson |
| 7,990,353 B2 | 8/2011 | Chow |
| 8,040,311 B2 | 10/2011 | Hudson et al. |
| 8,111,271 B2 | 2/2012 | Hudson et al. |
| 8,264,507 B2 | 9/2012 | Hudson et al. |
| 8,421,828 B2 | 4/2013 | Hudson et al. |
| 8,643,681 B2 | 2/2014 | Endo et al. |
| 9,047,818 B1 | 6/2015 | Day et al. |
| 9,117,746 B1 | 8/2015 | Clark et al. |
| 9,406,269 B2 | 8/2016 | Lo et al. |
| 9,583,031 B2 | 2/2017 | Hudson et al. |
| 9,824,619 B2 | 11/2017 | Hudson et al. |
| 9,858,988 B1 * | 1/2018 | Ghosh ................... G11C 11/419 |
| 9,918,053 B2 | 3/2018 | Lo et al. |
| 10,437,402 B1 | 10/2019 | Pan |
| 10,957,272 B2 | 3/2021 | Li et al. |

(56) References Cited

U.S. PATENT DOCUMENTS

| | | | |
|---|---|---|---|
| 11,043,262 | B2 | 6/2021 | Madhavan et al. |
| 2001/0013844 | A1 | 8/2001 | Shigeta |
| 2002/0024481 | A1 | 2/2002 | Kawabe et al. |
| 2002/0041266 | A1 | 4/2002 | Koyama et al. |
| 2002/0043610 | A1 | 4/2002 | Lee et al. |
| 2002/0135309 | A1 | 9/2002 | Okuda |
| 2002/0140662 | A1 | 10/2002 | Igarashi |
| 2002/0158825 | A1 | 10/2002 | Endo et al. |
| 2002/0186579 | A1* | 12/2002 | Yokozeki .............. G11C 11/419 365/154 |
| 2003/0058195 | A1 | 3/2003 | Adachi et al. |
| 2003/0156102 | A1 | 8/2003 | Kimura |
| 2003/0174117 | A1 | 9/2003 | Crossland et al. |
| 2003/0202412 | A1* | 10/2003 | Nii ......................... G11C 29/24 365/210.1 |
| 2003/0210257 | A1 | 11/2003 | Hudson et al. |
| 2004/0001353 | A1* | 1/2004 | Hidaka .............. G11C 11/1675 365/171 |
| 2004/0032636 | A1 | 2/2004 | Willis |
| 2004/0042275 | A1* | 3/2004 | Yoshizawa ............ G11C 29/02 365/189.07 |
| 2004/0080482 | A1 | 4/2004 | Magendanz et al. |
| 2004/0125090 | A1 | 7/2004 | Hudson |
| 2004/0174328 | A1 | 9/2004 | Hudson |
| 2005/0001794 | A1 | 1/2005 | Nakanishi et al. |
| 2005/0001806 | A1 | 1/2005 | Ohmura |
| 2005/0052437 | A1 | 3/2005 | Hudson |
| 2005/0057466 | A1 | 3/2005 | Sala et al. |
| 2005/0062765 | A1 | 3/2005 | Hudson |
| 2005/0073885 | A1* | 4/2005 | Suzuki .................. G11C 11/417 365/185.2 |
| 2005/0088462 | A1 | 4/2005 | Borel |
| 2005/0195894 | A1 | 9/2005 | Kim et al. |
| 2005/0200300 | A1 | 9/2005 | Yumoto |
| 2005/0264586 | A1 | 12/2005 | Kim |
| 2006/0012589 | A1 | 1/2006 | Hsieh et al. |
| 2006/0012594 | A1 | 1/2006 | Worley et al. |
| 2006/0066645 | A1 | 3/2006 | Ng |
| 2006/0147146 | A1 | 7/2006 | Voigt et al. |
| 2006/0208961 | A1 | 9/2006 | Nathan et al. |
| 2006/0284903 | A1 | 12/2006 | Ng |
| 2006/0284904 | A1 | 12/2006 | Ng |
| 2007/0001969 | A1* | 1/2007 | Kodaira ............... G09G 3/3688 345/98 |
| 2007/0109895 | A1* | 5/2007 | Tokito ................... G11C 11/419 365/210.14 |
| 2007/0247939 | A1* | 10/2007 | Nahas ...................... G11C 7/02 365/158 |
| 2007/0252855 | A1 | 11/2007 | Hudson |
| 2007/0252856 | A1 | 11/2007 | Hudson et al. |
| 2008/0007576 | A1 | 1/2008 | Ishii et al. |
| 2008/0088613 | A1 | 4/2008 | Hudson et al. |
| 2008/0101143 | A1* | 5/2008 | Jung ......................... G11C 7/08 365/210.1 |
| 2008/0158437 | A1 | 7/2008 | Arai et al. |
| 2008/0218438 | A1 | 9/2008 | Aral et al. |
| 2008/0259019 | A1 | 10/2008 | Ng |
| 2009/0027360 | A1 | 1/2009 | Kwan et al. |
| 2009/0027364 | A1 | 1/2009 | Kwan et al. |
| 2009/0115703 | A1 | 5/2009 | Cok |
| 2009/0207165 | A1* | 8/2009 | Shirai .................... G09G 3/346 359/291 |
| 2009/0284671 | A1 | 11/2009 | Leister |
| 2009/0303248 | A1 | 12/2009 | Ng |
| 2010/0073270 | A1 | 3/2010 | Ishii et al. |
| 2010/0214646 | A1 | 8/2010 | Sugimoto et al. |
| 2010/0253995 | A1 | 10/2010 | Reichelt |
| 2010/0295836 | A1 | 11/2010 | Matsumoto et al. |
| 2011/0109299 | A1 | 5/2011 | Chaji et al. |
| 2011/0109670 | A1 | 5/2011 | Sempel et al. |
| 2011/0199405 | A1 | 8/2011 | Dallas et al. |
| 2011/0205100 | A1 | 8/2011 | Bogaerts |
| 2011/0227887 | A1 | 9/2011 | Dallas et al. |
| 2012/0086733 | A1 | 4/2012 | Hudson et al. |
| 2012/0113167 | A1 | 5/2012 | Margerm et al. |
| 2012/0257457 | A1* | 10/2012 | Park ...................... G11C 16/28 365/185.25 |
| 2013/0038585 | A1 | 2/2013 | Kasai |
| 2013/0128656 | A1* | 5/2013 | Rimondi .......... G11C 29/12015 365/154 |
| 2013/0308057 | A1 | 11/2013 | Lu et al. |
| 2014/0085426 | A1 | 3/2014 | Leone et al. |
| 2014/0092105 | A1 | 4/2014 | Guttag et al. |
| 2015/0067290 | A1* | 3/2015 | Chaba ................. G06F 13/1689 711/167 |
| 2015/0155054 | A1* | 6/2015 | Lee ......................... G11C 29/08 365/201 |
| 2015/0245038 | A1 | 8/2015 | Clatanoff et al. |
| 2016/0163243 | A1* | 6/2016 | Park ...................... G09G 3/3258 345/87 |
| 2016/0203801 | A1 | 7/2016 | De Groot et al. |
| 2016/0365055 | A9 | 12/2016 | Hudson et al. |
| 2017/0061867 | A1 | 3/2017 | Cok et al. |
| 2018/0012649 | A1* | 1/2018 | Ghosh ....................... G11C 7/22 |
| 2018/0061302 | A1 | 3/2018 | Hu et al. |
| 2018/0114800 | A1* | 4/2018 | Pan ...................... H10H 29/142 |
| 2018/0197471 | A1 | 7/2018 | Rotzoll et al. |
| 2019/0114987 | A1* | 4/2019 | Li ......................... G09G 3/3233 |
| 2019/0198064 | A1* | 6/2019 | Gupta ...................... G11C 7/08 |
| 2019/0259346 | A1 | 8/2019 | Amarilio |
| 2019/0347994 | A1 | 11/2019 | Lin et al. |
| 2020/0098307 | A1 | 3/2020 | Li et al. |
| 2021/0201771 | A1 | 7/2021 | Li et al. |
| 2021/0256901 | A1 | 8/2021 | Hudson et al. |
| 2021/0407455 | A1* | 12/2021 | Li ............................ G09G 3/32 |

FOREIGN PATENT DOCUMENTS

| | | |
|---|---|---|
| GB | 2327798 A | 2/1999 |
| JP | H0214490 A | 1/1990 |
| JP | 7049663 A | 2/1995 |
| JP | 2002116741 A | 4/2002 |
| JP | 2010508616 A | 3/2010 |
| JP | 2020502557 A | 1/2020 |
| KR | 20150064449 A | 6/2015 |
| TW | 227005 B | 7/1994 |
| TW | 407253 B | 10/2000 |
| TW | 418380 B | 1/2001 |
| TW | 482991 B | 4/2002 |
| TW | 483282 B | 4/2002 |
| TW | 200603192 A | 1/2006 |
| WO | 0070376 A1 | 11/2000 |
| WO | 0152229 A1 | 7/2001 |
| WO | 2007127849 A2 | 11/2007 |
| WO | 2007127852 A2 | 11/2007 |

OTHER PUBLICATIONS

Amon, et al., "PTAT Sensors Based on SJFETs", 10th Mediterranean Electrotechnical Conference, MEleCon, vol. II, 2000, pp. 802-805.

Anderson, et al., "Holographic Data Storage: Science Fiction or Science Fact", Akonia Holographics LLC, presented at Optical Data Storage, 2014, 8 pages.

Armitage, et al., "Introduction to Microdisplays", John Wiley & Sons, 2006, pp. 182-185.

"Sony 3D", screen capture from video clip, 2009, 2 pages.

Baker, "CMOS Circuit Design, Layout, and Simulation", IEEE Press Series on Microelectronic Systems, John Wiley & Sons, Inc., Publication, 2010, pp. 614-616.

Campardo, et al., "VLSI-Design of Non-Volatile Memories", Springer, 2005, pp. 183-188.

Colgan, et al., "On-Chip Metallization Layers for Reflective Light Waves", Journal of Research Development, vol. 42. No. 3/4, May-Jul. 1998, pp. 339-345.

CSE370, "Flip-Flops", Lecture 14, https://studylib.net/doc/18055423/flip-flops, no date, pp. 1-17.

Dai, et al., "Characteristics of LCoS Phase-only spatial light modulator and its applications", Optics Communications vol. 238, especially section 3.2, 2004, pp. 269-276.

(56) References Cited

OTHER PUBLICATIONS

Drabik, "Optically Interconnected Parallel Processor Arrays", A Thesis, Georgia Institute of Technology, Dec. 1989, pp. 121-126.

Fuller, "Static Random Access Memory -SRAM", Rochester Institute of technology to Microelectronic Engineering, Nov. 18, 2016, pp. 1-39.

Hu, "Complementary MOS (CMOS) Technology", Feb. 13, 2009, pp. 198-200.

Jesacher, et al., "Broadband suppression of the zero diffraction order of an SLM using its extended phase modulation range", Optics Express, vol. 22, No. 14, Jul. 14, 2014, pp. 17590-17599.

Kang, et al., "Digital Driving of TN-LC for WUXGA LCOS Panel", Digest of Technical Papers, Society for Information Display, 2001, pp. 1264-1267.

Nakamura, et al., "Modified drive method for OCB LSD", Proceeding of the International Display Research Conference, Society for Information Display, Campbell, CA, US, 1997, 4 pages.

Ong, "Modern Mos Technology: Processes, Devices, and Design", McGraw-Hill Book Company, 1984, pp. 207-212.

Oton, et al., "Multipoint phase calibration for improved compensation of inherent wavefront distortion in parallel aligned liquid crystal on silicon display", Applied Optics, vol. 46, No. 23, Optical Society of America, 2007, pp. 5667-5679.

Pelgrom, et al., "Matching Properties of MOS Transistors", IEEE Journal of Solid-State Circuits, vol. 23, No. 5, Oct. 1989, 8 pages.

Potter, et al., "Optical correlation using a phase-only liquid crystal over silicon spatial light modulator", SPIE 1564 Opt. Info. Proc. Sys & Arch. III;, 1991, pp. 363-372.

Product Description, "Westar's Microdisplay Inspection System", www.westar.com/mdis, Jan. 2000, 2 pages.

Rabaey, et al., "Digital Integrated Circuits", A Design Perspective, Second Edition, Saurabh Printers Pvt. Ltd, 2016, pp. 138-140.

Rabaey, "The Devices Chapter 3", Jan. 18, 2002, pp. 121-124.

Robinson, et al., "Polarization Engineering for LCD Projection", John Wiley and Sons, Ltd., Chichester, England, 2005, pp. 121-123.

Sloof, et al., "An Improved WXGA LCOS Imager for Single Panel Systems", Proceedings of the Asia Symposium on Information Display, Society for Information Display, Campbell, CA, US, 2004, 4 pages.

SMPTE 274M-2005 , "1920×1080 Image Sample Structure, Digital Representation and Digital Timing Reference Sequences for Multiple Picture Rates", SMPTE, White Plains, New York, US, 2005, 29 pages.

Underwood, et al., "Evaluation of an nMOS VLSI array for an adaptive liquid-crystal spatial light modulator", IEEE Proc, v.133 PI.J. No., Feb. 1986, 15 pages.

Wang, "Studies of Liquid Crystal Response Time", University of Central Florida, Doctoral Dissertation, 2005, 128 pages.

Wu, "Discussion #9 MOSFETs", University of California at Berkeley College of Engineering Department of Electrical Engineering and Computer Sciences, Spring 2008, pp. 1-7.

International Search Report and Written Opinion for PCT Application No. PCT/US2023/060174, mailed on Mar. 14, 2023, 17 pages.

* cited by examiner

EFFICIENT IMAGE DATA DELIVERY FOR AN ARRAY OF PIXEL MEMORY CELLS

CROSS REFERENCE TO RELATED APPLICATIONS

This Application is a Continuation-in-Part of U.S. application Ser. No. 18/067,267, filed on Dec. 16, 2022, which is a Continuation of U.S. application Ser. No. 17/354,419 (now U.S. Pat. No. 11,538,431), filed on Jun. 22, 2021, which claims the benefit of U.S. Provisional Patent Application Ser. No. 63/045,252, filed on Jun. 29, 2020, all of which are incorporated herein by reference in their entireties This Application also is a Continuation of U.S. application Ser. No. 17/568,831, filed on Jan. 5, 2022, which is a Continuation-in-Part of U.S. application Ser. No. 17/354,419 (now U.S. Pat. No. 11,538,431), filed on Jun. 22, 2021, which claims the benefit of U.S. Provisional Patent Application Ser. No. 63/045,252, filed on Jun. 29, 2020, all of which are incorporated herein by reference in their entireties.

FIELD

The disclosure relates to the efficient delivery of image data to a pixel driver memory cell in the form of a single bit of data corresponding to a bit plane required to establish a modulation state for the duration of the bit plane. More particularly, this relates to the delivery of image data to the pixels of a pulse width modulated display.

BACKGROUND

The use of semiconductor backplanes as a component for spatial light modulators is well known in the art. Microdisplays used to generate images to be observed by human viewers have been offered for sale for over 20 years and are well attested to in the published and patent literature. Later applications have emerged in telecommunications devices wherein a phase aligned spatial light modulator can be used to steer a coherent beam of light to a desired location through use of a suitable kinoform (phase mask) implemented by modulating a liquid crystal layer. The backplane technology used for both classes of devices are often identical. Large format liquid crystal on silicon microdisplays are of particular value. They are found in projection systems for business meeting support as well as in projectors for digital cinema. A large-format phase aligned spatial light modulator (SLM) based on the same silicon design may be used to expand the number of incoming beams that can be steered to different outgoing ports in a telecommunications router.

Liquid crystal on silicon devices have been implemented using silicon backplane designs based on memory devices. In an early example, Dr. Timothy Drabik discloses in his doctoral thesis *Optically Interconnected Parallel Processor Arrays*, (Georgia Institute of Technology, Atlanta, GA, December 1989) (hereafter Drabik 1989), on page 125, the use of an SRAM as the basis of a pulse-width modulated 64 by 64 liquid crystal array, commonly referred to as a liquid crystal on silicon, or LCOS, device. Drabik 1989 identifies that the SRAM may be written either by using byte-wide operation wherein a byte of data comprising 8 bits may be written to 8 memory cells of the selected row or else by using row-page mode wherein all eight bytes on a row comprising 64 memory cells may be written when the selected row line (wordline) is held high. Those of ordinary skill in the art of electronic design will recognize that the byte-wide mode requires that the individual columns be addressable whereas the row-page mode does not specifically require that capability although row-page mode is certainly compatible with that means of addressing data to columns.

In another point regarding Drabik 1989, the thesis on that same page notes two specific aspects of the SRAM as implemented intended to increase operating speed. The first is the row-page mode previously described because it reduces the number of times the wordline of the row must be pulled high from 8 to 1. The second is the addition of an inverter circuit to isolate the 6-transistor SRAM circuit of each pixel driver from load coming from the pixel driver mirror. Drabik 1989 reports that this allows the hold time required to set the state of the SRAM circuit to be reduced from a few microseconds (µsec) to a few nanoseconds (nsec). Applicant notes that efforts to decrease the time required to accomplish necessary actions such as the writing of data have been ongoing since the earliest days of liquid crystal on silicon displays and spatial light modulators.

Applicant has previously developed a backplane with an aspect ratio of 4096 by 2400 (a 128 by 75 ratio), comprised of square pixel drivers with a pitch of 3.74 micrometers (µm) in both horizontal and vertical directions. The target process for this development is a 130 nanometer (nm) process using copper circuits and transistors underneath aluminum pixel mirrors with an optional interposing layer to prevent unwanted interactions between two dissimilar metal layers. The pixel mirrors act not only to reflect light but are driven by a voltage supplied by the underlying circuits that corresponds to a desired modulation. The image diagonal of the array of the backplane is 0.70 inches (0.70"). One limitation of this choice of resolution and process is that the maximum voltage range spread for the pixel mirrors is approximately 4 volts. A spread of 5 volts or more is far more desirable, especially for phase-aligned devices where the liquid crystal cell must be thicker because the required phase modulation range is at least double that required for an amplitude-aligned display. This voltage limitation results from the library of transistors available within the process selected and the need to keep the pixel driver array area within an area approximately equal to the square of the pixel display pitch. Additionally, the height of a row driver and the width of a column driver must conform to the pixel pitch for that dimension.

Applicant currently holds U.S. Pat. No. 7,443,374, the entire contents whereof are incorporated by reference, that discloses a pixel driver design comprising a 6 transistor SRAM and other elements that has been implemented in a 250-nm process, a 180-nm process and a 130-nm process. (See particularly, FIGS. 5-8, including the correction to FIG. 6.)

Other pixel drivers exist that may receive the benefits of the present invention. For example, the pixel driver described in U.S. Pat. No. 6,005,558, the entire contents whereof are incorporated herein by reference, also relies on a one-bit SRAM memory cell to establish a modulation state for the pixel drivers. The pixel driver of 6,005,558 and the pixel driver of 7,443,374 have approximately the same effect on an associated liquid crystal layer but accomplish this through means that are otherwise substantially dissimilar. Other pixel drivers relying on one-bit SRAM or DRAM devices may benefit from the implementations described herein.

In the present application, the terms wire, conductor and line are presumed to mean a conductive medium, such as aluminum, copper, or polysilicon, although other conductive mediums are within the scope of the present disclosure. The use of the word terminal means a conductive medium operative to connect to a node of a circuit element, such as a logic gate or a source, gate or drain of a transistor, or to the bulk of a semiconductor. The terms word line, wordline and WLINE are all used by practitioners in the art and are to be considered equivalent to one another. The terms row driver and wordline driver shall be considered to be equivalent to one another. The terms bit line, bitline and column line shall be considered to be equivalent to one another. The terms column driver and bitline driver shall be considered to be equivalent to one another.

SUMMARY

It is therefore an object of the implementations described herein to improve on a backplane forming a part of a display system by reducing the time required to load a plane of data to the pixel drivers of that backplane. In particular, a device design in which the setup and hold time requirement may be reduced relative to other designs will enable the writing of data to the storage element of each pixel driver more rapidly and also enable the entire pixel driver array to be written more rapidly. This will mean a higher overall data rate than would otherwise be possible.

DETAILED DESCRIPTION

Figure 1A:
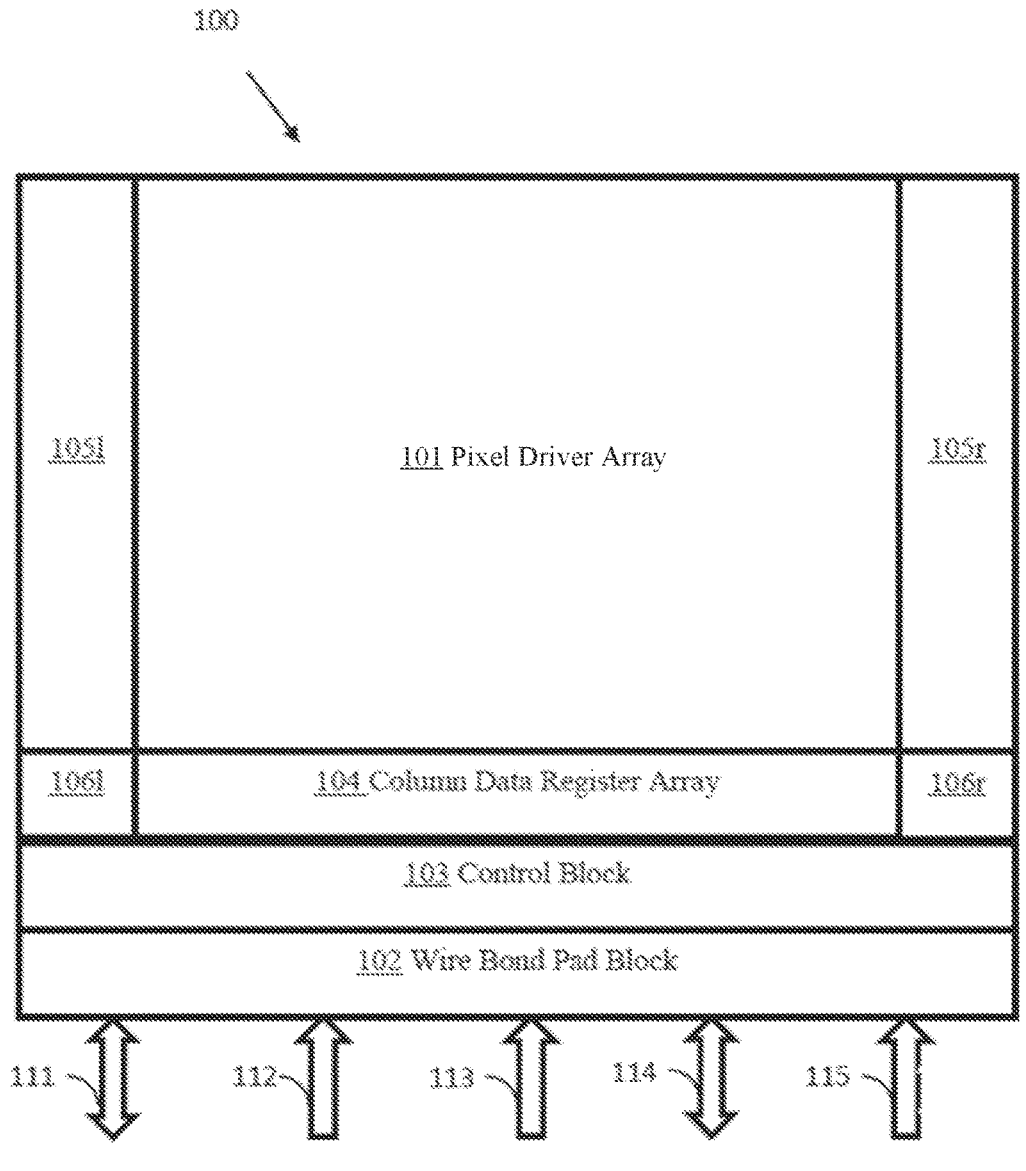
FIG. 1A illustrates a functional block diagram of the backplane of a spatial light modulator.

A backplane can be configured with an array of pixel drivers (also can be referred to as a pixel driver array) to drive pixels within pixels included in a display (pixel display). The array of pixel drivers can include many individual pixel drivers. The pixel display (including micro light emitting diodes (LEDs) or other emitters) is often coupled to the array of pixel drivers. The area of the pixel display can correspond with the area of the array of pixel drivers. Images can be displayed by driving individual pixels associated with the images through wordlines (which are aligned in rows) and bitlines (which are aligned in columns) in, for example, a backplane. In order for individual pixels within a display to properly display an image, the delivery, with the proper timing, of image data associated with the image for an individual pixel using one or more pixel drivers is critical. Moreover, simultaneously driving a wordline and an intersecting bitline with image data for an individual pixel within a pixel display is critical.

The technical problem with known backplanes is that they are not able to simultaneously drive wordlines and bitlines at very high speeds (e.g., frequencies) and/or tight timing tolerances. Known backplanes often have buffer circuits (e.g., arrays of inverters, etc.) and/or timing circuits outside of a pixel driver array that have metal lines, semiconductor device diffusions, connections to transistors, and/or so forth that are prone to variations due to semiconductor processing, temperature, undesirable stray inductances, and/or so forth. Specifically, the components outside of the pixel driver array of a backplane can respond differently to variations than components inside of the pixel driver array of a backplane. Because of these variations, the timing, frequency, and so forth of known backplanes are slowed down to increase timing windows to drive pixel displays with image data in a desirable fashion. Specifically, respective mismatches in the effect of variations on the components inside and outside of a pixel driver array of a backplane can necessitate an increase in, for example, timing windows of the backplane in order for the backplane to properly drive a corresponding pixel display. In other words, timing windows are adjusted to account for mismatches in the respective effect of variations on components inside and outside of a pixel driver array of a backplane associated with a pixel display.

The technical solution described herein (which can be referred to as Resistive-Capacitive (RC) tracking) includes backplane circuitry configured to eliminate mismatches of the effects of variations on the backplane and, specifically, components inside and outside of the pixel driver array within the backplane due to semiconductor processing, temperature, undesirable stray inductances, and/or so forth. This can be referred to as RC tracking because variations (due to semiconductor processing, temperature, etc.) of components outside of the pixel driver array track the variations of components inside of the pixel driver array. The components outside of the pixel driver array can be identical (or mirrored) to the components inside of the pixel driver array (except for being disabled or deactivated) so that the RC characteristics can be matched or mirrored between the components outside and inside of the pixel driver array. Specifically, the backplane circuitry includes an array of dummy pixel drivers (or a portion thereof) (e.g., data storage elements such as a static random-access memory (SRAM) associated with one or more pixel drivers) outside of the pixel driver array (e.g., pixel driver array area) and aligned along the bitline direction (can be referred to as a dummy bitline) within a wordline path of the pixel driver array (e.g., within a row select path of a wordline path). The backplane circuitry can also include an array of dummy pixel drivers (or a portion thereof) (e.g., data storage elements such as a static random-access memory (SRAM) associated with one or more pixel drivers) outside of the pixel driver array (e.g., pixel driver array area) and aligned along the wordline direction (can be referred to as a dummy wordline) within a bitline path of the pixel driver array (e.g., within a data load trigger path of a bitline path). In some implementations, the array of dummy pixel drivers can include only portions (e.g., copied portions) of an actual (or active) pixel driver (e.g., just the data storage element (or a disabled version (e.g., deactivated version) of the data storage element) of a pixel driver). These arrays of dummy pixel drivers (e.g., dummy bitline pixel driver array, dummy wordline pixel driver array), which are outside of the pixel driver array (e.g., active pixel driver array) and are used to transmit image data to the pixels using the pixel driver array, mirror the configuration of the wordlines and bitlines within the pixel driver array. By doing so, variations in semiconductor processing, temperature, and/or so forth that affect the components of the backplane outside of the pixel driver array that drive wordlines and bitlines inside of the pixel driver array can affect the actual wordlines and bitlines within the pixel driver array in the same way as the components of the backplane outside of the pixel driver array.

At least one technical effect of the configurations described herein is that the backplane can use the pixel driver arrays at very high speeds and/or tight timing tolerances to drive pixel displays even with variations. Specifically, variations that may affect the pixel driver array will affect the components of the backplane outside of the pixel driver array in the same way, resulting in timing tolerances that change with the variations. The operating window of the components inside and outside of the array of pixel drivers of a backplane described herein do not need to be increased to account for mismatches in variations of the components of the backplane outside of the pixel driver array and variations of the components (e.g., wordlines, bitlines) of the actual pixel driver array in order to operate at high speeds and/or tight timing tolerances.

More details related to the arrays of dummy pixel drivers and the timing are described in connection with at least FIG. 2A. The components included in the pixel driver array and outside of the pixel driver array of a backplane are described in at least FIGS. 1A through 1E.

FIG. 1A illustrates a functional block diagram comprising the data transfer sections of spatial light modulator (SLM) 100. SLM 100 comprises pixel driver array 101, left row decoder and driver assembly 105*l*, right row decoder and driver assembly 105*r*, left write signal control section 106*l*, right signal control section 106*r*, column data register array 104, control block 103, and wire bond pad block 102. Wire bond pad block 102 is configured so as to enable contact with an FPCA (flexible printed circuit assembly) or other suitable connecting means so as to receive data and control signals over lines from an SLM controller (not shown). The data and control signal lines comprise clock signal line 111, op code signal lines 112, serial input-output signal lines 113, bidirectional temperature signal lines 114, and parallel data signal lines 115. In FIG. 1A, the left row decoder and driver assembly 105*l*, right row decoder and driver assembly 105*r*, and/or column data register array 104 can include one or more dummy pixel drivers (e.g., dummy data storage elements associated with pixel drivers) in accordance with the implementations described herein.

Bidirectional clock signal line 111 provides a clock signal from an external control device (not shown) operative to deliver data to the SLM in coordination with the clock. In one embodiment, both rising edge and falling edge clock edges are used.

Serial input-output lines 113 provide data from an external control device (not shown) operative to configure the SLM to a required operating condition. Bidirectional temperature signal lines 114 provide data from an external control source (not shown) to configure a temperature measurement circuit (not shown) within the SLM to a desired operating condition and to transmit information from the temperature measurement circuit to the external control source.

Wire bond pad block 102 receives image data and control signals and moves these signals to control block 103. Control block 103 receives the image data and routes the image data to column data register array 104. Row address information is routed to row decoder left 105*l* and to row decoder right 105*r*. In one embodiment, only one row decoder is used for the entire array. In one embodiment, the value of Op Code line 112 determines whether data received on parallel data signal lines 115 is address information indicating the row to which data is to be loaded or data to be loaded to a row. In one embodiment the row address information acts as header, appearing first in a time ordered sequence, to be followed by data for that row. In the context of the present application, the word "address" is most often a noun used to convey the location of the row to be written. The location may be conveyed as an offset from the location (address) of a baseline row or it may be an absolute location of the row to be written. This is similar to the manner in which a Random-Access Memory device, such as an SRAM, is written or read. The use of column addressing, also used in Random-Access Memory devices, may be envisioned, but other mechanisms, such as a shift register, are also envisioned. Use of a shift register to enable the writing of data to rows of the array is also envisioned.

Row decoder and driver assembly left **105*l* and row decoder and driver assembly right 105*r* comprise a set of circuits operative to pull a wordline for the decoded row high using a row driver circuit (not shown) so that data for that row may be transferred from column data register array 104 to the storage elements resident in the pixel drivers of the selected row of pixel driver array 101. In one embodiment, row decoder and driver assembly left 105*l* applies a signal operative to pull the wordline high for a left half of the display, and row decoder and driver assembly right 105*r* pulls the wordline high for a right half of the display. In one embodiment, the output of the row decoder. In one embodiment, the circuits of row decoder and driver assemblies 105*l* and 105*r* comprise an AND gate on each row (not shown) operative to receive a signal from a row decoder circuit and a trigger signal from a circuit (not shown) operative to deliver the trigger signal to all AND gates of all rows. Only the AND gate of the selected row receives two high signals and delivers a high signal output. In one embodiment, row decoder and driver assemblies 105*l* and 105*r*** comprise a voltage level shift circuit.

Block **106*l* and block 106*r* represent trigger release circuits operative to deliver a trigger signal to pull the wordline high on the selected row and a separate trigger signal to release the data stored on the memory cell of the bitline driver onto the complementary bitlines for each pixel driver of the selected row. In one embodiment, the signal from trigger release circuits 106*l* and 106*r* forms one input to an AND gate (not shown) which has as a second input a signal from row decoder logic block 105*l* and 105*r*. This gives greater temporal control over the timing of pulling the wordline high. Trigger release circuits 106*l* and 106*r*** may also be thought of as release timing circuits.

Figure 1B:
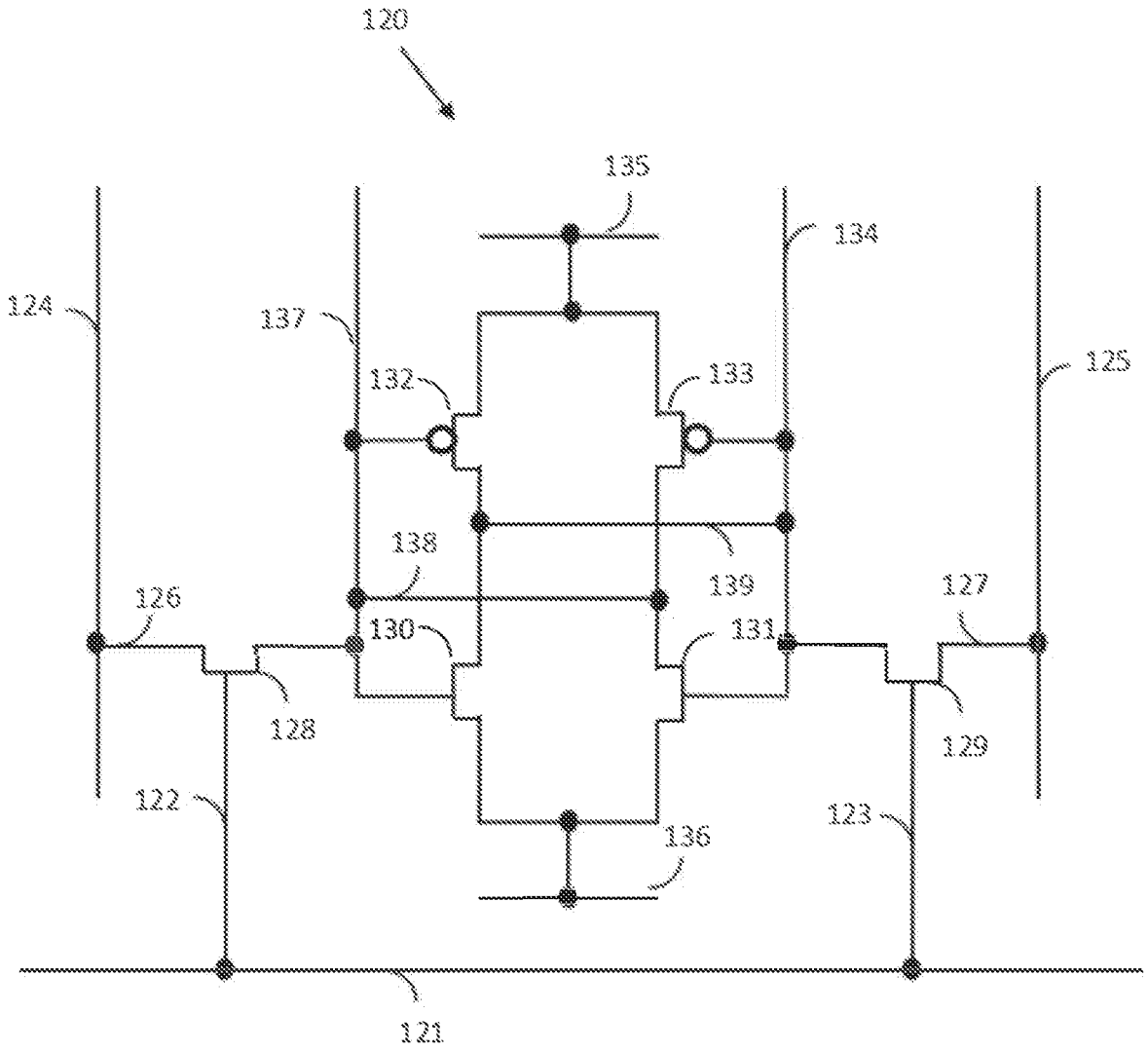
FIG. 1B illustrates an electrical schematic of an SRAM memory cell associated with a pixel driver array.

FIG. 1B shows an embodiment of a data storage element 120 that forms part of a pixel driver. In other words, the data storage element 120 shown in FIG. 1B can be associated with or included in one or more pixel drivers in the pixel driver array 101 shown in FIG. 1A. Data storage element 120 is preferably a CMOS static ram (SRAM) latch device. Such devices are well known in the art. See DeWitt U. Ong, *Modern MOS Technology, Processes, Devices, & Design,* 1984, Chapter 9, Section 5, (hereafter Ong 1984) the details of which are hereby fully incorporated by reference into the present application. See also Drabik 1989, previously cited, FIG. 7.11, page 126. A static RAM is one in which the data is retained as long as power is applied, though no clocks are running FIG. 1B shows the most common implementation of an SRAM memory cell in which six transistors are used. MOSFET transistors 128, 129, 130, and 131 are n-channel transistors, while MOSFET transistors 132, and 133 are p-channel transistors. In this particular design, wordline 121, when held high, applies voltage to the gates of pass transistors 128 and 129 over terminal 122 and 123 respectively, allowing ($B_{POS}$) 124, and ($B_{NEG}$) 125 lines to remain at a pre-charged high state or be discharged to a low state by the flip flop (i.e., transistors 132, 133, 130, and 131). Differential sensing of the state of the flip-flop is then possible in read mode. In writing data into the selected cell, ($B_{POS}$) 124 and ($B_{NEG}$) 125 are forced high or low by additional write circuitry comprising a column driver (not shown). The side that goes to a low value is the one most effective in causing the flip-flop to change state. Data on $B_{POS}$ 124 is asserted onto the source of pass transistor 128 over terminal 126 and data on $B_{NEG}$ 125 is asserted onto the source of pass transistor 129 over terminal 127. The gate voltage applied to transistors 131 and 133 over conductor 134 is asserted onto the drain of transistor and source of transistor 130 over conductor 139. The gate voltage applied to transistors 130 and 132 over conductor 137 is applied to the drain of transistor 133 and the source of transistor 131 over conductor 138. In one embodiment of the present application, two output ports 134 and 137 are required to relay to circuitry in the remainder of the pixel driver whether the data state of the SRAM is in an "on" state or an "off" state. In some embodiments, only one output port is required. Lines ($B_{POS}$) 124 and ($B_{NEG}$) 125 are also commonly referred to as bit lines or bitlines.

Data storage element 120 is connected to $V_{DDAR}$ at bus 135 and to $V_{SS}$ at bus 136. $V_{DDAR}$ denotes the $V_{DD}$ for the array. It is common practice to use lower voltage transistors for periphery circuits such as the I/O circuits and control logic of a backplane for a variety of reasons, including the reduction of EMI and the reduced circuit size that this makes possible. Other voltage difference may be implemented for a variety of reasons too numerous to state succinctly.

The six-transistor SRAM cell is desired in CMOS type design and manufacturing since it involves the least amount of detailed circuit design and process knowledge and is the safest with respect to noise and other effects that may be hard to estimate before silicon is available. In addition, current processes are dense enough to allow large static RAM arrays. These types of storage elements are therefore desirable in the design and manufacture of liquid crystal on silicon display devices as described herein. However, other types of static RAM cells are contemplated by the implementations described herein, such as a four transistor RAM cell using a NOR gate, as well as using dynamic RAM cells rather than static RAM cells.

The convention in looking at the output ports of an SRAM is to term the outputs as complementary signals S_pos or $S_{POS}$ and S_neg or $S_{NEG}$. The output of data storage element 120 is shown as connecting the gate of transistors 133 and 131 over conductor 134. By convention this side of the SRAM is normally referred as $S_{NEG}$. The gates of transistors 132 and 130, connected over conductor 137, are normally referred to as $S_{POS}$. Either side can be used to provide a data source. In the case of U.S. Pat. No. 7,443,374, previous cited, both sides are used with additional circuitry to select one or the other of the two outputs depending on DC balance state.

In some implementations, the data storage element 120 can include other circuit elements such as drivers, inverters, and/or so forth. Such circuit elements can be coupled to, for example, conductor 138 and/or conductor 139.

In some implementations, the data storage element 120 can be included in a dummy bitline (e.g., within a row select path) and/or in a dummy wordline (e.g., within a data load trigger path). In other words, the data storage element 120 can be included in a dummy bitline to be a dummy pixel driver or simulate a pixel driver (or at least a portion thereof) and/or in a dummy wordline to be a dummy pixel driver or simulate a pixel driver (or at least a portion thereof).

When included in a dummy bitline and/or in a dummy wordline, the data storage element 120 shown in FIG. 1B can be modified to be inoperable. The data storage element 120 when modified to be inoperable can be referred to as a disabled data storage element or as a deactivated data storage element. In other words, the disabled data storage element may be disabled such that the data storage element cannot be programmed or cannot store information (e.g., cannot be used as a storage element). For example, the wordline 121 can be tied to ground or VSS so that the data storage element does not function properly as an SRAM device. As another example, the terminal 122 (which is tied to the gate of the pass transistor 128) can be tied to ground or VSS so that the data storage element does not function properly as an SRAM device. As yet another example, the bus 135 can be tied to ground or VSS so that the data storage element does not function properly as an SRAM device. In some implementations, the wordline 121, the terminal 122 and/or the bus 135 can be tied to ground or VSS so that the data storage element does not function properly as an SRAM device. However, the RC characteristics of the disabled data storage element will be the same as that of an active SRAM device or active data storage element 120.

Figure 1C:
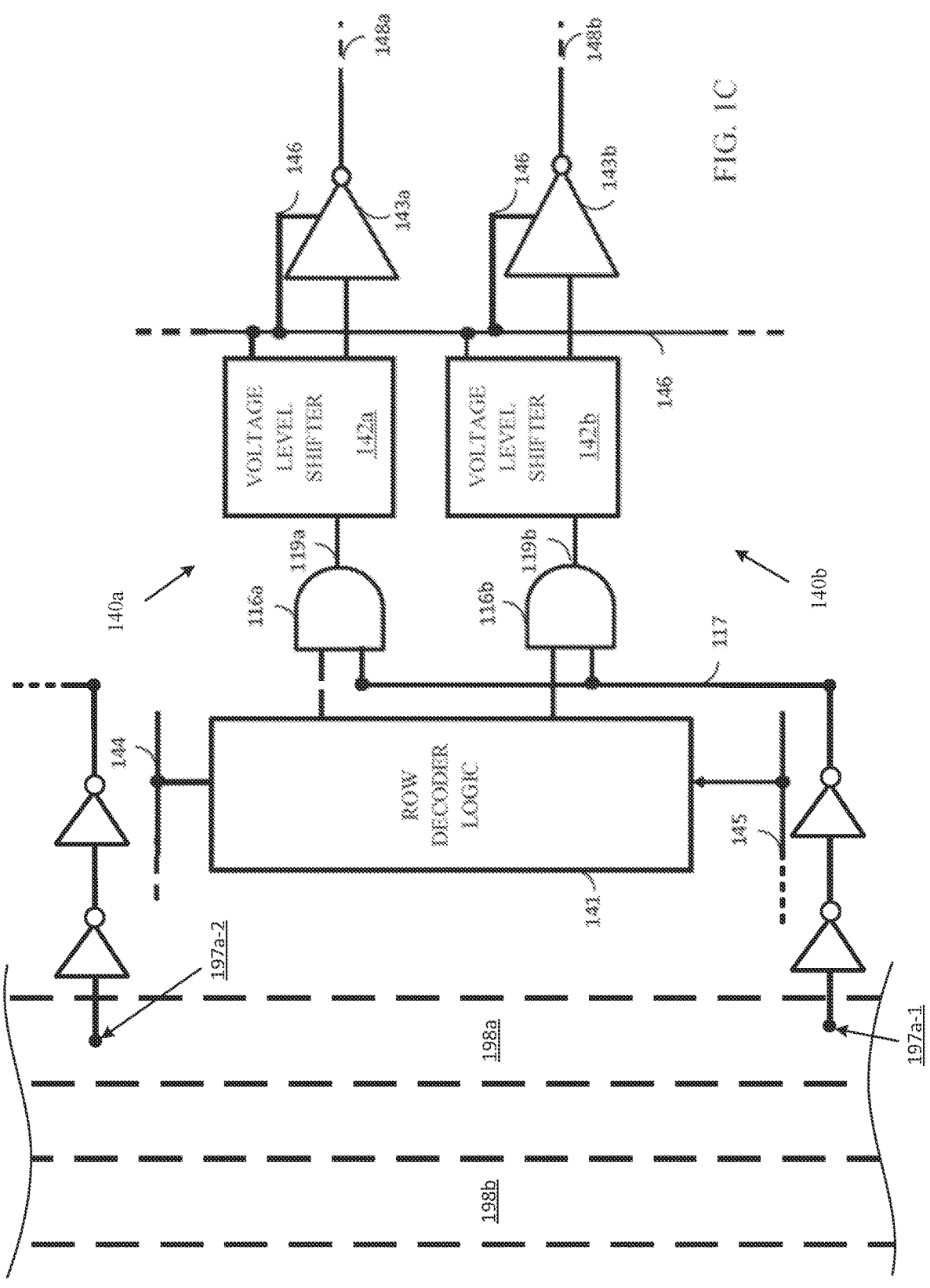
FIG. 1C illustrates a functional block diagram of a portion of a row decoder circuit operative to activate a wordline of a selected row of an SRAM memory associated with a pixel driver array.

FIG. 1C illustrates a block schematic of row drivers 140a, 140b of a device comprising a plurality of rows of SRAM memory cells (not shown) or similar memory cell each forming part of a pixel driver. Row drivers for DRAM circuits are similar to row drivers 140a, 140b. The row drivers 140a, 140b may also be referred to as a wordline drivers. An array of row driver such as row driver 140a can be included in or can function as a row select path such as that shown and described in connection with FIG. 2A. Depicted row drivers 140a, 140b are illustrated as driving two rows. Many additional rows are possible. In one product, applicant has 2464 rows each with an individual row driver. Row drivers 140a, 140b include row decoder logic 141, AND gates 116a and 116b, voltage level shifters 142a and 142b, and inverters 143a and 143b. Row decoder logic 141 is operative to select a single row of all of the rows of an array of SRAM memory cells such as associated with pixel drivers of pixel driver array 101 of FIG. 1A based on address information provided to the backplane. In one embodiment address information identifying a row to which data is to be written is provided in conjunction with the data to be written to that row.

Row decoder logic 141 may be one of several types of row decoders as are well known in the art of Random Access Memories (RAM) design. Row decoder logic 141 is connected to a voltage source (not shown) over conductor 144. The voltage source may be set to $V_{DD}$ or to a different voltage source $V_{DD\_IO}$ or to a third type of voltage source $V_{DD\_RD}$ as selected by the designer. In one embodiment, the voltage source of row selector is lower than the voltage source present within the pixel driver array. Row decoder 141 is connected to $V_{SS}$ over conductor 145. It is common practice for a common $V_{SS}$ to be used across sections of a device with differing $V_{DD}$ voltages in different circuit sections.

As a general rule, a row decoder is limited to four NAND gates because, if more NAND gates are used, the resultant circuit becomes electrically complex and unacceptably slow. To achieve the required functionality over a large number of rows, the decoding is separated into predecoders that in turn provide inputs into a series of decoder circuits. As this is well known and attested to, it is not repeated here. See, for example, *VLSI-Design of Non-Volatile Memories*, G. Campardo, et al, pages 185-188, especially the bottom of page 187, Springer Verlag, Berlin et al, 2005, (hereafter Campardo 2005).

Row decoder logic 141 is operative to provide a voltage as an input to AND gate 116a and to AND gate 116b and to all other rows out of the totality of rows of the SRAM. Only one AND gate receives a high voltage from the row decoder circuit, indicating that that row is the selected row. All AND gates, whether 116a, 116b or another AND gate not shown here, are also connected by trigger gate line 117 (which can also be referred to as an enable line) to a trigger source (not shown). When trigger gate line 117 receives a high voltage, indicating a trigger, that voltage is applied to all AND gates.

Only the AND gate of the selected row fully satisfies the AND gate logic requirement and delivers an on-state voltage to its output. The addition of the AND gate reduces any uncertainty as to be timing of the triggering of the WordLine (WLINE). In one embodiment, AND gates 116a, 116b, and all other AND gates (not shown) comprise a pair of pass transistors in series.

Figure 1D:
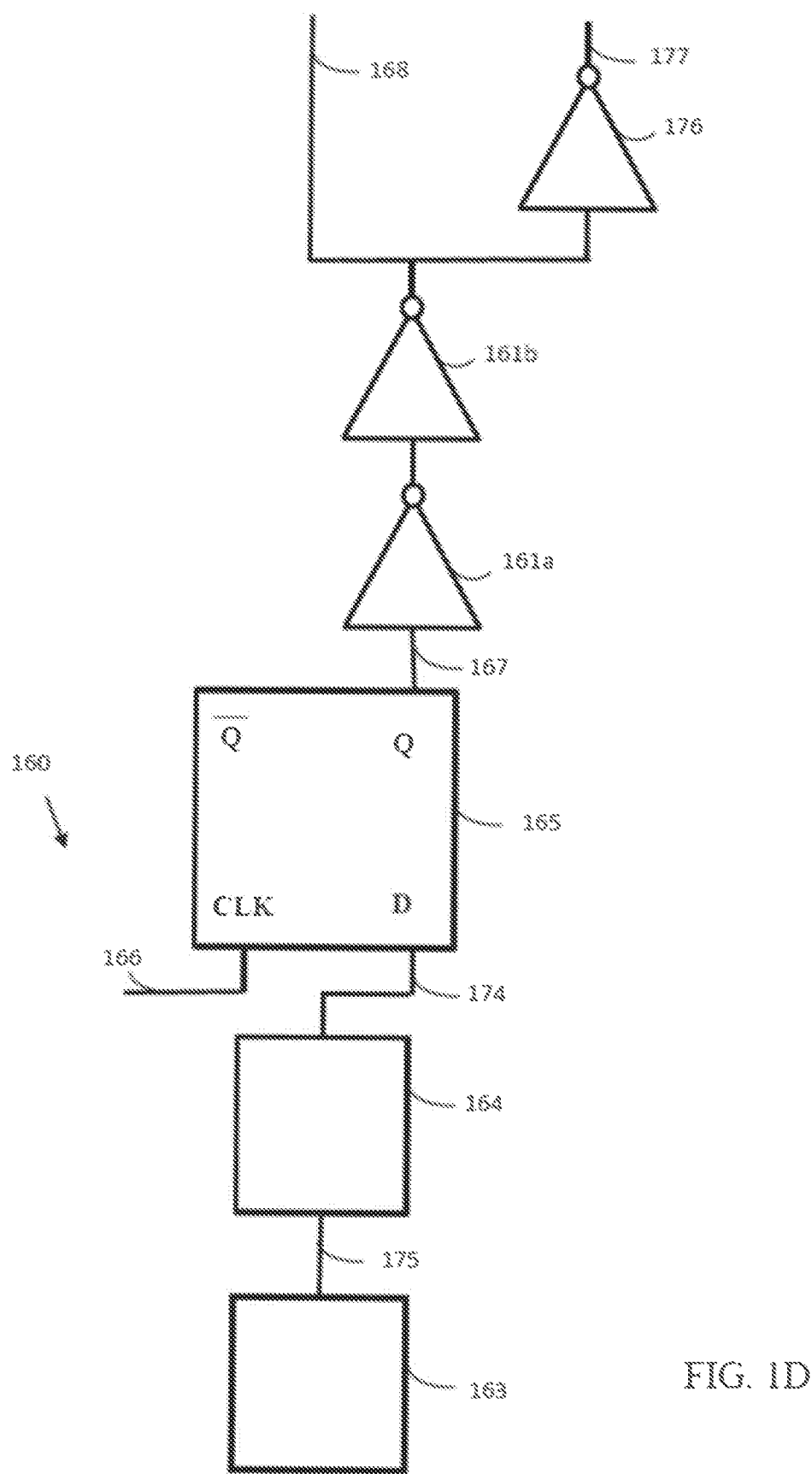
FIGS. 1D and 1E illustrate function block diagrams of column drivers operative to configure the complementary bitlines of a column of an SRAM memory associated with a pixel driver array.

In one embodiment, AND gates 116a and 116b are replaced by logic circuits after logic circuit 165 of column driver 160 of FIG. 1D. Logic circuit 165 may be either a level sensitive D flip-flop or an edge sensitive D latch. The AND gate, the D flip-flop and the D latch are all types of logic circuits. Appropriate inverters, voltage level shifters and other minor circuits (not shown) may be needed to reach the required voltage polarity and voltage level.

In one embodiment the output of AND gate 116a is connected to voltage level shifter 142a over terminal 119a. The output of AND gate 116b is connected to voltage level shifter 142b over terminal 119b. In like manner each of the remaining AND gates is connected to a voltage level shifter over a voltage conducting means, such as a terminal, conductor or wire. The use of a voltage level shifter is preferred when a section of a device, such as an array of memory cells operative to drive pixels within a pixel display requires specific voltage ranges which may differ from the input-output circuits or the periphery.

Voltage level shifter 142a receives a signal from AND gate 116a over terminal 119a, and voltage level shift 142b receives a signal from AND gate 116b over terminal 119b. Each of all other voltage level shifters (not shown) receives a signal from its respective AND gate over a terminal. All these signals are 0 except for the signal from the one selected row. Voltage level shifters 142a, 142b and all other voltage level shifters (not shown) associated with row drivers are connected to a $V_{DD\_WL}$ ($V_{DD}$ WordLine) source over conductor 146. The outputs of voltage level shifters 142a and 142b are connected to inverters 143a and 143b respectively. The outputs of all other voltage level shifters (not shown) that form part of row drivers are in like manner connected to inverters. The output of inverter 143a is asserted on conductor 148a and the output of inverter 143b is asserted on conductor 148b. All other inverters (not shown) are likewise asserted onto conductors and onto feedback conductors. In one embodiment, conductor 148a, conductor 148b, and all other conductors driven in a similar manner are wordlines (WLINE) of an array of pixel driver.

In one embodiment for each row driver, the voltage level shifter comprises a p-channel transistor configured with its source connected to voltage supply $V_{DD\_WL}$ and its drain connected to the output of the AND gate. In that same embodiment, each inverter comprises a p-channel transistor in series with an n-channel transistor wherein the inputs to each transistor is a signal from the AND gate of the row driver to the gates of both transistors and wherein the source of the p-channel transistor is connected to $V_{DD\_WL}$ and the drain of the n-channel transistor is connected to ground ($V_{SS}$). The output of the inverter is connected to the wordline and to the gate of the p-channel transistor of the voltage level shifter (not shown). A detailed explanation of voltage shifters and their use in row drivers is found on pages 184-187 of Campardo 2005 (previously cited). Voltage level shifter designs operative to shift voltages down as well as up are within the scope of this invention.

In one embodiment, the output of the level shifter is held to a voltage lower than the voltage $V_{DD\_AR}$ ($V_{DD\_ARRAY}$). Operating the word line below its maximum possible voltage provides an effective means of lowering the overall current of the array and thereby any residual heating that may result. This may require that the pass transistors for the memory circuits, similar to pass transistors 128 and 129 of data storage element 120 (FIG. 1B), of the array of pixel driver be adapted to conduct when that voltage is applied to their gates.

Capacitance on the wordline (WLINE) places a strong burden on the design of a row driver. Inverters 143*a* and 143*b* serve to buffer each row driver of row driver 140*a*, 140*b* from the effects of the high capacitance load. The nature of the capacitance on the wordline is explained in more detail for FIG. 3.

As shown in FIG. 1C, when included in a dummy bitline (e.g., within a row select path), the row drivers 140*a*, 140*b* can be connected to an array of dummy drivers 198*a* (e.g., array of dummy drivers 198*a* including disabled data storage elements). As discussed above, the disabled data storage elements can be modified versions of the data storage element 120 shown in at least FIG. 1B. The array of dummy drivers 198*a* are illustrated with dashed lines because these elements are optionally included with the row drivers 140*a*, 140*b* when included in a dummy bitline. The array of dummy drivers 198*a* introduces RC characteristics along the trigger gate line 117 (which can also be referred to as an enable line), when within, for example, a row select path (or dummy bitline) that mirrors the RC characteristics of a bitline within a pixel driver array (e.g., pixel driver array 101 shown in FIG. 1C). The array of dummy drivers 198*a* can be substantially identical to the configuration of a bitline other than being disabled (e.g., having disabled data storage elements) so that the RC characteristics of the array of dummy drivers 198*a* replicates the RC characteristics of an active bitline within an active pixel driver array as much as possible.

In this example implementation, the row drivers 140*a*, 140*b* (which can be referred to as a set or section of row drivers) are connecting at a tap 197*a*-1 from the array of dummy drivers 198*a* (e.g., dummy bitline drivers). In this implementation, inverters are optionally connected between the tap 197*a*-1 and the row drivers 140*a*, 140*b*. The row drivers 140*a*, 140*b* and the array of dummy drivers 198*a* can be disposed outside of an active pixel driver array (e.g., pixel driver array 101 shown in FIG. 1A). Another section of row drivers (not shown) can be connected via tap 197*a*-2 to the array of dummy drivers 198*a*. The row drivers 140*a*, 140*b* can be included in a section of row drivers that includes more than two row drivers.

FIG. 1C illustrates an array of dummy drivers 198*b* parallel to the array of dummy drivers 198*a*. One or more sections of row drivers (not shown) can be tapped from the array of dummy drivers 198*b*. The implementation of arrays of dummy drivers (e.g., parallel arrays of dummy drivers) and sections of row drivers tapped from the arrays of dummy drivers (as described in FIG. 1C) and associated with (e.g., outside of) a pixel driver array is described in more detail in at least FIG. 7B.

FIG. 1D illustrates column driver 160. Column driver 160 comprises memory cell 163 operative to store a bit of data, optional voltage level shifter 164 operative to shift a periphery voltage to a bitline voltage, and logic circuit 165 operative to receive a data voltage and assert complementary output voltages through intermediary circuits onto data output terminals 168 and 177 responsive to a data clock signal asserted onto terminal CLK 166. In one embodiment, the data clock signal asserted onto terminal CLK 166 is a trigger signal sent from a trigger control circuit on the backplane (not shown). Alternate names for clock CLK are release REL and enable EN.

Memory cell 163 receives and stores a bit of image data for a plane of image data from an external source. The stored data is asserted on terminal 175 which asserts that data value onto voltage level converter 164. Voltage level converter 164 asserts the converted data voltage level onto terminal 174 which asserts that data voltage onto data terminal D of logic circuit 165. In one embodiment, voltage shifter circuit 164 is replaced with a straight through conductor. In one embodiment, logic circuit 165 is a circuit with two stable states. The voltage asserted on data terminal D is asserted onto Q and its complement onto terminal $\overline{Q}$. The voltage asserted onto terminal Q is asserted onto output terminal 167. Terminal $\overline{Q}$ is not used. Output terminal 167 in turn asserts the value of terminal Q onto inverter 161*a*. The output of inverter 161*a* is asserted onto the input of inverter 161*b*. The output of inverter 161*b* holds the same logic value as the input to inverter 161*a*. Together inverters 161*a* and 161*b* form a buffer operative to isolate column driver 160 from capacitive loading present on the complementary bitlines. The output of inverter 161*b* is asserted onto bitline 168 and onto the input to inverter 176. The output of inverter 176 is asserted onto bitline 177, which logically forms a complementary bitline pair with bitline 168.

Logic circuit 165 enables system level control over the timing of the release of image data onto the bitlines of the driven column of an array of active pixel drivers. Several types of circuits provide the functionality required. Two circuits that are particularly suitable are the D latch and the D flip-flop. (The letter D in the two circuit names may denote either Data or Delay. Both names are indicative of features of the same circuit.) Not all sources make a distinction between latch and flip-flop. In this application, a distinction between a D latch and a D flip-flop is maintained.

A D latch is a level sensitive circuit with nodes comprising a data input node D, a clock node CLK, and output nodes Q and $\overline{Q}$. When CLK is high, the data asserted on D is the data value asserted on Q and its complement is asserted on $\overline{Q}$. If the data asserted on D changes while CLK is high, then the values asserted on Q and $\overline{Q}$ also change.

In contrast, a D flip-flop is a clock edge sensitive circuit. The input and output nodes are the same as for the D latch; however, the performance differs in that when a rising clock edge is detected, the data value asserted on input D is asserted onto Q and its complement is asserted on $\overline{Q}$. If the data value asserted on input D subsequently changes, the outputs asserted onto Q and $\overline{Q}$ do not change until another rising clock edge is detected. A falling clock edge does not affect the output; however, there are similar circuits that trigger on a falling clock edge and not on a rising clock edge. For this application, the clock edge to enable the circuit is assumed to be a rising edge subject to the understanding that alternative implementations fall within the scope of this disclosure. For further reference, 14-Flip-flops.pdf, author unknown, Class Presentation for CSE370, Lecture 14, University of Washington, 2008, pages 2-5 provides useful information.

Figure 1E:
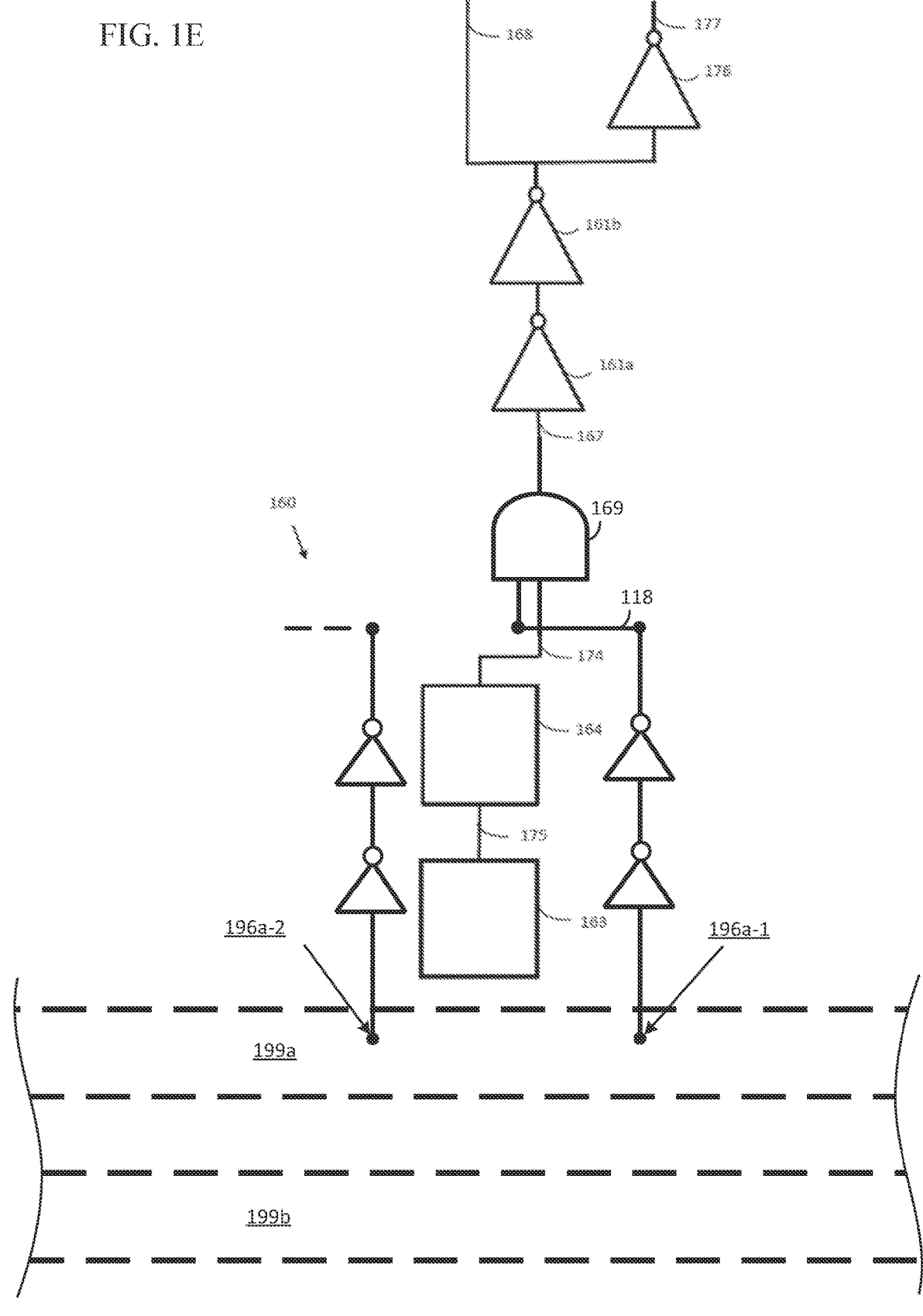

In one embodiment, logic circuit 165 may be replaced with an AND gate such as AND gates 116*a* or 116*b* of word line driver assembly 140*a*, 140*b* of FIG. 1C. An example column driver 160 with an AND gate 169 is shown in FIG. 1E. The operation of the AND gate 169 is similar to the operation of the D latch version as described for logic circuit 165 in FIG. 1D. In fact, both are logic circuits as is the D flip-flop previously described. The AND gate 169 (and other AND gates in column drivers (not shown) arrayed with column driver 160), are also connected by trigger gate line 118 (which can also be referred to as an enable line) to a trigger source (not shown). Appropriate inverters, voltage level shifters and other minor circuits (not shown) may be needed to reach the required voltage polarity and voltage level.

One issue that arises frequently in the design of an array is propagation delay, also known as path propagation delay. As previously noted, applicant has developed arrays with more than 9.8 million pixels (4096×2400). The intersection of each row with each column represents two unique paths.

As shown in FIG. 1E, when included in a dummy word-line (e.g., within a data load trigger path), the column driver 160 (or multiple column drivers) can be connected to an array of dummy drivers 199*a* (e.g., array of dummy drivers 199*a* including disabled data storage elements). As discussed above, the disabled data storage elements can be modified versions of the data storage element 120 shown in at least FIG. 1B. The array of dummy drivers 199*a* are illustrated with dashed lines because these elements are optionally included with the column driver 160 when included in a dummy wordline. The array of dummy drivers 199*a* introduces RC characteristics along the trigger gate line 118 (which can also be referred to as an enable), when within, for example, a data load trigger path (or dummy wordline) that mirrors the RC characteristics of a wordline within a pixel driver array (e.g., pixel driver array 101 shown in FIG. 1A). The array of dummy drivers 199*a* can be substantially identical to the configuration of a wordline other than being disabled (e.g., having disabled data storage elements) so that the RC characteristics of the array of dummy drivers 199*a* replicates the RC characteristics of an active wordline within an active pixel driver array as much as possible.

In this example implementation, the column driver 160 (which can be included in a set or section of column drivers (not shown)) are connecting at a tap 196*a*-1 from the array of dummy drivers 199*a* (e.g., dummy wordline drivers). In this implementation, inverters are optionally connected between the tap 196*a*-1 and the column driver 160. The column driver 160 and the array of dummy drivers 199*a* can be disposed outside of an active pixel driver array (e.g., pixel driver array 101 shown in FIG. 1C). Another section of column drivers (not shown) can be connected via tap 196*a*-2 to the array of dummy drivers 199*a*. The column driver 160 can be included in a section of column drivers that includes more than one column driver.

FIG. 1E illustrates an array of dummy drivers 199*b* parallel to the array of dummy drivers 199*a*. One or more sections of column drivers (not shown) can be tapped from the array of dummy drivers 199*b*. The implementation of arrays of dummy drivers (e.g., parallel arrays of dummy drivers) and sections of column drivers tapped from the arrays of dummy drivers (as described in FIG. 1E) and associated with (e.g., outside of) a pixel driver array is described in more detail in at least FIG. 7B.

Figure 2A:
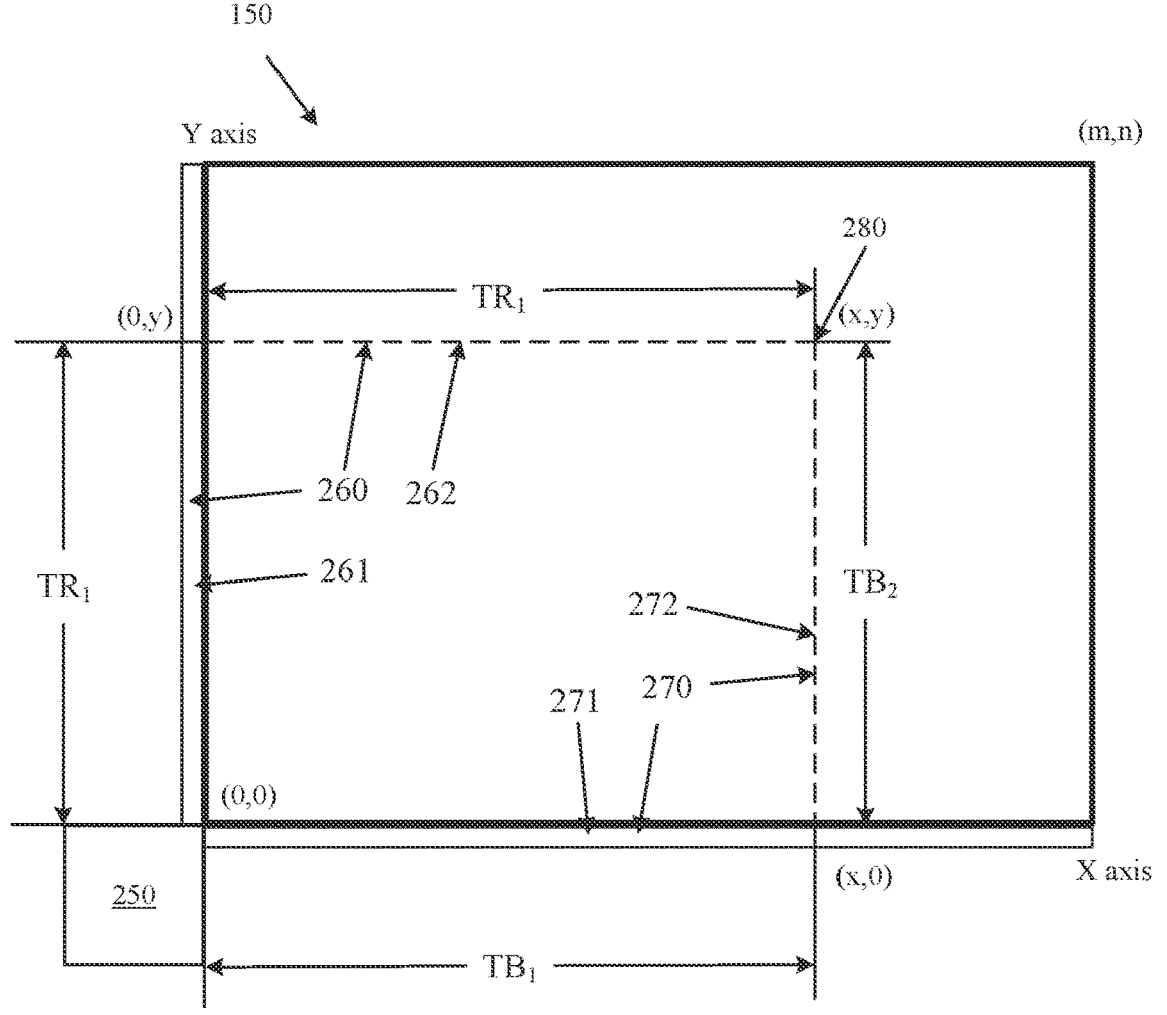
FIG. 2A illustrates a plan view of the memory cells of an SRAM memory annotated with depictions of propagation delay.

As shown in FIG. 2A, a first path is a row select path 261 (also can be referred to as a dummy bitline) combined with the wordline 262 for a row, referred to as the wordline path 260 hereafter. The row select path 261 is a first part of the wordline path 260 and the wordline 262 is a second part of the wordline path 262. The row select path 261 is disposed outside of (e.g., outside of an area of) the pixel driver array 150. The row select path 261 is aligned along a bitline direction (vertical direction as shown in FIG. 2A). The row select path 261 can include an array of dummy drivers and row drivers as shown in, for example, FIG. 1C. Several types of circuits are known that allow a single row of a memory device to be selected. In many cases, the row is designated by an address location that causes a row decoder to select that particular row before a signal is sent to the row to pull the wordline 262 high. The output of a row decoder enters an AND gate that also is configured to receive a separate trigger signal delivered to all AND gates able to receive the output of the row decoder. The wordline 262 itself forms the second part of the wordline path 260, comprising the physical distance from the row driver (e.g., row driver 140*a* shown in FIG. 1C) along the wordline 262 to the pixel driver of interest 280. All trigger signal generating circuits (also referred to as trigger initiating circuits 250) may function as release timing circuits.

A second path is the bitline path 270. The bitline path 270 includes a data load trigger path 271 (e.g., a first part of the bitline path) that delivers a voltage to a circuit in the bitline driver that releases the data stored on the bitline driver to the array of the display and the complementary bitlines (e.g., bitline 272 which is a second part of the bitline path) to the pixel driver of interest 280. In other words the data load trigger path 271 is a first part of the bitline path 270 and the bitline 272 is a second part of the bitline path 270. The data load trigger path 271 is disposed outside of (e.g., outside of an area of) the pixel driver array 150. The data load trigger path 271 also can be referred to as a dummy wordline. The data load trigger path 271 is aligned along a wordline direction (horizontal direction as shown in FIG. 2A). The data load trigger path 271 can include an array of dummy drivers and column drivers as shown in, for example, FIG. 1E.

In FIG. 2A, a pixel driver array 150 (e.g., SRAM array) that is m columns wide by n rows high is illustrated for discussion of propagation delay. For this example, a trigger signal (from the trigger initiating circuit 250) for the release of image data onto the bitlines (e.g., bitline 272) and a trigger signal (from the trigger initiating circuit 250) to activate circuitry associated with the row drivers to pull the wordline 262 high are presumed to originate in the trigger initiating circuit 250 proximate to coordinates (0, 0) in the lower left-hand corner of the pixel driver array 150.

It is understood that trigger signals may originate in more than one location from one or more trigger initiating circuits (e.g., trigger initiating circuit 250). For example, a first location may be proximate to the lower left corner of the pixel driver array 150 in a trigger initiating circuit (similar to trigger initiating circuit 250) and a second location may be proximate to the lower right corner of the pixel driver array 150 in a trigger initiating circuit, and the lower left trigger initiating circuit in the first location may handle the left half of the pixel driver array 150 and the lower right trigger initiating circuit in the second location may handle the right half of the pixel driver array 150. In some implementations, the trigger signal may originate from a location above the pixel driver array 150, on a top left corner of the pixel driver array 150, and/or the top right corner of the pixel driver array 150.

Considering the wordline path above, the time from when the trigger signal is sent from the trigger initiating circuit 250 adjacent to coordinate (0, 0) along the row select path (e.g., a first part of the wordline path) to the AND gate until the trigger signal arrives at the AND gate adjacent to coordinate (0, y) is depicted as $TR_1$. $TR_1$ represents the time required for the trigger signal to propagate from the point adjacent to coordinate (0, 0) to coordinate (0, y) along the row select path. The use of distance to represent time is appropriate because the propagation delay along the row select path has a uniform characteristic when the circuits carrying a signal on that part of the row select path are uniform and repetitive.

The second part of the wordline path is the wordline. The wordline for an array of SRAM type memory cells is connected to the gates of pass transistors such as transistors 128 and 129 of data storage element 120 of FIG. 1B. The resistance of the wordline and the capacitance of the wordline and of the connections to the pass transistors define the RC characteristic of the wordline and therefore the propagation delay of the wordline. The RC characteristic of the wordline may differ from the RC characteristic of the line on which the trigger signal used as an input to the AND gate at each row driver propagates.

In the case wherein the pixel driver pitch in the x direction is a uniform X distance units laterally across the display and the pixel driver pitch in the y direction is a uniform Y distance units vertically on the display, pixel driver location (x, y) is at a physical position relative to the origin at (0, 0) of X distance units times x laterally and Y distance units times y vertically. The choice of distance unit is arbitrary, although most modern pixel drivers are specified in microns, or millionths of a meter from center to center.

The same considerations can be applied to other display geometries such as a parallelogram provide the opposite sides are of equal length and parallel, such as a rhomboid. It can also be applied in modified form to a display with a pixel driver format that is anamorphic on one of its principal axes. The principle difference is that the pixel driver pitch on that axis is not uniform, requiring use of other types of calculations for distance, such as a lookup table.

There are other delays inherent in logic components such as the AND gates, voltage level shifters, and inverters such as those of row driver 140a of FIG. 1C. These delays are of uniform character for each row and do not vary from row to row, making them predictable in that all pixel drivers of all rows have the same delay from that source inherent upon them.

As an example, consider the pixel driver at coordinates (x, y) of FIG. 2A. The pixel driver on the row immediately below will be located at coordinates (x, y−1) and the pixel driver on the row immediately above will be located at coordinates (x, y+1.) The time for a signal to propagate from coordinate (0,y) at the left edge of the array to coordinate (x, y) is identical to the time required for a signal to propagate from coordinate (0, y−1) to coordinate (x, y−1) and to the time required for a signal to propagate from coordinate (0, y+1) to coordinate (x, y+1). The time required for a signal to propagate from coordinate (0, 0) to coordinate (0, y) is greater than the time required for a signal to propagate from coordinate (0, 0) to coordinate (0, y−1) and less than the time required for a signal to propagate from coordinate (0, 0) to coordinate (0, y+1). This results from the difference in path length along the Y-axis.

The time from when the trigger signal to the column driver to release complementary data onto the bitlines is initiated at the trigger initiating circuit 250 and its arrival at the column driver and the time from the release of data from the column drivers until the data arrives at the pixel driver of interest 280 (x, y) in the array together require a variable amount of time. That variation depends mainly on the path lengths of the row select path and the wordline, and the individual RC (resistance and capacitance) characteristics of the circuits forming the two segments along which this propagates.

A first part of the bitline path that brings the trigger signal from the trigger initiating circuit 250 to the column driver extends from coordinates (0, 0) to (x, 0) along the data load trigger path, which is along the X-axis of array 150. The time required for the signal to propagate that distance along the data load trigger path is designated as $TB_1$. The duration of $TB_1$ is determined by the RC characteristic of the data load trigger path (e.g., conductors of the data load trigger path) over which the trigger signal propagates. The RC characteristic is in turn determined by the physical characteristics of the data load trigger path, which comprise resistive and capacitive coupling components and the physical characteristics of any transistor nodes along the path, which primarily comprise capacitive coupling components. This may be thought of as a network. In some implementations, the actual voltage of the trigger signal does not affect the RC characteristic of a network.

The second part of the bitline path that delivers bitline data to the pixel driver of interest 280 is initiated when the bitline data is released from the column driver. There are inherent delays within the column drivers that are identical for all columns. The propagation delay from the time the data is released onto the bitlines for the pixel driver of interest 280 until the data arrives at the pixel driver of interest 280 on the selected bitline depends on the distance from the column driver to the pixel driver of interest in addition to the bitline characteristics, namely the RC delay. For analysis, the time delay is noted as $TB_2$. $TB_2$ is the time required for the bitline data to propagate along the bitline from coordinate (x, 0) to coordinate (x, y) of the pixel driver of interest 280.

In some implementations, the additional delay due to various logic circuits can be lumped together as $TB_3$ (not shown) and treated as a constant value not dependent on the pixel driver position. The total delay $TB_{TOT}$ (not shown) due to propagation delay from the trigger source to the pixel driver of interest 280 is $TB_{TOT}=TB_1+TB_2+TB_3$. The wordline path begins with the path from a second trigger initiation (trigger initiating circuit 250) that delivers the trigger signal up the side of the display along the row select path from coordinate (0,0) to coordinate (0,y). The row select path is slightly outside the array but is parallel to the Y-axis as depicted. The time required for the trigger signal to propagate along this row select path (which is a first part of the wordline path) is $TR_1$. The duration of $TR_1$ is, as before, determined by the RC characteristic of the line over which the trigger pulse propagates to reach the row driver at coordinate (0,y). The second part of the wordline path is the wordline itself. The wordline on the selected row is pulled high when the trigger signal reaches the AND gate which forms part of the row driver. The propagation time, $TR_2$, is determined by the RC characteristics of the wordline.

In some implementations, the additional delay due to various logic circuits can be lumped together as $TR_3$ (not shown) and treated as a constant value not dependent on the pixel driver position. The total delay $TR_{TOT}$ (not shown) due to propagation delay from the trigger source to the pixel driver of interest 280 is defined as $TR_{TOT}=TR_1+TR_2+TR_3$.

An observation based on the calculations for FIG. 2A is that the physical length associated with the path for $TB_1$ added to the length of the path $TB_2$ is substantially equal to the physical length associated with the path for $TR_1$ added to the length of the path for $TR_2$. Another characteristic is that the physical length associated with $TR_1$ is substantially equal to the physical length associated with $TB_2$ and the physical length associated with $TR_2$ is substantially equal to the physical length associated with $TB_1$.

Note that the RC characteristic associated with the path for $TR_1$ does not necessarily match the RC characteristic associated with the path for $TR_2$, and that the RC characteristic associated with the path for $TB_1$ does not need to match the RC characteristic associated with the path for $TB_2$. If both the RC characteristic and the physical length associated with a first circuit are substantially equal to the RC characteristic and physical length associated with a second circuit, then the propagation delay along the two circuits will be substantially equal.

Based on the observation above that the physical path length associated with $TR_1$ is substantially equal to the physical path length associated with $TB_2$, it follows that the propagation delays associated with the two physical paths can yield similar propagation delays if the RC characteristics of the two physical paths are substantially the same. The same consideration regarding RC characteristics applies to the case of the path length associated with $TR_2$ and the path length associated with $TB_1$. The difficulty lies in identifying means by which the entire length of the circuit carrying the trigger signal to the row decoder can be RC matched to the bitlines acting as circuits to carry data to the pixel drivers of the selected row.

This and a similar consideration for RC matching between the path length associated with the trigger signal to the column driver and the wordline from the row decoder to the pixel driver of interest 280 $(x, y)$ is addressed in the present application. Stated in other terms, it is important that the equation $TR_1+TR_2=TB_1+TB_2$ is substantially satisfied. The design procedures disclosed in the present application support achieving that result.

RC matching is the subject of significant development effort in the design of semiconductor devices. Much of the work is devoted to design techniques and practices that reduce the effects of any mismatches in RC matching. While useful for many pure memory designs, techniques such as dividing the wordline into many sub wordlines are less useful in the field of displays based on memory devices at each pixel driver when the goal is to write an entire line of data to the display as rapidly as possible rather than to write a single word to a portion of a row.

In the implementation shown in FIG. 2A, dummy pixel drivers (or portions thereof) (e.g., disabled data storage elements 198a, 198b) are included in the row select path 261 of the wordline path 260 and dummy pixel drivers (or portions thereof) (e.g., disabled data storage elements 198) are included in the data load trigger path 271 of the bitline path 270. The row select path 261 can include an array of row drivers with disabled data storage elements (e.g., row driver 140a with disabled data storage elements 198a as shown in FIG. 1C). The data load trigger path 271 can include an array of column drivers with disabled data storage elements (e.g., column driver 160 with disabled data storage elements 198 as shown in FIG. 1E).

Because dummy pixel drivers (which are disabled copies of the actual or active pixel drivers) are included in the row select path 261 of the wordline path 260 the propagation time $TR_1$ of a trigger signal along the row select path 261 is substantially equal to the propagation time $TB_2$ a trigger signal along the bitline (e.g., actual pixel drivers) included within the pixel driver array 150. Accordingly, the dummy pixel drivers included in the row select path 261 of the wordline path 260 have an RC characteristic that mirrors an RC characteristic of the bitline (e.g., actual (or active) pixel drivers in the bitline) included within the pixel driver array 150. Also, because dummy pixel drivers (which are disabled copies of the actual or active pixel drivers) are included in the data load trigger path 271 of the bitline path 270 the propagation time $TB_1$ of a trigger signal along the data load trigger path 271 is substantially equal to the propagation time $TR_2$ of a trigger signal along the wordline (e.g., actual pixel drivers) included within the pixel driver array 150. Accordingly, the dummy pixel drivers included in the data load trigger path 271 of the bitline path 270 have an RC characteristic that mirrors an RC characteristic of the word-line (e.g., actual (or active) pixel drivers in the wordline) included within the pixel driver array 150. Accordingly, the equation $TR_1+TR_2$ (e.g., the wordline path 260)=$TB_1+TB_2$ (e.g., the bitline path 270) is substantially satisfied.

In an embodiment after the system of FIG. 6A (shown below), a display controller may be located at a position away from the corner of the array. In addition, word lines associated with that display controller may also pass under a section of pixel drivers to reach a portion of an array where the word lines do connect to the memory circuits of pixel drivers. These positions do add to the time required for the word line to pull high at a particular point on the array, but the added time can be taken into account and the added time due to the requirement to pass under another section of pixel drivers is invariant for pixel drivers within that portion of the array. The difference in time to propagate across the pixel drivers of that portion of the display once the signal reaches the closest pixel driver is determined by the RC character-istic of the word line in that section.

Figure 2B:
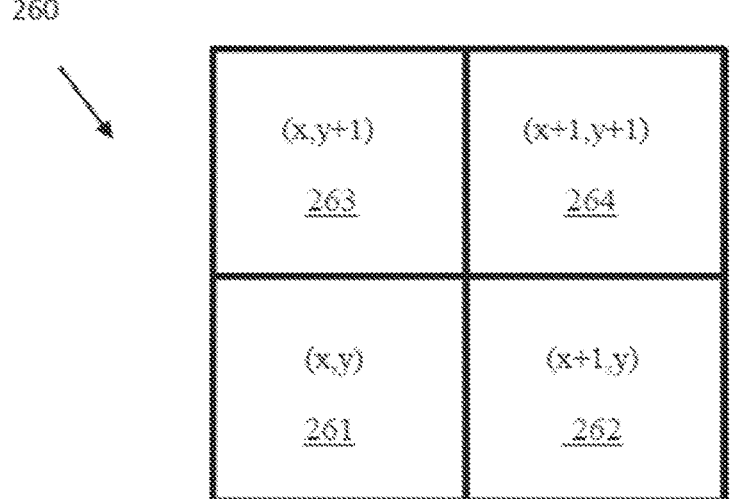
FIG. 2B illustrates a 2 by 2 block of pixels illustrating path length differences.

FIG. 2B depicts a 2 by 2 block of pixels 260 comprising pixel $(x, y)$ 261, pixel $(x+1, y)$ 262, pixel $(x, y+1)$ 263 and $(x+1, y+1)$ 264, that form a part of a pixel displays 150 in FIG. 2A. The depiction emphasizes that the length of the paths to each pixel differs in some way. Using pixel 261 at coordinate $(x, y)$ as a base, pixel 262 is on the same row as pixel 261 but one pixel further away from a row driver (not shown) on the left edge of the array. Pixel 263 is located one row directly above pixel 261 which increases the distance from a column driver (not shown) at the base of the part of the pixel display 150. Pixel 264 is located on the row above pixel 261 and one pixel further from the left edge of the part of the pixel display 150. While pixel 262 and pixel 263, depicted as square pixels, may appear to have the same path length, other pixel aspect ratios are possible. In one embodi-ment, the pixels may be rectilinear but not square (not shown). In this case the part of the pixel display 150 and row and column drivers will all need to fit into the respective row and column spacings. In one embodiment the pixels may be hexagonal (not shown). In a hexagonal array the pixels of adjoining rows are typically offset one half column from one another although the underlying pixel driver array may be rectilinear. A more specific implementation of FIG. 2A is shown in at least FIG. 7B.

Figure 3:
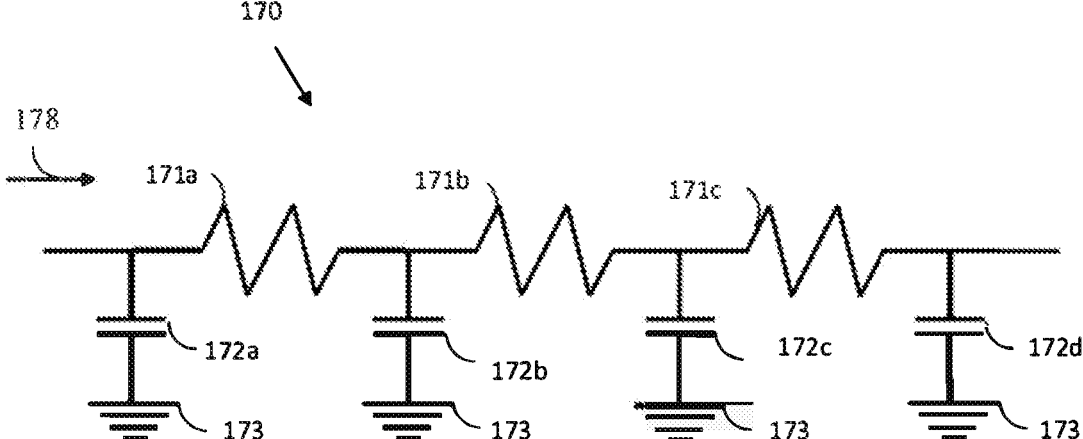
FIG. 3 illustrates an equivalent circuit of the resistance and capacitance of a segment of a conductor in a semiconductor.

FIG. 3 illustrates equivalent circuit 170 for the resistance and capacitance characteristics of a segment of a conductor forming part of a semiconductor, based on a circuit in previously cited Campardo 2005, FIG. 9-10, page 183. Resistors 171a, 171b, and 171c each represent a portion of the resistance on the segments of equivalent circuit 170. For a conductor of resistance R, the distributed resistance values for resistors 171a, 171b and 171c are each R/3. Arrow 178 indicates the direction of current flow. 51a51a5 is well known that the resistance of a conductor is proportional to its length and inversely proportional to its cross section. Each type of conductor has a resistivity $\rho$, specified in $\Omega$-m (ohm meters). The resistivity of aluminum at 20° C. is $2.7 \times 10^{-8}$ $\Omega$-m and the resistivity of copper at the same temperature is $1.7 \times 10^{-8}$ $\Omega$-m. The formula to calculate resistance R in ohms ($\Omega$) for the above calculation is R=ρL/A where L is the length of the conductor and A is the cross-section area of the conductor. The metric more commonly used is the sheet resistance given in R□. The three dimensions of a conductor in a VLSI semiconductor are nominally L length, W width and H height. H height is the thickness of the conductor layer on top of the layer below. The cross-section area is A=W×H. In most processes H height is a constant value and can divided into p to created R□=ρ/H, referred to as resistance per square.

Capacitors 172a, 172b, 172c and 172d, each connected to common ground 173, represent distributed capacitance within the conductor represented by equivalent circuit 170. For equivalent circuit 170 with net capacitance C, the capacitance for capacitors 172b and 172c are considered to be C/3, The capacitance for end capacitors 172a and 172d are considered to be C/(2*3) or C/6. Arrow 270 indicates the direction of propagation for a signal on the conductor.

In general, a conductor may be represented as an equivalent circuit comprising n resistive elements and n+1 capacitive elements. The resistance of each resistor is R/n and the capacitance of all capacitive elements 2 to n is considered to equal C/n. The capacitance of equivalent capacitors 1 and n+1 is considered to equal C/2n.

Capacitance in a conductor within a semiconductor has several components that contribute to the total capacitance. One component is referred to as area capacitance is based on a parallel plate model wherein conductors on different levels of a semiconductor are separated by a dielectric medium. Another component is referred to as fringing field capacitance. It's significance results from the reduction in W width of a conductor to the point where its H height is greater than W width in newer processes with finer design rules. The topic is complex and the subject of a significant amount of advanced research. A reference is *Digital Integrated Circuits, A Design Perspective*, 2$^{nd}$ Ed., Rabaey, et al, Pearson Education, Delhi, 2002, pages 136-138, (hereafter Rabaey 2002), the entire contents whereof are incorporated herein by reference.

An additional source of capacitance on a conductor is its interconnections to other circuit elements such as the various connections to a transistor. An example is found in lecture notes, *Static Random Access Memory—SRAM*, Dr. Lynn Fuller, Nov. 18, 2016, Rochester Institute of Technology, pages 12-13, (hereafter Fuller 2016) the entire contents whereof are incorporated by reference. Lecture notes Fuller 2016 identify that the wordline of the SRAM receive a contribution to total capacitance through the two pass transistors connected to it at each memory cell, such as pass transistors 128 and 129 of FIG. 1B of the present application, wherein the wordline is connected to the gates of those transistors. The exact nature of the connections a conductor makes to other components directly affects the C capacitance on that conductor and therefor the propagation delay associated with that conductor.

Figures 4A, 4B:
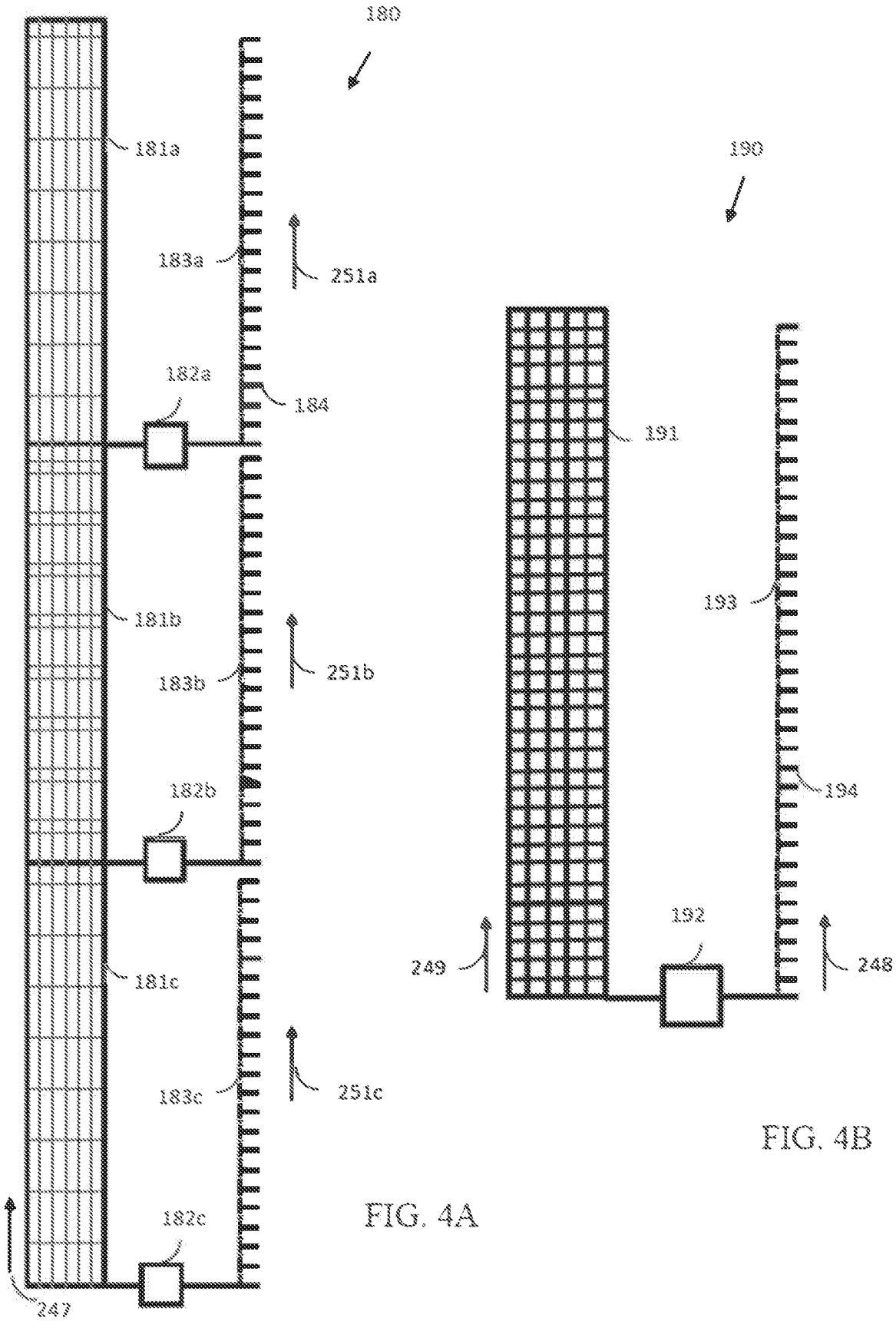
FIG. 4A depicts a block diagram of a set of row release segments of a display operative to provide a release signal to the AND gates of the row drivers of that set.
FIG. 4B depicts a block diagram of a single row release segment of a display operative to provide a release signal to the AND gates of the row drivers of that segment.

FIGS. 4A through 5D illustrate implementations (some of which are variations) of the examples described in connection with at least FIGS. 1A-2B and FIGS. 7A-7C. FIG. 4A depicts release signal delivery circuit 180 operative to deliver release signals to the AND gate of a row driver such as AND gates 116a and 116b of row driver 140a, 140b illustrated in FIG. 1C in the present application. Release signal delivery circuit 180 comprises arrays of dummy pixel drivers 181a, 181b and 181c, sample circuits 182a, 182b and 182c, also known as sense circuits, and conductor terminals 183a, 183b and 183c. Modeling in CAD design tools has revealed that it is preferable that the entire pixel driver array be duplicated in the dummy pixel drivers in order to match the C capacitance contributed by the active pixel driver array including the bitlines and wordlines.

Arrays of dummy pixel drivers 181a, 181b and 181c each comprise a plurality of dummy pixel drivers, each identical to the active pixel drivers with interconnections such as wordlines and bitlines (not shown) identical to the active pixel drivers of the array of pixel drivers. Sample circuits 182a, 182b and 182c are not found on the active pixel drivers of the array of pixel drivers. Sample circuits 182a, 182b and 182c detect a rising edge of a trigger signal on one of the bitlines (not shown) of dummy pixel drivers 181a, 181b and 181c. Sample circuits 182a, 182b and 182c comprise a rising edge detector circuit and a circuit operative to hold the output signal high for a period of time after the rising edge on the sampled bitline is detected. An alternative name is a sense circuit. The main requirement is that the rising edge detection circuit be able to turn on again when the next rising edge is detected but not remain on the entire time from one rising edge to the next. In one embodiment, sense circuits 182a, 182b and 182c also detect the level of the trigger signal and turn the output of each sense circuit to off when the level of the trigger signal falls below a certain level. The output of sense circuits 182a, 182b and 182c are asserted onto conductors 183a, 183b and 183c respectively. Conductors 183a, 183b and 183c each connect to a plurality of AND gates (not shown) each forming part of a row driver such as AND gates 116a and 116b of FIG. 1C at a plurality of terminals such as terminal 184 (one depicted). Arrow 247 indicates the direction of propagation of the release signal in array of dummy pixel driver segments 181a, 181b and 181c. Arrow 251c indicates the direction of propagation within conductor 183c, arrow 251b indicates the direction of propagation within conductor 183b, and arrow 251a indicates the direction of propagation within conductor 183a. A trigger signal source originates in other circuitry (not shown) located below release signal delivery circuit 180.

Array of dummy pixel drivers 181a, 181b and 181c operate as a continuous unit. A trigger signal on one of the bitlines of segment of dummy pixel driver array 181c propagates from bottom to top, then continues to propagate on one of the bitlines of dummy pixel driver array 181b and then propagates on one of the bitlines of dummy pixel driver array 181a. The bitlines (not shown) of array of dummy pixel drivers segments 181a, 181b and 181c form a continuous conductor with no circuitry or breaks intervening between segments 181a, 181b and 181c within the individual bitlines. The bitlines do connect to the gates of pass transistors (not shown) such as pass transistors 128 and 129 of data storage element 120 shown in FIG. 1C. In addition, at relatively regular intervals a tap (not shown) on one of the bitlines asserts the value on that bitline (not shown) onto the input to a sense circuit such as sense circuits 182a, 182b and 182c.

FIG. 4B depicts segment 190 of a release signal delivery circuit representing one segment of a row release signal circuit similar to release signal delivery circuit 180 of FIG. 4A. Segment 190 comprises array of dummy pixel drivers 191, sense circuit 192, also known as a sample circuit, conductor 193 and a plurality of terminals 194 (one indicated) to connect conductor 193 to the same number of AND gates forming part of a same number of row driver (not shown) similar to row driver 140a of FIG. 1C. Preferably the array of dummy pixel drivers is colinear with the array of regular pixel drivers (not shown). Arrow 249 indicates the direction of propagation of the release trigger signal within dummy pixel driver array segment 191. Arrow 248 indicates the direction of propagation of the release sign asserted by circuit element 192 onto conductor 193.

The structure of segment 190 is important. The direction of propagation of the release trigger signal within dummy pixel driver array segment 190 starts at the bottom and proceeds up as indicated by arrow 249. Sense circuit 192 samples the state of the trigger release signal within dummy pixel driver array 191 and releases a pulse onto conductor 193 corresponding to the state of the trigger release signal. The trigger signal propagates through bitlines (not shown) of dummy pixel driver array 191 at a velocity determined by the RC characteristics of the bitline and the capacitance of the circuit elements attached to it. The output of circuit element 192 propagates onto conductor 193 at a velocity corresponding to the RC characteristics of conductor 193 and the capacitance of the circuit elements (AND gates) attached to it. The length of dummy pixel driver array 191 and conductor 193 are almost identical, with the only difference arising because there needs to be a gap between a conductor and the next conductor, such as is the case for conductors 183a and 183b of FIG. 4A.

In the case where the pixel drivers, whether dummy or active, are 6.4 μm by 6.4 μm, the length of a conductor attached to 32 AND gates is $W_{length}$=6.4 μm×31=198.4 μm=0.1984 mm. The length of the bitline extending across 32 pixel drivers is $B_{length}$=6.4 μm×32=204.8 μm=0.2048 mm. The difference is not significant since the trigger generated by the sense circuit does not need to propagate beyond the row driver for the uppermost row on that conductor. The differences in RC characteristics between the bitline over that distance and the conductor over a similar difference to drive 32 row drivers may result in a difference of less than 0.1%. Because a limited number of rows are driven from each tap and the tapped bitline runs parallel to the conductor, according to simulation, the discrepancy between propagation delay in the bitline (not shown) in array of dummy pixel drivers 191 and propagation delay in conductor 193 is not cumulative.

Figure 4C:
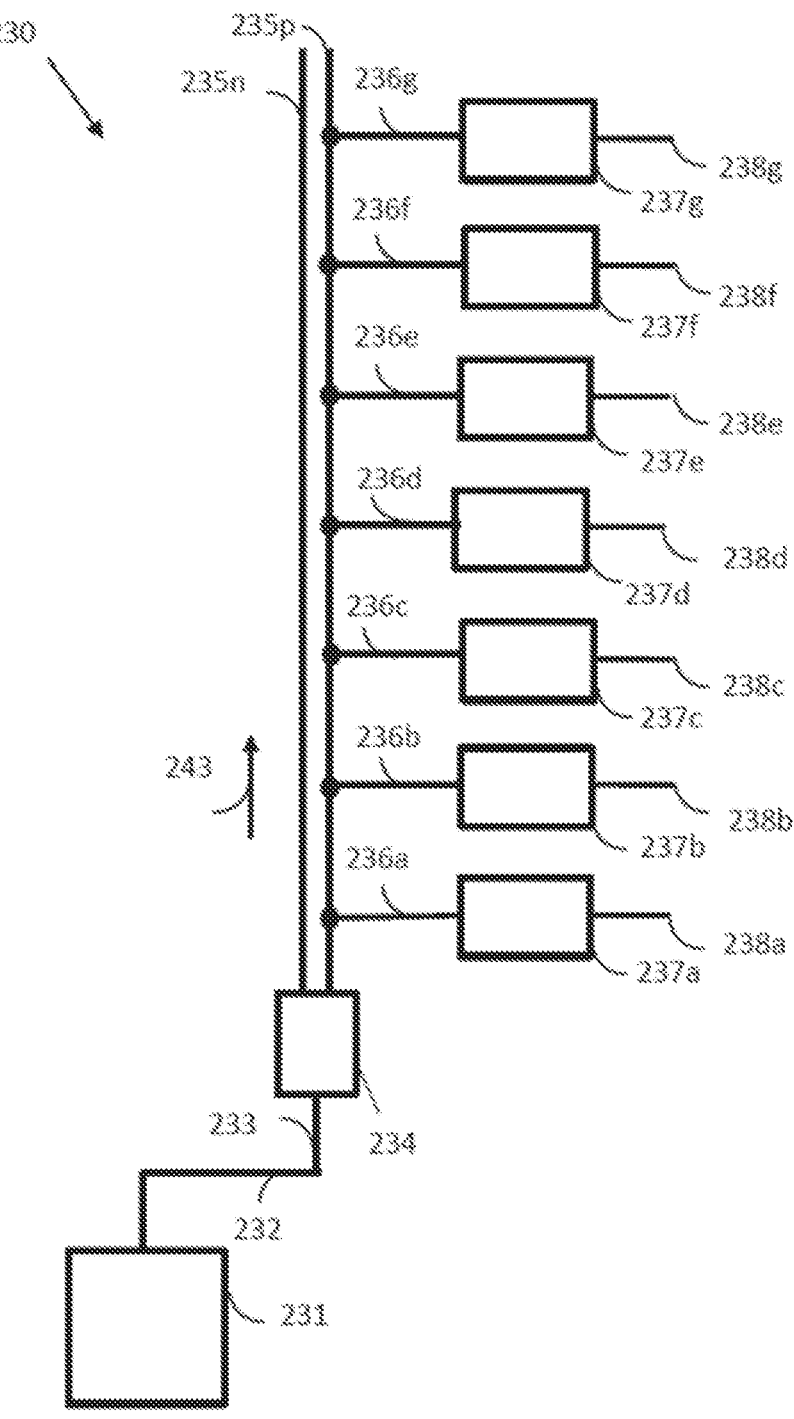
FIG. 4C depicts a simplified block diagram of a pair of bitlines forming part of an array of dummy pixel drivers together with column drivers and a trigger circuit controller.

FIG. 4C depicts bitlines and column driver circuit 230 of an array of dummy pixel drivers comprising bitline pair 235p and 235n. Pixel driver elements other than the bitlines are omitted for clarity. Trigger initiating circuit 231 controls trigger pulse timing and generation, asserting the trigger pulse onto conductor 232. Conductor 232 is operative to assert the trigger pulse onto column driver 234 over terminal 233. The column driver is similar to those of FIG. 4A or FIG. 4C to that of FIG. 1D. The data configuration of column driver 234 can be set in a memory cell (not shown) forming a part of column driver 234 in response to a signal from the trigger signal control and generating circuit 231. In one embodiment, the data state of the memory cell of column driver 234 may be switched during operation to change the state of the voltage asserted on bitline 235p, thereby acting as a control over the timing of trigger signals on that bitline. Both bitlines 235p and 235n are driven with complementary data in order to match the capacitance of a regular bitline in the array of active pixel drivers.

In instances where more than one word line and word line driver circuit is present on each row, a separate bit lines and column drive circuit similar to bitlines and column driver circuit 230 may be present for each word line driver circuit.

A voltage asserted onto bit column 235p is asserted onto sense circuit 237a over terminal 236a, onto sense circuit 237b over terminal 236b, onto sense circuit 237c over terminal 236c, onto sense circuit 237d over terminal 236d, onto sense circuit 237e over terminal 236e, onto sense circuit 237f over terminal 236f, and onto sense circuit 237g over terminal 236g. The outputs of sense circuits 237a through 237g are asserted in turn onto output terminals 238a through 238g respectively. A sense circuit may also be referred to as a sample circuit. Output terminals 238a, 238b, 238c, 238d, 238e, 238f, and 238g each are asserted onto a conductor similar to conductor 193 of FIG. 4B which in turns asserts the voltage onto a terminal of an AND gate of a plurality of row drivers (not shown) similar to row drivers comprising part of row driver 140a of FIG. 1C. In one embodiment, a plurality of bitline pairs is implemented on a plurality of columns of an array of dummy pixel drivers (not shown). Arrow 243 indicates the direction of propagation of the trigger signal on bitline 235p.

Figure 4D:
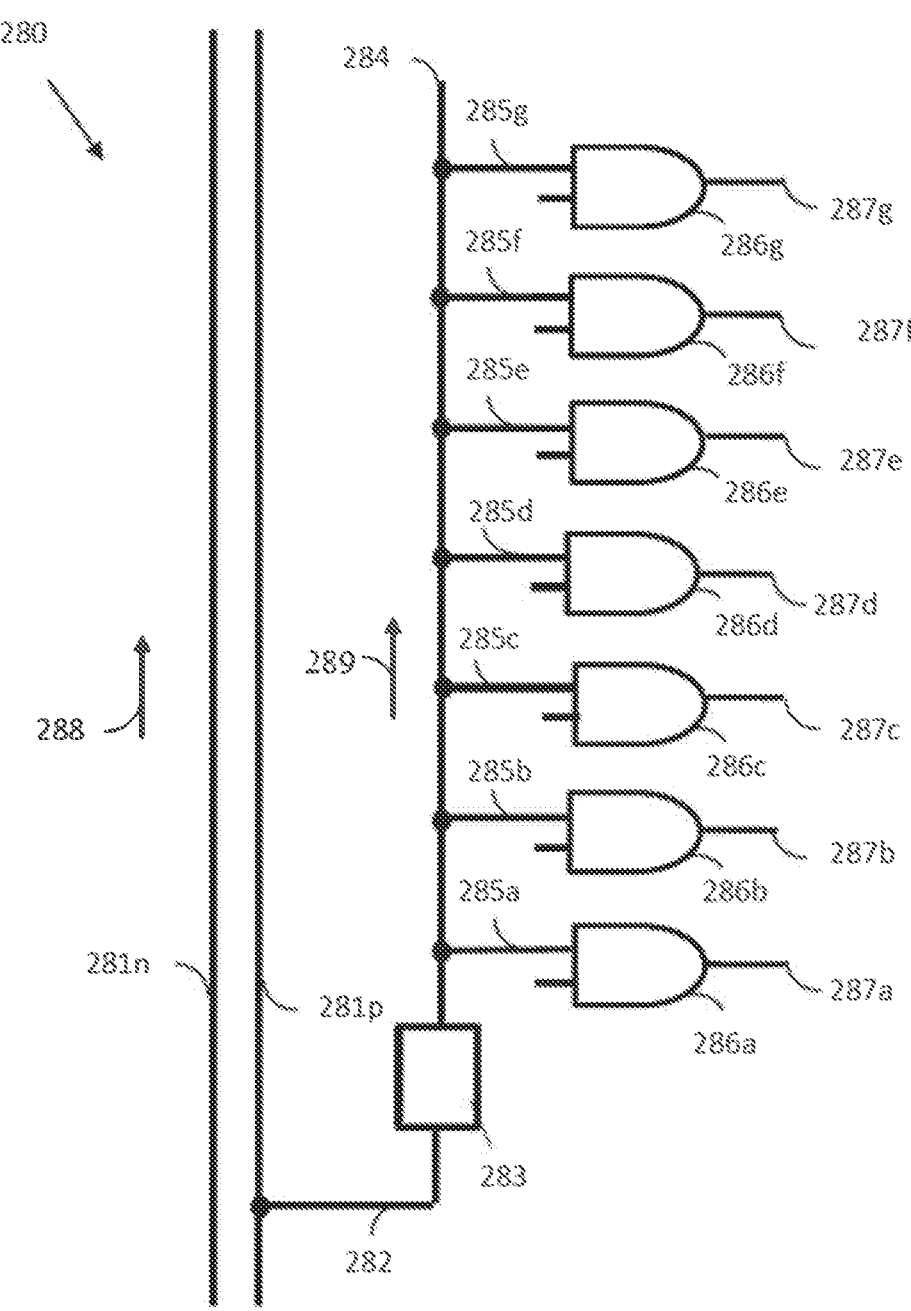
FIG. 4D depicts a detailed block diagram of one tap circuit operative to deliver a release trigger signal to a plurality of AND gates.

FIG. 4D depicts a detailed block diagram of a single tap circuit 280 after single tap circuit 190 of FIG. 4B. Tap circuit 280 comprises complementary bitlines 281p and 281n of an array of dummy pixel drivers (not shown), tap 282, sense circuit 283, conductor 284, terminals 285a through 285g, column driver AND gates 286a through 286g and output terminals 287a through 287g. Complementary bitlines 281p and 281n are operative to deliver a release trigger signal from a control unit (not shown). All trigger signals are released on bitline 281p. In the initial state, bitline 281n is held high while bitline 281p is held low. When the trigger signal is released on bitline 281p, it is held high and bitline 281n switches to low. This ensures that the RC characteristic of bitlines 281p and 281 match the RC characteristics of a pair of bitlines in the active array, therefore having substantially the same propagation delay. Tap 282 delivers a signal corresponding to the state of bitline 281p to sense circuit 283. Sense circuit 283 acts as previously described for FIG. 4A to drive conductor 284 with a conditioned signal to be delivered to a plurality of row drivers. Terminal 285a delivers the output of sense circuit 283 to one input port of two-port AND gate 286a wherein two-port AND gate 286a forms a part of a row driver 140a as shown in FIG. 1C. The second input to two-port AND gate 286a comes from the row decoder unit (not shown) as previously described for FIG. 1C. In like manner, terminals 285b, 285c, 285d, 285e, 285f and 285g deliver the output of sense circuit 283 to one port of two-port AND gates 286b, 286c, 286d, 286e, 286f, and 286g, the other port of those AND gates being connected to a row decoder unit (not shown). The outputs of AND gates 286a through 286g are asserted on output terminals 287a through 287g respectively. In one embodiment, terminals 287a through 287g assert the outputs of AND gates 286a through 286g on the input of voltage level shifters forming a part of a row driver (not shown), In one embodiment, terminals 287a through 287g assert the outputs of AND gates 286a through 286g on the input of an inverter forming part of a row driver (not shown). Each row driver asserts its output onto a wordline (not shown). Only one row is selected by the row decoder circuit and therefore only one wordline is held high. Arrow 288 and arrow 289 indicate the direction of propagation of the signal on bitline 281p and on conductor 284 respectively. Because conductor 284 is parallel to bitline 281p with the same direction of propagation for a relatively small number of rows, the net propagation delay on bitline 281p is similar to the net propagation delay on conductor 284.

Figure 5A:
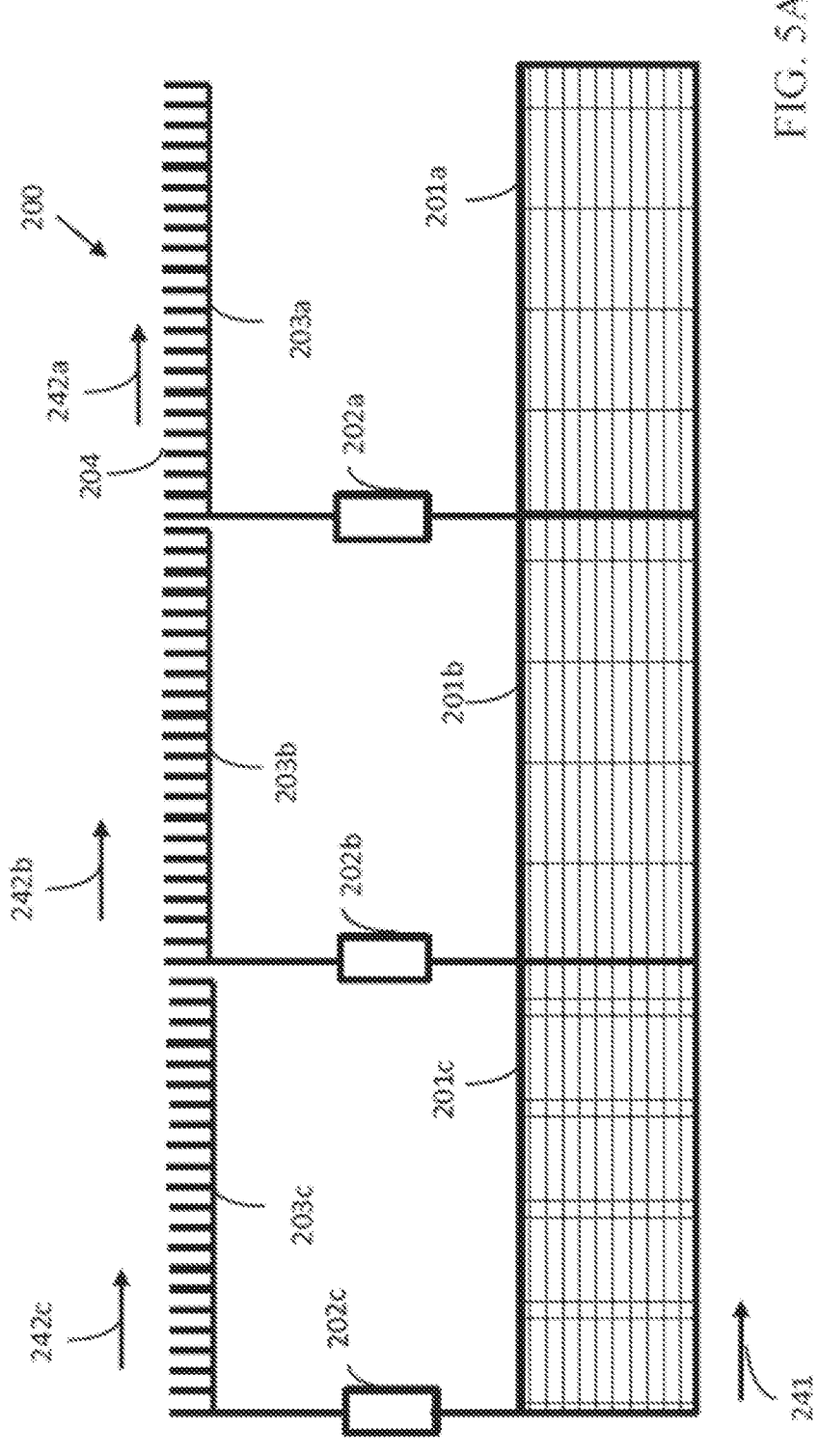
FIG. 5A depicts a block diagram of a set of column release segments of a display operative to provide a release signal to a circuit element of the column drivers of that set.

FIG. 5A depicts three segments 201a, 201b and 201c of an array of dummy pixel drivers and associated circuitry 200 operative to provide an associated array of column drivers (not shown) with trigger signals to release data stored on a memory cell onto the bitlines of the associated array of column drivers (not shown) such as column driver 150 160 of FIG. 1D and column driver 162 of FIG. 4C. The wordlines (not shown) of the array of dummy pixel drivers are used as a means for delivering a signal to an associated set of column drivers initiating the release of complementary data onto the bitlines of an array of active pixel drivers. The wordlines of segments 201a, 201b and 201c form a continuous wordline across all sections.

A tap on each of segments 201a, 201b and 201c of an array of dummy pixel drivers is connected to circuit elements 202a, 202b and 202c respectively such that a signal present on the tapped wordline of segment 201a is asserted on circuit element 202a, a signal present on the tapped wordline of segment 201b is asserted on circuit element 202b and a signal present on the tapped wordline of segment 201c is asserted on circuit element 202c. In one embodiment, circuit elements 202a, 202b and 202c may be sense elements similar to sense elements 237a through 237g of FIG. 4C. The outputs of circuit elements 202a, 202b and 202c are asserted onto conductors 203a, 203b and 203c respectively. In one embodiment, the tapped wordlines of segments 201a, 201b and 201c are different wordlines of the array of dummy pixel drivers.

Conductors 203a, 203b and 203c each assert the outputs received from circuit elements 202a, 202b and 202c respectively onto a series of column drivers (not shown) over a series of terminals 204 (one indicated). In one embodiment, each of terminal 204 is connected to CLK 166 of a corresponding column driver 162 of FIG. 4C. In one embodiment, each of terminal 204 is connected to a corresponding gate of load switch 152 of column driver circuit 150 160 of FIG. 1D.

The direction of propagation on segments 201a, 201b and 201c is indicated by arrow 241 adjacent to the array of dummy pixel drivers. The direction of propagation of the tapped signal on conductors 203a, 203b and 203c are indicated by arrows 242a, 242b and 242c respectively. Conductor 203a is approximately half a pixel driver to a full pixel driver shorter than segment 201a, conductor 203b is approximately half a pixel driver to a full pixel driver shorter than segment 201b and conductor 203c is approximately half a pixel driver to a full pixel driver shorter than segment 201c. The difference in length serves to allow conductors 203a, 203b and 203c to be substantially colinear without being electrically connected. The signal asserted on conductor 203a by circuit element 202a lags the propagation of the trigger signal asserted on the wordline of segment 201a by a uniform factor determined by the propagation delay attributable to circuit element 202a. This same delay is induced by circuit elements 202b and 202c because the circuit elements are identical. Because all column drivers of the array of active pixel drivers (not shown) are triggered by circuits identical to circuit 202a, the propagation delay across all conductors similar to conductor 203a includes a delay factor substantially equal to the propagation delay due to circuit element 202a.

Figure 5B:
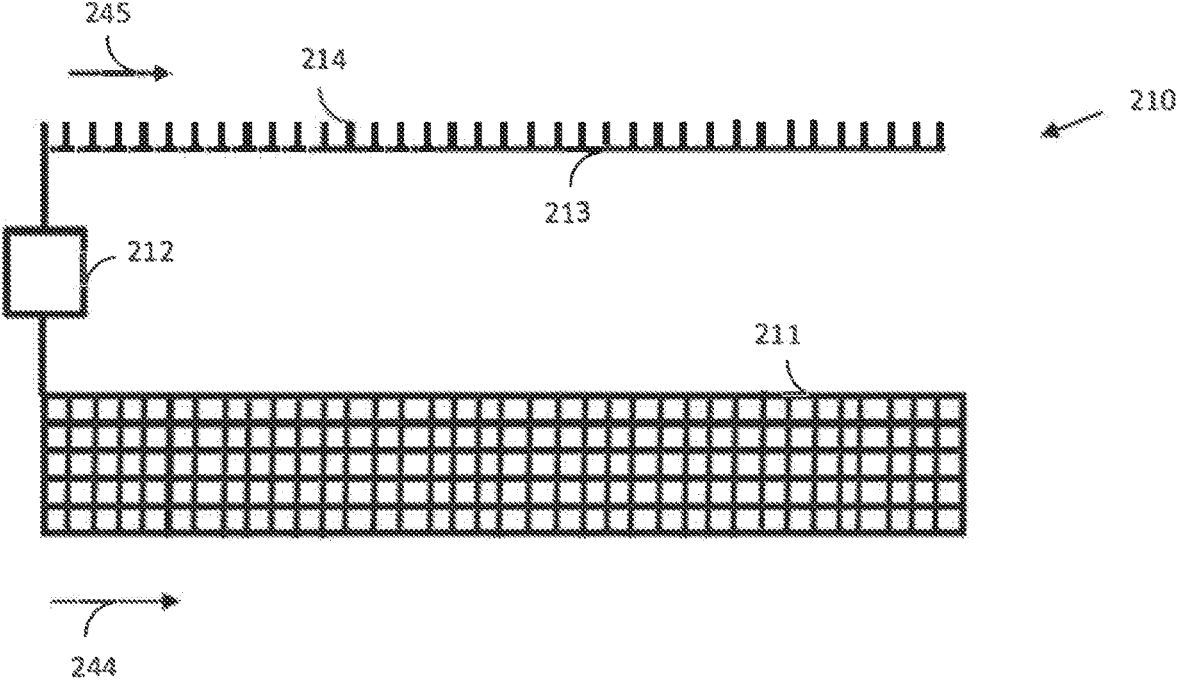
FIG. 5B depicts a block diagram of a single column release segment of a display operative to provide a release signal to a circuit element of the column drivers of that segment.

FIG. 5B depicts a single segment 210 of array of dummy pixel drivers 211 and associated circuitry after the three segments of FIG. 5A. Segment 210 comprises array of dummy pixel drivers 211, a tap of a wordline operative to deliver a signal to the input of circuit element 212, conductor 213 operative to receive a signal from the output of circuit element 212, and a plurality of terminals 214 (one indicated). In one embodiment, circuit element 212 is a sense circuit. Each of terminals 214 is operative to assert the signal on conductor 213 on a column driver (not shown) such as those depicted in FIGS. 4A and 4C. In one embodiment, each of terminal 214 is connected to CLK 166 of a corresponding column driver 162 of FIG. 4C. In one embodiment, each of terminal 214 is connected to a corresponding gate or other release mechanism of a load switch (not shown) such as logic circuit 165 of column driver circuit 160 of FIG. 1D.

The structure of segment 210 is important. The direction of propagation of the release trigger signal with dummy pixel driver array segment 210 starts at the left size of array of dummy pixel drivers 211 and moves to the right as indicated by the arrow. The trigger signal propagates through wordlines (not shown) of array of dummy pixel drivers 211 at a velocity corresponding to the RC characteristic of the dummy wordline. A tap on wordlines (not shown) within array of dummy pixel drivers asserts the trigger signal onto circuit element 212 which in turns asserts its output onto conductor 213. The tapped signal propagates on conductor 213 at a velocity corresponding to the RC characteristic of conductor 213 and the capacitance of the circuit elements in the column drivers to which it is attached over plurality of terminals 214 (one shown).

Because conductor 213 is parallel to the wordlines within array of dummy pixel drivers and substantially coextensive, the discrepancy between conductor 213 and the wordlines is not extensive. The previous discussion from FIG. 4B above regarding physical line lengths applies to this case. It is important that the length is relatively short and that a series of taps at regular, although not necessarily equal intervals. Thus, the tapped signal propagates a relatively short distance on conductor 213 after which a new tap is made that propagates on a new conductor, as previously depicted for conductors 203c, 203b and 203a for FIG. 5A. This ensures that any propagation differences are not cumulative across the entire wordline in array of dummy pixel drivers 210 compared to the signal asserted on plurality of terminals 214 (one shown).

Arrow 244 indicates the direction of propagation along a wordline in the array of dummy pixel drivers. Arrow 245 indicates the direction of propagation of the trigger signal from circuit element 212 on conductor 213. Circuit element 212 will have its own propagation delay that is a constant delay and the same for all circuits for delivering a trigger pulse to a column driver.

Figure 5C:
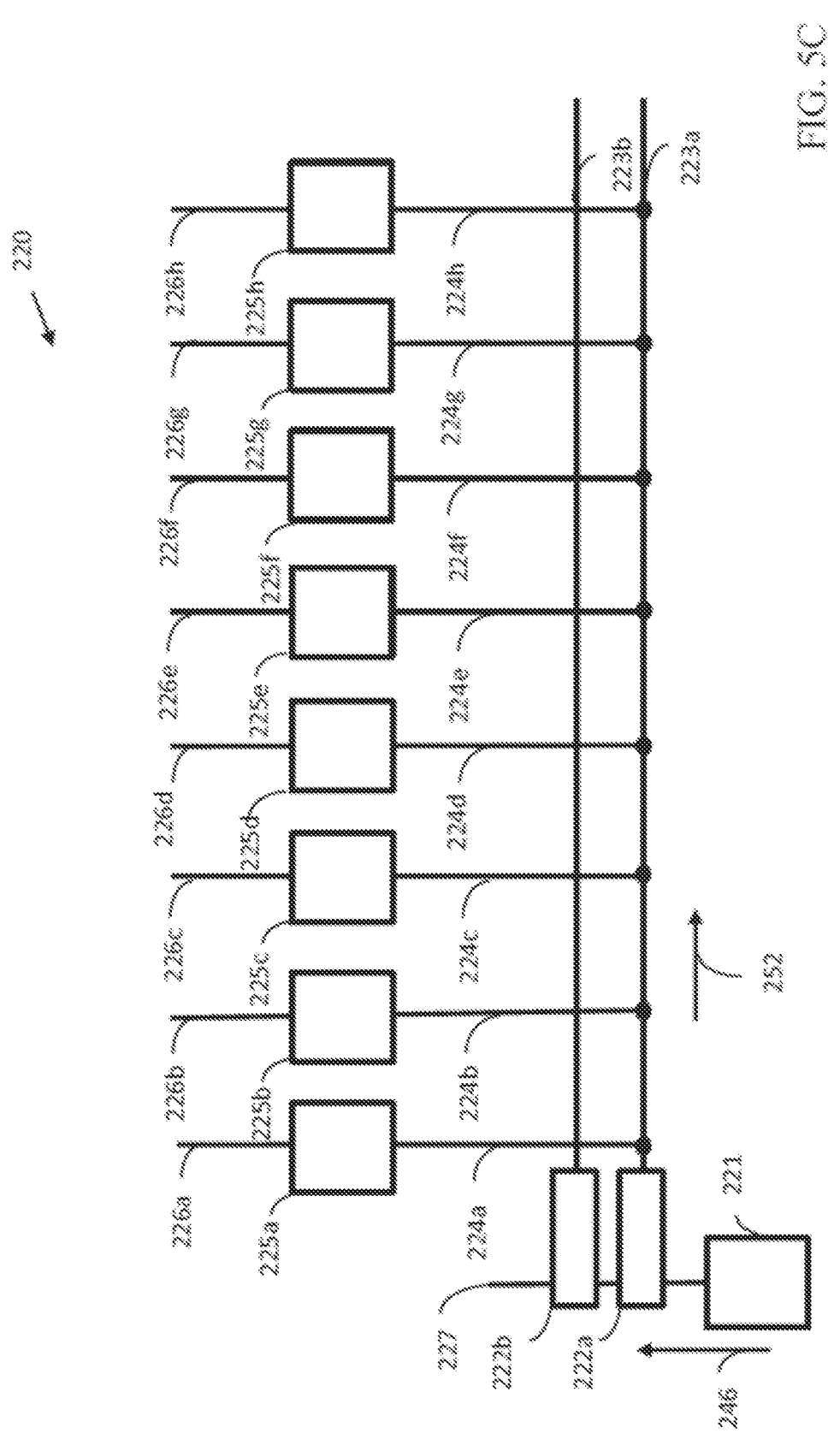
FIG. 5C depicts a diagram of the wordlines and other circuit elements of a dummy driver array of pixel drivers operative to send a trigger pulse to a bitline driver to disable release stored data onto the bitlines.

FIG. 5C illustrates a simplified drawing 220 of dummy wordlines 223a and 223b operative to deliver trigger signals to a set of column drivers (not shown) over a set of taps 224a-224h onto dummy wordline 223a. Dummy wordline 223b is always held low to provide a capacitive load comparable to the load on the wordline in the array of active pixel drivers (not shown) wherein only one wordline is high and the surrounding wordlines are low.

In the embodiment wherein the array of pixel drivers is divided into vertical segments in which the rows of each section are serviced by separate row decoder circuits, the column drive circuits for the columns of each section are operated by a separate circuit similarly situated to that of the components of simplified drawing 220.

Row drivers 222a and 222b for an array of dummy pixel drivers such as array of dummy pixel drivers 211 of FIG. 5B are configured to initiate at trigger pulse required to release data stored on a column driver such as the column drivers of FIG. 4A and FIG. 4C as previously described. Trigger timing control unit 221 delivers a signal to row drivers 222a and 222b over conductor 227 to deliver a signal to initiate a high trigger pulse on dummy wordlines 223a and 223b. In one embodiment, dummy wordline 223b is hard wired to a low state.

Taps 224a, 224b, 224c, 224d, 224e, 224f, 224g and 224h tap onto dummy wordline 223a in an array of dummy pixel drivers such as array of dummy pixel drivers 211 of FIG. 5B.

Wordline 223b is held low. In one embodiment, wordlines 223b is hard wired to a low state.

Arrow 246 indicates the direction of propagation of a signal released by trigger control unit 221. Row drivers 222a and 222b assert values on dummy wordlines 223a and 223b of the array of dummy pixel drivers responsive to the signal received from trigger control unit 221. Arrow 252 indicates the direction of propagation of the values asserted on dummy wordline 223a, The logic behind holding an adjacent wordline in a low state is that in the array of active pixel drivers, only one wordline is high and all other wordlines remain low. This creates a boundary condition that needs to be replicated in the array of dummy pixel drivers in order for the capacitive load to match that of the array of active pixel drivers in order to match the RC characteristic and therefore the propagation delay of the wordlines of the active array.

It is conceived within the implementations described herein that more than two rows of dummy pixel drivers may form a circuit to deliver signals to release data stored on a plurality of column drivers over more than one of the wordlines of the dummy pixel drivers. In one embodiment, the taps may occur on a set of parallel wordlines with at least one intervening wordline that is held low. A wordline between the parallel tapped wordlines is held low. The choice for division into a first set and a second set of taps depends on the requirements of the particular display. If the display operates as a unitary system, then the division can be simple. If the division is into four major vertical stripes, wherein each strip is approximately a quarter of the columns, then a different design is needed. If the division is into four quadrants comprising upper left, upper right, lower left and lower right then yet another design is needed. All can be realized in one design at the price of significant complexity.

Figure 5D:
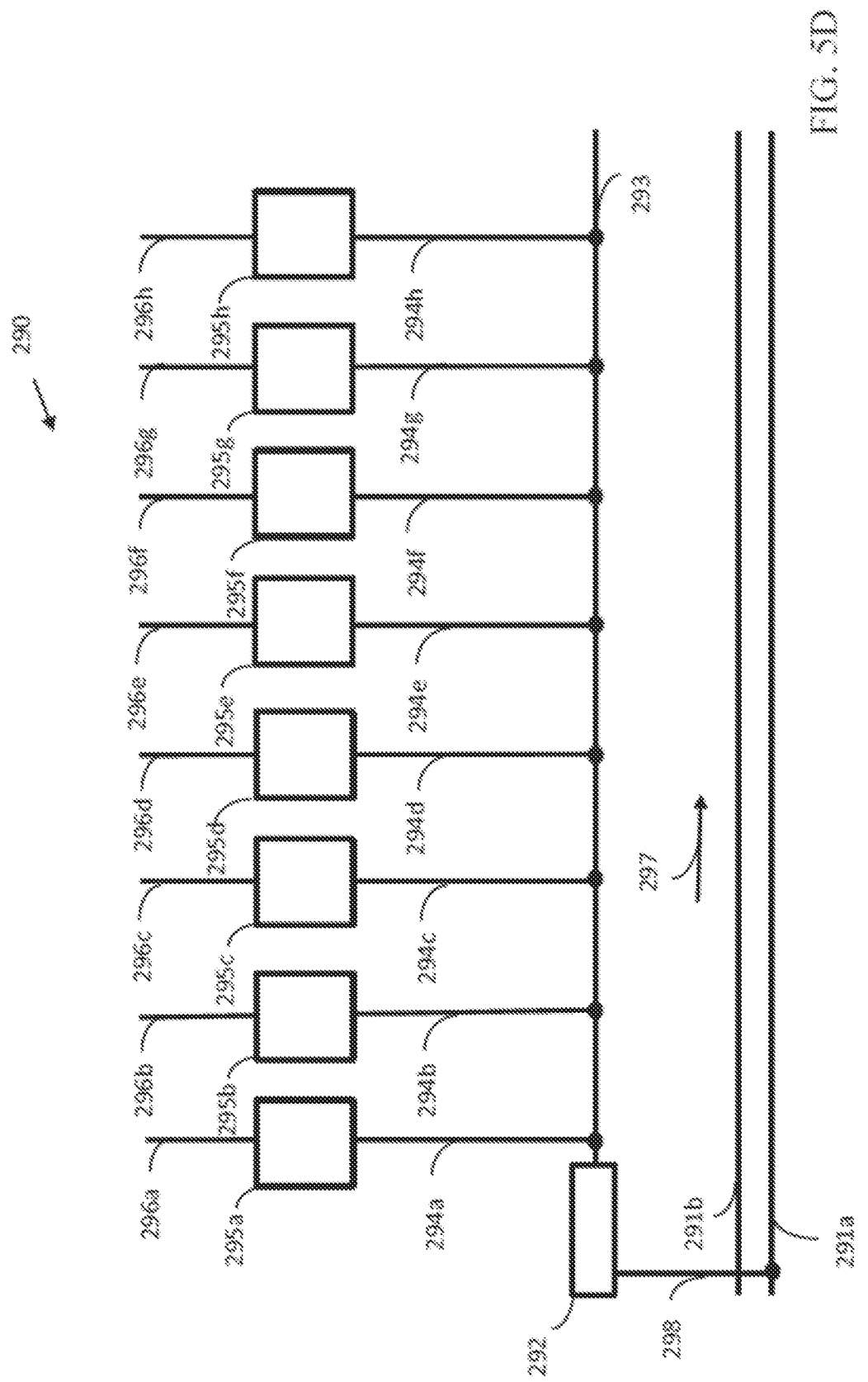
FIG. 5D depicts a diagram of a section of a circuit operative to receive a trigger pulse delivered over a dummy wordline and deliver it to a column driver to release data stored on the column driver onto the bitlines of that column.

FIG. 5D depicts a detailed block diagram of a segment 290 of a column driver data release circuit after FIG. 5B. Segment 290 comprises dummy wordlines 291a and 291b, tap 298, sense circuit 292, conductor 293 and column drivers 295a-295h. Dummy wordlines 291a and 291b together act to form a circuit that substantially matches the RC characteristics of the wordlines of the array of active pixel drivers (not shown), thereby matching the propagation delay between the dummy wordlines and the wordlines of the array of active pixel drivers. Dummy word line 291a is pulled high by a signal from a trigger timing control unit such as unit 221 as described in FIG. 5C. Dummy wordline 291b is present to ensure the capacitance loading on word line 291a is properly matched to a word line pulled high on the array of dummy pixel drivers (not shown). The state of dummy wordline 291a at a given point is asserted over terminal 298 onto sense circuit 292. Sense circuit detects the state of dummy word line 291a and asserts a corresponding signal on conductor 293 with any needed signal conditioning. In one embodiment, sense circuit 292 detects the leading edge of the signal detected on dummy wordline 291a.

The signal asserted on conductor 293 is asserted onto each of column drivers 295a-295n over terminals 294a-294h. Column drivers 294a-294h, responsive to the state asserted onto its respective terminal 294a-294h, releases the data stored on its memory onto complementary bitlines 296a-296h respectively. Bitlines 296a-296h each represent a pair of complementary bitlines as described in FIG. 4.

Arrow 297 indicates the direction of propagation both on dummy wordline 291a and on conductor 293. The propagation delay on dummy wordline 291a is likely different to that on conductor 293 because the RC of the two lines are not identical. The propagation difference is not likely to be significantly different over a relatively short run. The use of multiple taps on a dummy bitline allows the line length to be equivalent to 32 or 64 pixel driver pitch lengths. For an 8.0 μm pixel driver pitch, this is 0.256 mm or 0.512 mm respectively. A serious propagation delay will not accumulate over such short distances even with a slight RC mismatch.

Figure 6A:
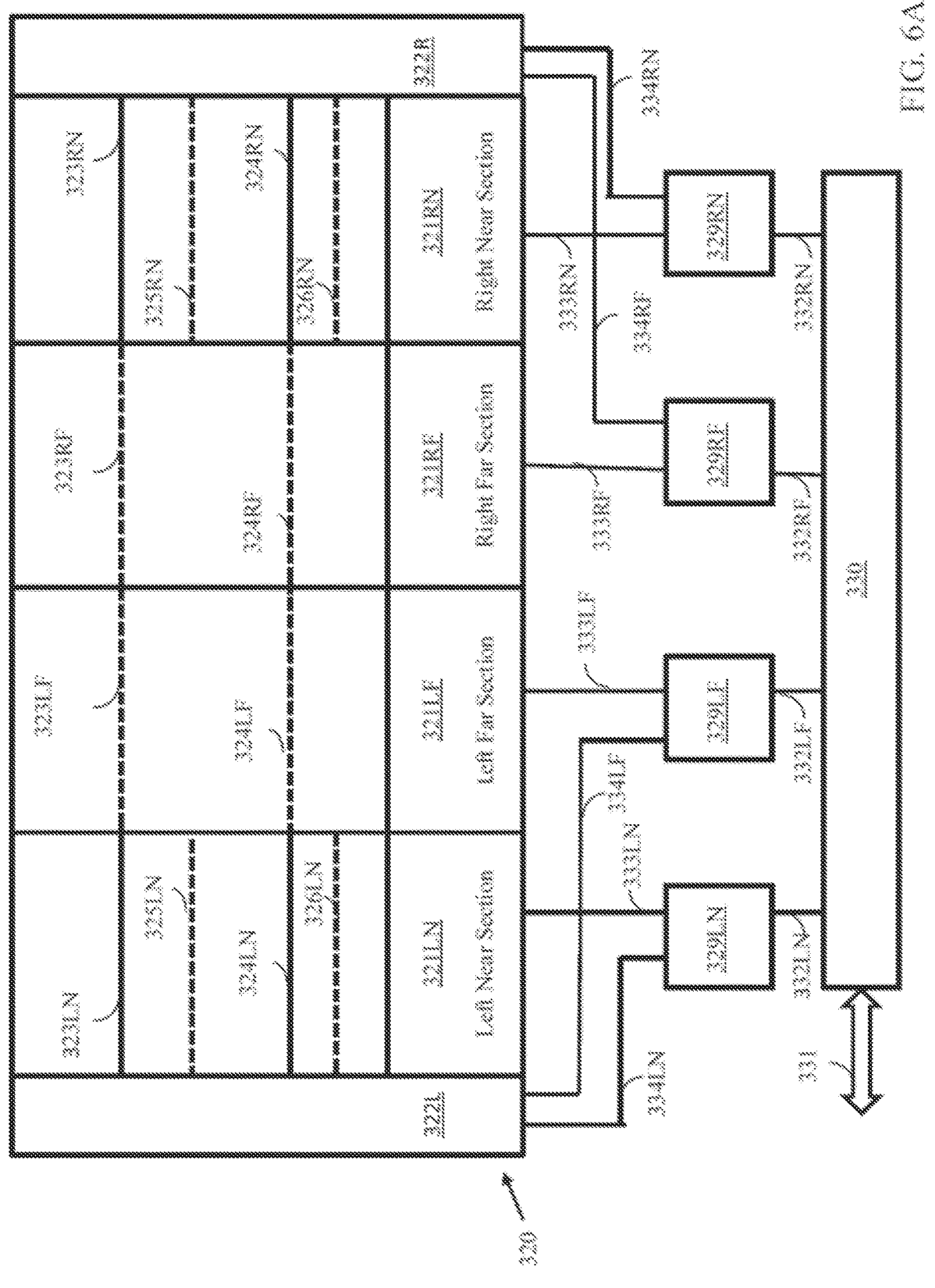
FIG. 6A is a block diagram of an arrangement of word lines on a backplane divided into four vertical sections each modulated by a different display controller.

FIG. 6A depicts an arrangement whereby four controller devices 329LN, 329LF, 329RF and 329RN control a single backplane 320. The array of pixel drivers of backplane 320 is divided into four vertical sections, each of which has a controller associated with it. The descriptive convention for this application is that LN means left near, LF means left far, RF means right far, and RN means right near. The use of near and far means the relative distance to the row address circuitry found in left row decoder and word line driver 322L or the relative distance to the row address circuitry found in right row decoder and word line driver 322R.

The vertical sections comprise left near independent section of pixel drivers 321LN, left far independent section of pixel drivers 321LF, right far independent section of pixel drivers 321RF, and right near independent section of pixel drivers 321RN, hereafter referred to as sections. It is possible to make the width of the sections 321LN, 321LF, 321RF and 321RN substantially equal, but it is not strictly necessary that the vertical sections be substantially or exactly equal. Engineering considerations may dictate that they not all be equal. It is also possible to make the width of the left side sections combining 321LN and 321LF not equal to the width of the right side sections combining 321RN and 321RF for engineering reasons. Note that none of the independent sections of pixel drivers 321LN, 321LF, 321RF and 321RN overlap with any of the other independent sections of pixel drivers 321LN, 321LF, 321RF or 321RN.

Complete image data for the array of pixel drivers is received by image data preprocessor 330 over bus 331. Image data preprocessor 330 processes the incoming image data to separate it into data for left near section 321LN, left far section 321LF, right far section 321RF and right near section 321RN and delivers that data to display controller 329LN, display controller 329LF, display controller 329RF and display controller 329RN over terminals 332LN, 332LF, 332RF, and 332RN respectively. Display controller 329LN, display controller 329LF, display controller 329RF, and display controller 329RN process the data and schedules it to be written to the required row. All display controllers 329LN, 329F, 329RF, and 329RN and preprocessor 330 operate on the same master clock set by a crystal controlled circuit (not shown) or similar devices. This does not keep them precisely synchronized because each display controller synchronizes to the master clock signal with its individual digital phase lock loop which will run slightly asynchronous to the other digital phase lock loops. Each display controller also receives a Vsync (vertical synchronization) signal from circuitry associated with image data preprocessor 330. Vsync will keep the frame rate of each image section in sync with the frame rates of all other image sections. They will normally be within a clock cycle or two, which has negligible effect on image quality between vertical sections.

In one embodiment, the data transferred to the column data registers by each display controller is not limited to the boundaries of each independent segment of pixel drivers with which is associated through the row select assembly.

There are other methods of developing and implementing a display controller assembly. In one approach, all required display controllers are designed and implemented in a single semiconductor device. This may make some aspects easier to implement, but the federated approach illustrated herein offers some advantage with respect to yield due to the smaller silicon size for the individual display controllers. Also, the striped display approach to the backplane is compatible with either approach to the display controller.

A device termed as a single display controller or display controller assembly wherein each display controller controls a section of a display may be comprised of a number of separate elements, such as multiple semiconductor devices, within the spirit of this invention.

Row decoder and word line driver 322L comprises a pair of row decoders and word line drivers; one for display controller 329LM and one for display controller 329LF. Display controller 329LN delivers word line address and a row trigger control signal over line 334LN to row decoder and word line driver 322L. At the same time display controller 329LN delivers image data for the addressed row onto a set of bit line drivers over conductor 333LN for left near section 321LN (not shown.) The relative timing requires that data for all pixel drivers of the addressed row be in place before the word line driver pulls the word line for that segment of the row high. Propagation delay can be taken into account as long as the propagation rates across the display and up the display to ensure that the complementary bit lines for that column are in their data state at that row before the word line pulls high at that point on the row.

Display controller 329LF delivers word line address and a row trigger signal over line 334LF to the second of two row decoder and word line driver circuits in row decoder and word line drive 322L. At the same time display controller 329LF delivers image data for the addressed row onto a set of bit line drivers over conductor 333LF. The same considerations for propagation delay addressed for display controller 329LN apply to display controller 329LF.

Row decoder and word line driver 322R comprises a pair of row decoder and word line driver circuits after the circuits of row decoder and word line driver 322L. Display controller 329RF delivers word line address and a row trigger signal over line 334RF to one of a pair of row decoder and word line driver circuits in row decoder and word line driver 322R. Display controller 329RF delivers image data for right far section 321RF to the bit line drivers over conductor 333RF with the previously noted timing conditions.

Display controller 329RN delivers a word line address and a row trigger signal over line 334RN to the second of two row decoder and word line driver circuits in row decoder and word line drive 322R. Display controller 329RN delivers image data for right near section 321RN over conductor 333RN with the previously noted timing conditions.

In one embodiment, display controllers 329LN, 329LF, 329RF and 329RN operate physically separated trigger circuits similar in function and location.

When row decoder and word line driver 322L receives a row address from display controller 329LN on a first row decoder and word line driver circuit, the word line of the row corresponding to the address is held to a state that enables the memory circuits operated by that word line to receive data over the bit lines when a trigger signal is received over the same connection. Dashed line 325LN represents a word line for a first row of near left section 321LN and dashed line 326LN represents a word line for a second row of near left section 321LN. Because section 321LN is near to row decoder and word line driver, word line 325LN and word line 326LN do not extend into left far section 321LF. For reasons of constant metal density, a dummy metal structure may be positioned in left far section 321LF to improve the planarity of the die forming the backplane, a consideration of importance for liquid crystal and other devices.

When row decoder and word line driver 322L receives a row address from display controller 329LF on a second row decoder and word line driver circuit, the row corresponding to the address is held high when a trigger signal is received over the same connection. Word line 323LN passes under left near section 321LN without making electrical connection and reaches word line 323LF, which is connected to the SRAM memory cells of each pixel driver in left far section 321LF. Identical considerations hold true for word line segments 324LN and 324LF.

The RC value of word line 323LN combined with word line 323LF will be greater than the RC value of 326LN because of the resistance associated with the length of 324LN that passes under left near section 321LN, although, if the sections are not of equal width, that must also be taken into account. The RC characteristic is part of the definition of transport delay in propagating the change in the word line from low to high and back to low.

Similar considerations apply in the case of word line 325RN and 326RN, which both connect to a row of pixel drivers in right near section 321RN. Likewise, word line 323RN passes under right near section 321RN in order to connect to word line segment 323RG, which connects to SRAM memory cells in pixel drivers forming a row of right far section 321RF. The same consideration applies to word line segment 324RN which connects to word line segment 324RF.

Figure 6B:
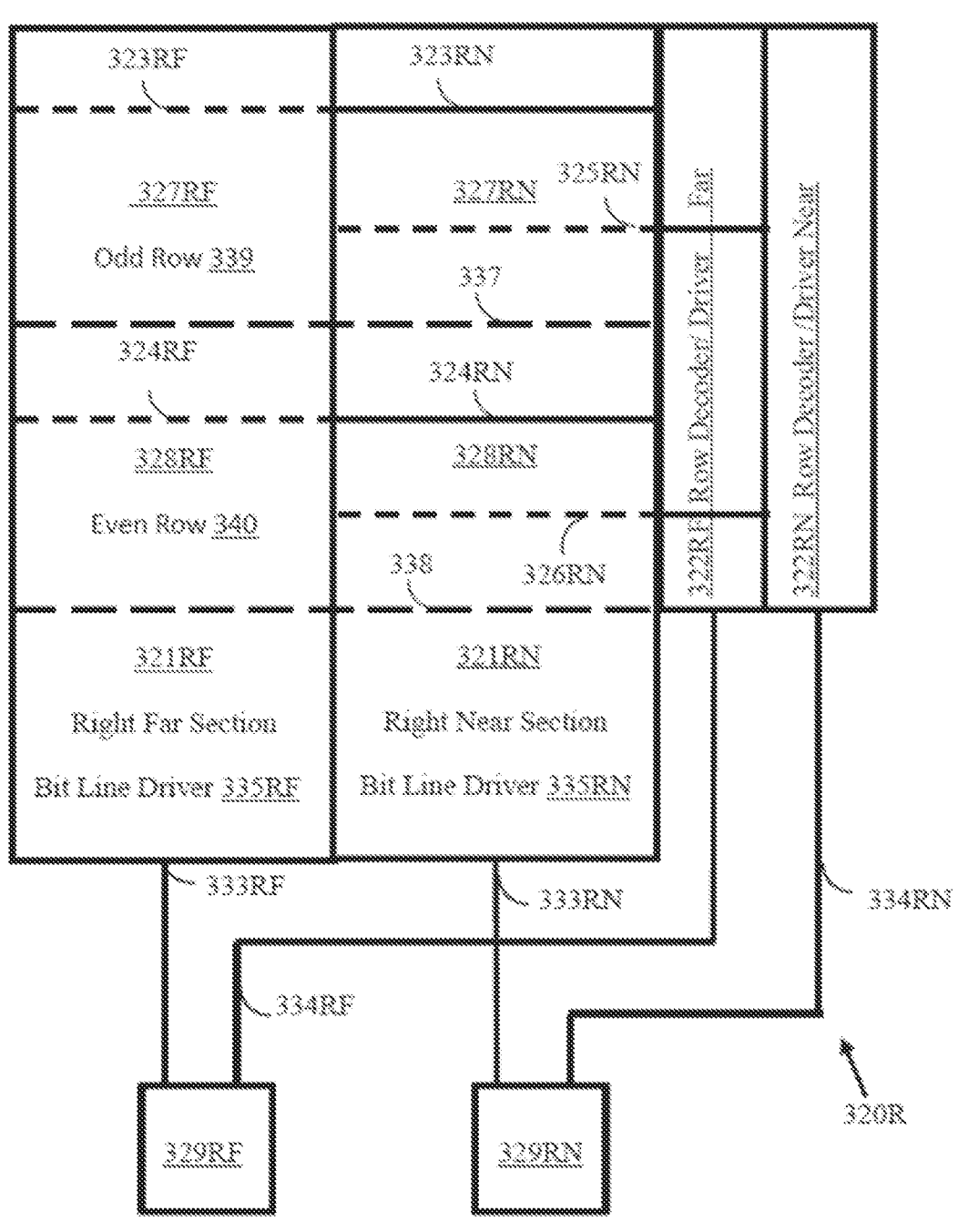
FIG. 6B is a block diagram of the right side of the block diagram of FIG. 6A with added detail.

FIG. 6B illustrates a more detailed block diagram view of parts of the right half of the system of FIG. 2A. The expanded view comprises display controller 329RF, display controller 329RN, and partial backplane 320R. Partial backplane 320R comprises right far section 321RF, right near section 321RN, row decoder and word line driver (right far section 322RF), and row decoder and word line driver (right near section) 322RN. The relative positions of row decoder and word line driver 322RF and of row decoder and word line driver 322RN is selected for ease of explanation. They may in fact be developed in different layers and stacked vertically, depending on the number of metal layers of the backplane semiconductor. Other arrangements are possible.

Right far section 321RF comprises bit line driver 335RF, even row pixel driver 328RF and odd row pixel driver 327RF. Right near section 321RN comprises bit line drive circuit 335RN, even row pixel driver 328RN and odd row pixel driver 327RN. Odd row 339 comprises pixel driver 327RF and pixel driver 327RN, and even row 340 comprises pixel driver 328RF and pixel driver 328RN. For clarity, dashed line 337 represents the boundary between the pixel drivers of odd row 339 and the pixel drivers of even row 340. Dashed line 338 represents the boundary between the pixel drivers of even row 340 and bit line driver 335RF and bit line driver 335RN.

Display controller 329RF delivers image data to bit line driver 335RF over conductor 333RF. Conductor 333RF comprises a substantial plurality of parallel data paths. Display controller 329RF sends row address information to row decoder and word line driver 322RF over conductor 334RF. In one embodiment, a separate trigger signal is sent over conductor 334RF to pull the word line high when timing is important. This can be implemented using an AND gate (not shown) with two input ports and one output. The selected row receives one input from the row decoder and the second from the trigger signal and the output is connected to the word line. Only one AND gate will have a high input on both input ports, which will result in the output of the AND gate pulling the word line high.

Digital controller 329RN delivers image data to bit line driver 335RN over conductor 333RN. Conductor 333RN comprises a substantial plurality of parallel data paths. Display controller 329RN sends row address information to row decoder and word line driver 322RN over conductor 334RN. In one embodiment, a separate trigger signal is sent over conductor 334RN to pull the word line high when timing is important. This can be implemented using an AND gate with two input ports and one output. The selected row receives one input from the row decoder and the second from the trigger signal and the output on the word line. Only one AND gate will have a high input on both input ports, which will result in the output of the AND gate pulling the word line high.

Pixel driver 327RF is the portion of odd row 339 that lies in right far section 321RF. In practical embodiments, right far section 321RF may comprise 500 to 1000 pixel drivers or more, although other number of pixel drivers are not excluded. Similar considerations may be applied to pixel driver 327RN, pixel driver 328RF and pixel driver 328RN.

Row decoder and word line driver far 322RF is operative to drive two word lines sets in each row. Word line segment 323RN passes under pixel driver 327RN of odd row 339 to connect to word line segment 327RF where it makes contact with the SRAM memory cell of pixel driver 327RF. Row decoder and word line driver near 322RN drives word line segment 325RN which makes contact with the SRAM memory cell of pixel driver 327RN.

Row decoder and word line driver 322RF is operative to drive word line segment 324RN that passes under pixel driver 328RN of even row 340 to connect to word line segment 324RF where it makes contact with the SRAM memory cell of pixel driver 328RF.

In one embodiment, word line segments 223RN and 223RF and word line segment 225RN of odd row 239 are pulled high at substantially the same time with some allowance for differing propagation delays. Alternatively word line segments 224RN and 224RF and word line segment 226RN of even row 240 are pulled high at substantially the same time with some allowance for differing propagation delays. The choice of row on which the word lines are pulled high depends on the address data sent to row decoder and word line drivers 222RF and 222RN.

For display applications generating images for viewing by humans, it is best to keep the near and far sections on the same schedule. This will help control the generation of visual artifacts from such causes as lateral field effects. For other applications there may be advantages to placing the near and far sections on differing schedules.

Figure 6C:
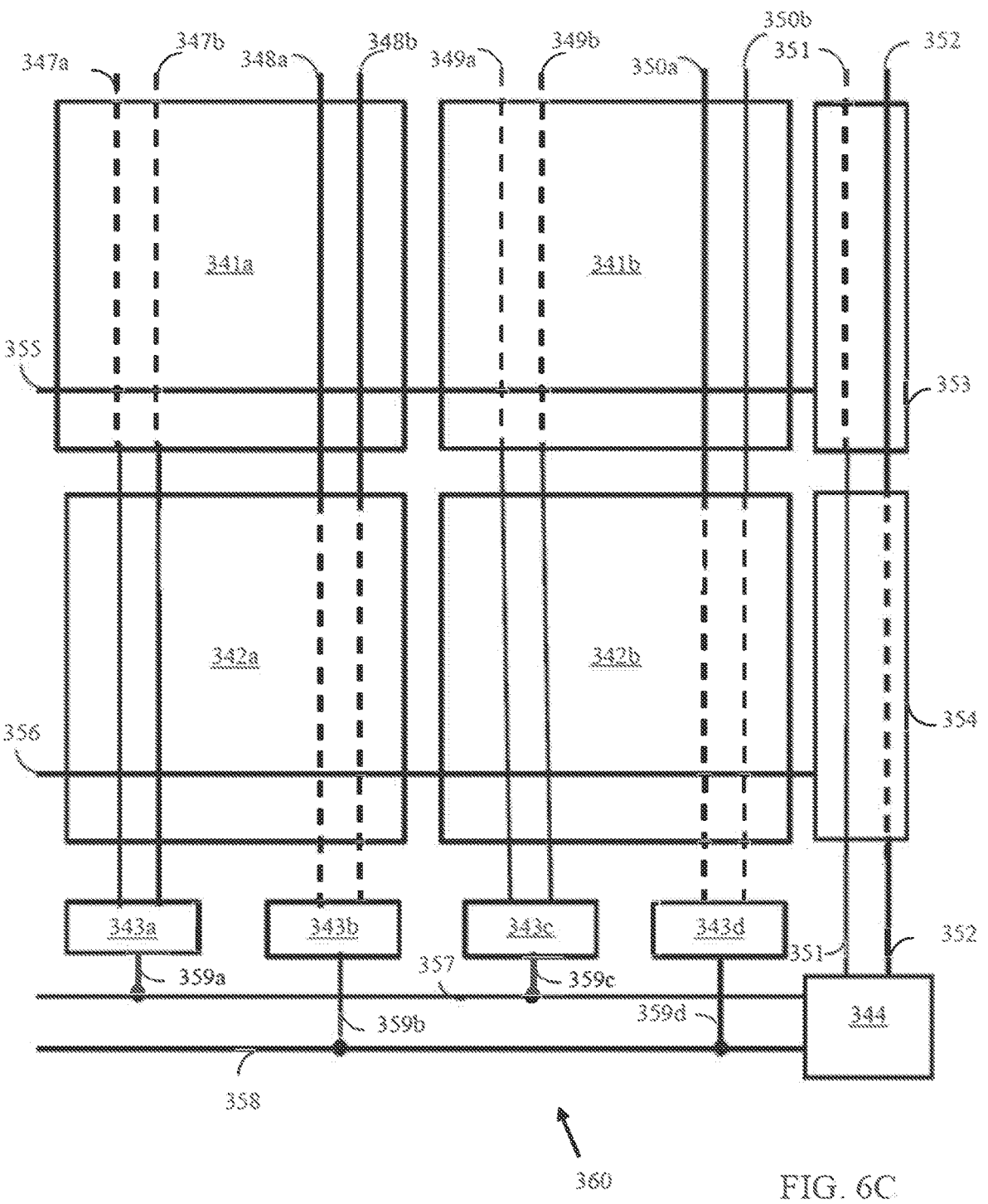
FIG. 6C is a block diagram of a 2×2 array of pixel drivers in which even rows and odd rows are modulated independently of each other.

FIG. 6C depicts an additional way in which the time required to write an array can be reduced. Display system 360 comprises four pixel drivers 341a, 341b, 342a, and 342b arranged in a 2×2 matrix format. Display system 360 further comprises row decoder and word line drivers 353 and 354, and bit line drivers 343a, 343b, 343c and 343d, and display controller 344. It is to be understood that a practical arrangement will have many more rows and columns than are depicted here.

Pixel drivers 341a and 341b form an odd numbered row of pixel drivers and pixel drivers 342a and 342b form an even number row of pixel drivers. Row decoder and word line driver 353 drives word line 355 associated with odd row pixel drivers 341a and 341b. Row decoder and word line drive 354 drives word line 356 associated with even row pixel drivers 342a and 342b.

Bit line driver 343a supplies complementary binary image data to the SRAM memory cell of pixel driver 341a on an odd numbered row over complementary bit lines 347a and 347b. Bit line driver 343c supplies complementary binary image data to the SRAM memory cell of pixel driver 341b on an odd numbered row over complementary bit lines 349a and 349b. Complementary bit lines 347a and 347b and complementary bit lines 349a and 349b pass underneath pixel drivers 342a and 342b located on an even numbered row.

Bit line driver 343b supplies complementary binary image data to the SRAM cell of pixel driver 342a on an even numbered row over complementary bit lines 348a and 348b. Bit line driver 343d supplies complementary binary image data to the SRAM memory cell of pixel driver 342b over complementary bit lines 350a and 350b. Complementary bit lines 348a and 348b and complementary bit lines 350a and 350b pass under pixel drivers 341a and 341b in an odd numbered row. It is understood that further even numbered rows may be positioned above the odd numbered row of pixel drivers 341a and 341b.

Data for odd numbered rows is supplied to bit lines drivers 334a and 343c over bus line 357 by terminals 359a and 359c. Data for even numbered rows is supplied to bit line drivers 334b and 334d over bus line 358 by terminals 359b and 359d. Bus lines 351 and 352 comprise a plurality of parallel lines used to transmit address data for the selected row to row decoder and word line drivers 353 and 354 respectively. In one embodiment, bus lines 351 and 352 comprise a word line trigger signal conductor that controls the timing of the action to pull the word line high.

Figure 6D:
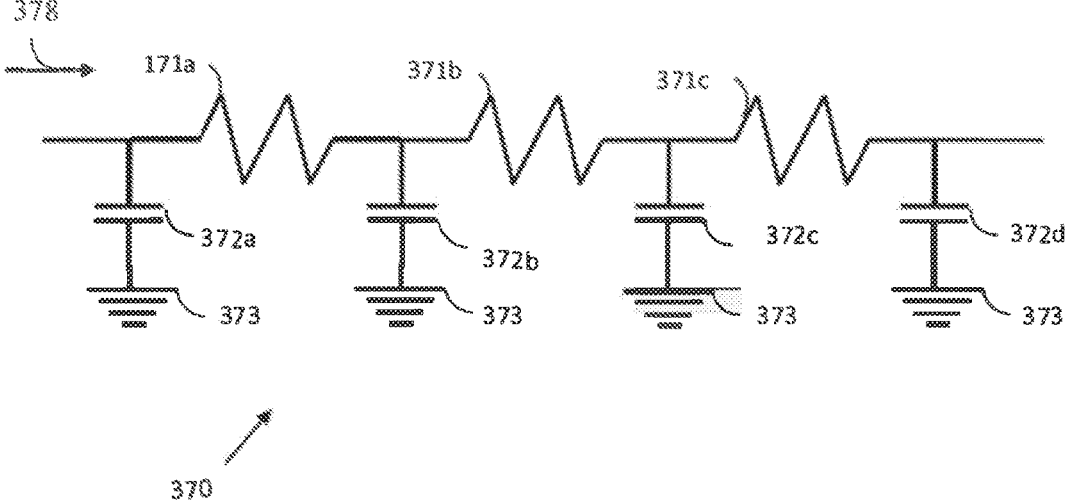
FIG. 6D illustrates an equivalent circuit of the resistance and capacitance of a segment of a conductor in a semiconductor wherein the resistance and capacitance of a first part of the segment differs from the resistance and capacitance of a second part of the segment.

FIG. 6D illustrates a depiction of the RC characteristics 370 of a word line after word line segment 323RN combined with word line segment 323RF of detailed block diagram 320R of FIG. 6B. Vector 378 represents the direction of propagation of the row select signal on the word line. Resister 371a represents the resistance and capacitor 372a represents the parasitic capacitance of word line segment 323RN which passes under right near section 321RN of detailed block diagram 320R. Note that all depicted capacitances are connected to ground 373. Other grounding configurations may be possible as the parasitic capacitance for word line segment 323RN may be influenced by another nearby conductor at a different potential rather than by a ground plane.

Capacitors 372b, 372c and 372d represent the capacitance at nodes where word line segment 323RF intersects with circuit elements, such as pass transistors 128 and 129 of 6-transistor data storage element 120 of FIG. 1B. A general expectation is that the capacitance due to interaction at the nodes would be significantly greater than the parasitic capacitance due to the presence of other circuit elements nearby, although there are exceptions to this that depend on the specifics of the semiconductor manufacturing process and the design rules associated with the chosen process. Modern semiconductor computer aided design (CAD) software tools allow detailed evaluations to be conducted prior to manufacturing and testing the silicon design.

The value of resistance R for a segment of a conductor can be calculated is illustrated in the discussion of FIG. 3 and is repeated here in simplified form. Applicant refers the reader to that text. As previously noted, all conductors in the same layer of a semiconductor process are typically made of the same material, such as aluminum or copper, and will therefore have a similar resistivity $\sigma$ and height H. The length L and width W can be varied but the resistance per unit length will be the same if the resistivity $\sigma$ and width W are the same. One manner in which the resistance of a wire of a given unit length can be reduced is by increasing the width W. Care must be taken when doing this because the reduction in resistance R may be accompanied with an increase in stray capacitance C, which may result in a less than desired reduction in the RC characteristic of the conductor. This in turn would limit or eliminate any increase in signal propagation speed on such a line.

A useful goal is a reduction in the time required for a word line select signal to propagate along a word line after the word line described above comprising word line segment 323RN combined with word line segment 323RF. Word line segment 323RN does not interact with the memory circuits of right near section 321RN of pixel drivers whereas word line segment 323RF interacts with the memory circuits of right far section 321RF of pixel drivers. Word line segment 325RN interacts with the memory circuits of right near section 321RN. The word lines selected for this example address one row of many rows, all of which may be addressed in a similar manner.

The time required to propagate across right near section 327RN on word line segment 325RN is determined by the RC characteristic of the line. The signal from word line segment 325RN is not propagated into right far section 321RF because the memory circuits on the same row of right far section 321RF are controlled by a signal on word line segment 323RF received through word line segment 323RN, as previously noted.

In one embodiment, word line segment 323RN that does not interact with the memory circuits on its row of right near section 321RN is routed near to word line segment 325RN. This may be a desirable design choice for a number of reasons unrelated to capacitance, such as a desire to maintain a constant metal density on individual layers of the semiconductor to preserve its planarity, an important consideration for liquid crystal devices such as liquid crystal on silicon light modulators.

Applicant has developed several backplanes of different sizes in different processes with an active resolution of 4096 columns by 2400 rows. By applying the four display controller approach as disclosed herein and also using the even row-odd row approach, the nominal size of display that each display controller subchannel must handle becomes 1024 wide by 1200 tall, which is substantially manageable. The ultimate requirement, then is for four pairs of display controller subchannels, which is effectively eight subchannels.

Delay in the propagation of data and signals in a backplane is of the utmost importance when using an older process with aluminum wiring, especially if the part is large in integrated circuit terms. Applicant is separately filing a separate patent application describing means for minimizing the delays within a backplane by speed matching the bit lines to the word line control and by speed matching the word line propagation to the bit line trigger signal.

Figure 7A:
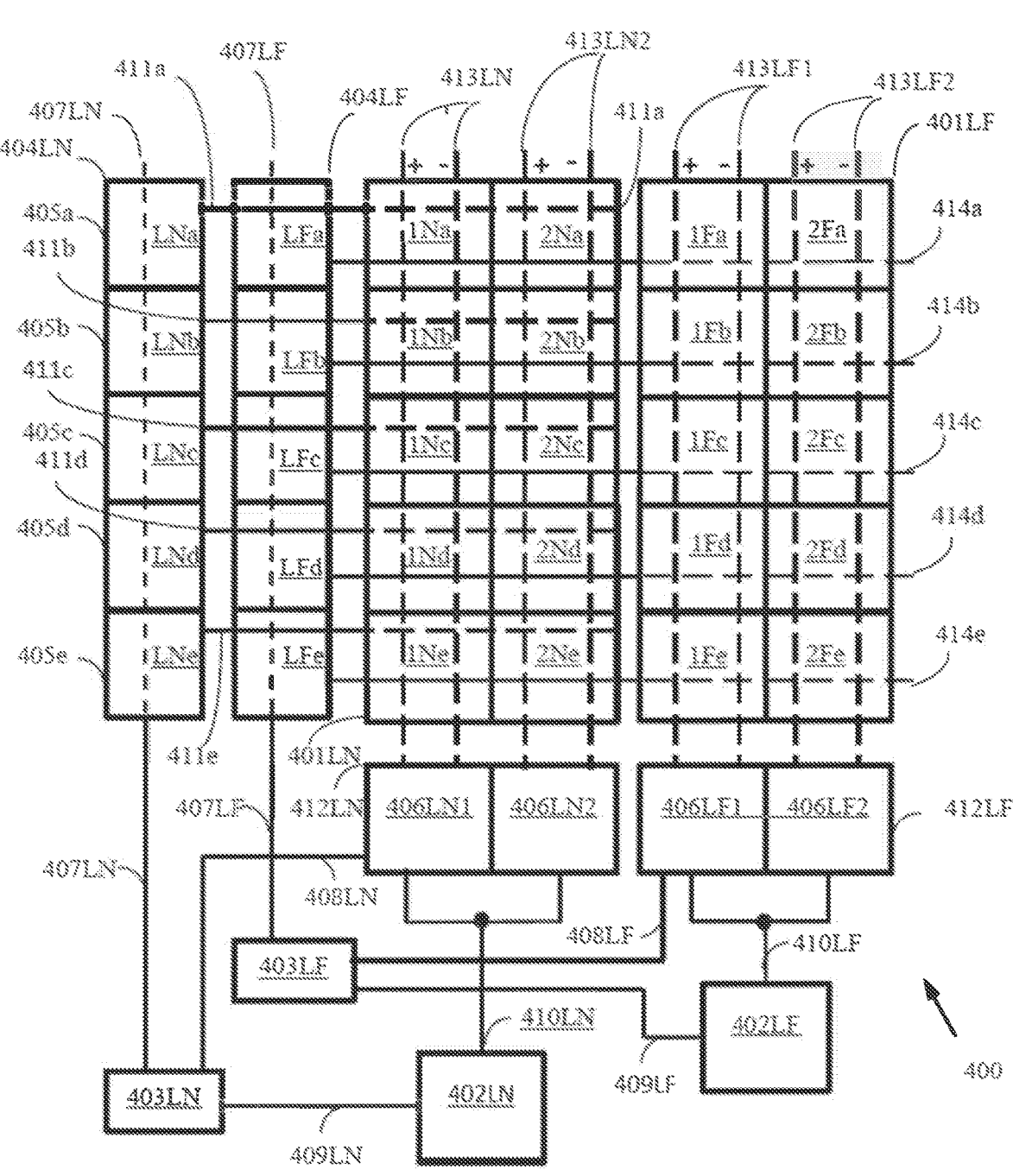
FIG. 7A is a block diagram of the left half of an array of pixel drivers comprising two vertical sections of pixel drivers modulated by separate display controllers.

FIG. 7A illustrates a depiction of the left side of a display 400 with 4 vertical sections of pixel drivers. Left display side 400 comprises leftmost vertical section of pixel drivers 401LN and left of center vertical section of pixel drivers 401LF. Left display side 400 further comprises display controller 402LN operative to control vertical section of pixel drivers 401LN, display control 402LF operative to control vertical section of pixel drivers 401LF, row of bit line drivers 412LN operative to deliver complementary bit line data to the pixels of vertical section of pixel drivers 401LN, and row of bit line drivers 412LF operative to deliver bit line data to the pixel drivers of vertical section of pixel drivers 301LF. All segments may be resident in a same physical semiconductor assembly. Left display side 400 comprises row decoder and word line driver assembly 404LN operative to drive the word line of the selected row in vertical section of pixel drivers 401LN and row decoder and word line drive assembly 404LF operative to drive the word line of the selected row in vertical section of pixel drivers 401LF.

Display controller 402LN and display controller 402LF receive row address and row data information for their respective vertical sections from an image data preprocessor such as image data preprocessor 330 of FIG. 6A. Each display controller controls its vertical section of pixel drivers without regard to adjacent display controllers. The display controllers are programmed to operate in a similar manner with respect to rows to be written and are synced to the same clock. As a result, the adjacent vertical sections normally operated within a few clock cycles of each other.

The image data for a given row within vertical section of pixel drivers 301LN is loaded by display controller 402LN onto bit line drivers 406LN1 and 406LN2 of row of bit line drivers 412LN for the pixel drivers of vertical section of pixel drivers 401LN over terminal 410LN. The pixel drivers associated with bit line driver 406LN1 comprise pixel drivers 1Na, 1Nb, 1Nc, 1Nd and 1Ne, and the pixel drivers associated with bit line driver 306LN2 comprise pixel driver 2Na, 2Nb, 2Nc, 2Nd and 2Ne. Bit line drive 406LN1 loads the bit line data for the selected pixel driver onto complementary bit lines 413LN1, which are marked with a + (plus) sign or a − (minus) sign for $B_{POS}$ or $B_{NEG}$ respectively. Bit line drive 406LN2 loads the bit line data for the selected pixel driver onto complementary bit lines 413LN2. As before, the complementary bit lines are marked with a + sign or a − sign.

The image data for a given row with vertical section of pixel drivers 401LF is loaded by display controller 402LF onto bit line driver 406LF1 and 406LF2 of row of bit line drivers 412LF for the pixel drivers of vertical section of pixel drivers 401LF over terminal 410LF. The pixel drivers associated with bit line driver 406LF1 comprise pixel drivers 1Fa, 1Fb, 1Fc, 1Fd and 1Fe, and the pixel drivers associated with bit line drive 306LF2 comprise 2Fa, 2Fb, 2Fc, 2Fd and 2Fe. Bit line driver 406LF1 loads the bit line data for the selected pixel driver onto complementary bit lines 413LF1, which are marked with a + (plus) sign or a − (minus) sign for $B_{POS}$ or $B_{NEG}$ respectively. B bit line driver 306LF2 loads the bit line data for the selected pixel driver onto complementary bit lines 313LF2. As before, the complementary bit lines are marked with a + (plus) sign or a − (minus) sign.

Left display side 400 comprises rows 405a, 405b, 405c, 405d and 405e, each of which comprises a left near row decoder and wordline driver in row decoder and word line driver assembly 404LN, a left far row decoder and word line drive in wordline driver assembly 4004LF, two pixel drivers in a left near vertical section and two pixel drivers in a left far vertical section. For example, row 405a comprises left near row decoder and word line driver LNa, left far row decoder and word line drive driver LFa, pixel drivers 1Na and 2Na of left near section 401LN and pixel drivers 1Fa and 2Fa of left far section 401LF. Rows 405b, 405c, 405d and 405e are organized identically with their constituents.

Left display side further comprises trigger signal circuit 403LN and trigger signal circuit 403LF. Trigger signal circuit 403LN receives a signal or set of signals over bus 409LN from display controller 402LN. Trigger signal circuit 403LN releases a bit line trigger signal over bus line 408LN and row select and word line high signals over bus line 407LN. In one embodiment, trigger signal circuit 403LN forms a part of display controller 402LN. Trigger signal circuit 403LF receives a signal or set of signals from display controller 302LF over bus 409LF. Trigger signal circuit 403LF releases a bit line trigger signal over bus line 408LF and row select and word line high signals over bus line 407LF. In one embodiment, trigger signal circuit 403LF forms a part of display controller 402LF.

Row select and word line high trigger signals delivered over bus 307LN to row decoder and word line driver assembly 304LN cause the following actions to take place. The row decoder logic in one of row decoder and word line driver LNa, LNb, LNc, LNd and LNe will go high in response to the row select signals delivered to row decoder and word line driver assembly 304LN. In a first embodiment, the output of the word line driver of each row is applied to the input of a two input AND gate (not shown). The word line trigger signal is applied to the other input of each of the AND gates. Only the selected row receives an input from both the row select decoder logic and the word line trigger signal, allowing that word line to be held high by the output of the AND gate. In one embodiment, the row decoder logic pulls the word line high without the word line trigger signal.

Word line driver LNa drives word line 411a, which provides the word line signal to the memory circuits of pixel drivers 1Na and 2Na of vertical section of pixel drivers 401LN. Word line 411a does not extend into vertical section of pixel drivers 401LF. In like manner word line drive LNb drives word line 411b, which provides the word line signal to the memory circuits of pixel drivers 1Nb and 2Nb of vertical section of pixel drivers 401LN. Word line drivers LNc, LNd, and LN3 drive word lines 411c, 411d and 411e respectively, which provide word line signal to the memory circuits of the pixel drivers of their respective rows.

Row select and word line high signals delivered over bus 407LF to row decoder and word line driver assembly 404LF cause the following actions to take place. The row decoder logic in one of row decoder and word line driver LFa, LFb, LFc, LFd and LFe will go high in response to the row select signals delivered to row decoder and word line driver assembly 404LF. In a first embodiment, the output of the word line driver of each row is applied to the input of a two input AND gate (not shown). The word line trigger signal is applied to the other input of each of the AND gates. Only the selected row receives an input from both the row select decoder logic and the word line trigger signal, allowing that word line to be held high. In one embodiment, the row decoder logic pulls the word line high without the trigger signal or the presence of the AND gate.

Word line driver LFa drives word line 441a, which provides the word line signal to the memory circuits of pixel drivers 1Fa and 2Fa of vertical section of pixel drivers 401LF. Word line 414a passes under the pixel drivers of vertical section of pixel drivers 401LN without making electrical connection. In like manner word line drive LFb drives word line 414b, which provides the word line signal to the memory circuits of pixel drivers 1Fb and 2Fb of vertical section of pixel drivers 401LF. Word line drivers LFc, LFd, and LFe drive word lines 414c, 414d and 414e respectively, which provide word line signal to the memory circuits of the pixel drivers of their respective rows.

Trigger circuit 403LN delivers a bit line driver trigger signal to bit line drivers 406LN1 and 406LN2 of row of bit line driver circuits 412LN. This releases the data previously loaded onto bit line drivers 406LN1 and 406LN2 by display controller 402LN. The data and its complement are loaded onto complementary bit lines 413LN1 by bit line driver 406LN1 and onto complementary bit lines 413LN2 by bit line driver 406LN2.

Trigger circuit 403LF delivers a bit line driver trigger signal to bit line drivers 406LF1 and 406LF2 of row of bit line driver circuits 412LF. This releases the data previously loaded onto bit drivers 406LF1 and 406LF2 by display controller 402LF. The data and its complement are loaded onto complementary bit lines 413LF1 by bit line driver 306LF1 and onto complementary bit lines 413LF2 by bit line driver 406LF2.

Control over timing of the word line and the bit line is essential to the efficient operation of a backplane. In general, the bit line at a particular pixel driver of a selected row has to be loaded with the complementary data for that pixel driver before its word line is pulled high. It is also important that the previous word line held high should be turned off before the data for the new pixel driver of the next selected row reaches the pixel driver of the old row. Turning off the word line for the old row can be accomplished by either removing the word line trigger signal for cases where the word line trigger signal is required or by selecting the new row in the case where there is no word line release signal.

Figure 7B:
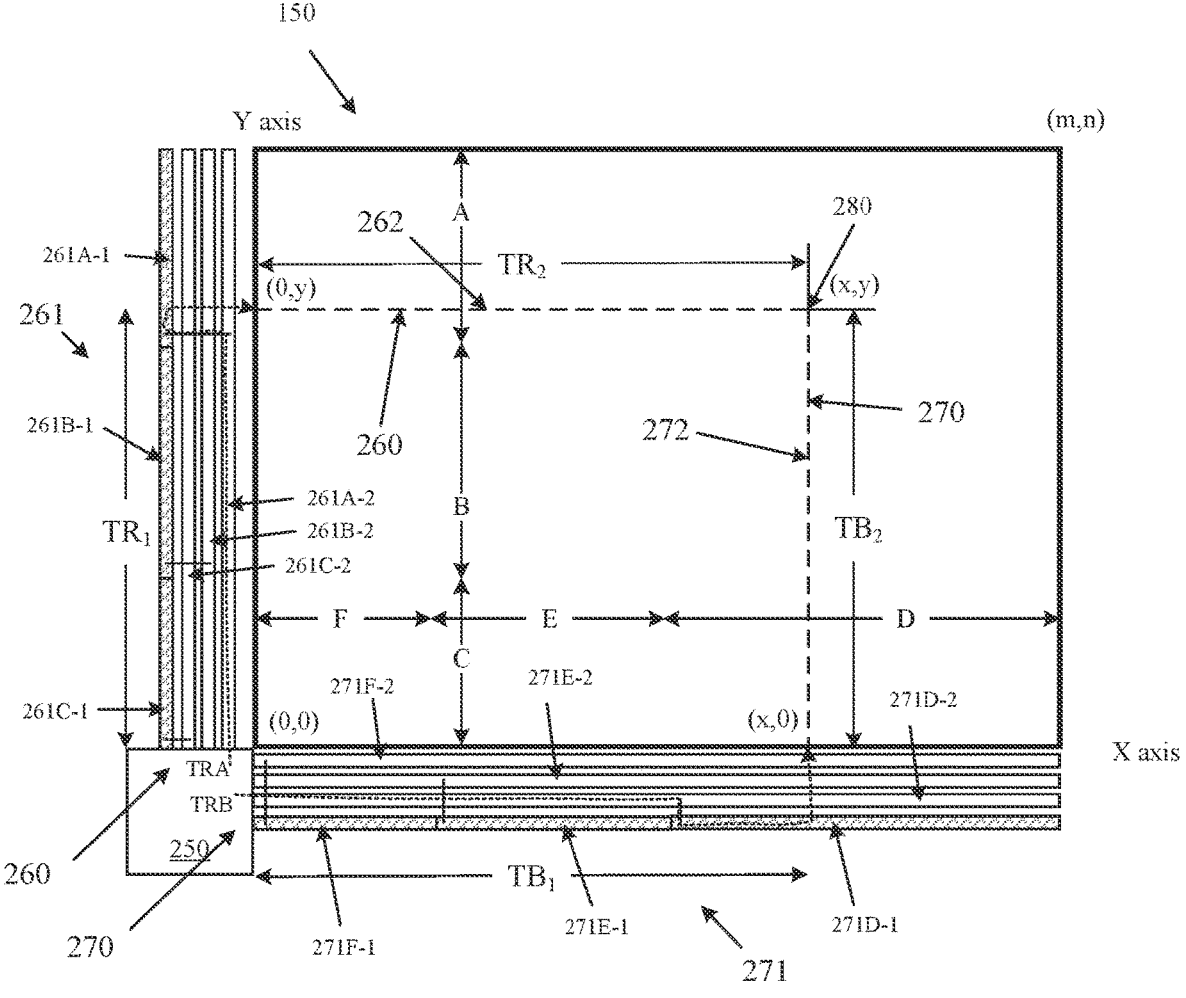
FIG. 7B is an illustration of time delays for delivery of data to the memory elements of a pixel driver.

In FIG. 7B, an SRAM array 420 that is m columns wide by n rows high is illustrated for discussion of propagation delay. FIG. 7B illustrates how the dummy pixel driver arrays shown and described in connection with at least FIGS. 1C and 1E can be implemented in connection with a pixel driver array 150.

In this example implementation, the row select path 261 (of the wordline path 260) includes several parallel dummy pixel driver arrays 261A-2, 261B-2 and 261C-2 (e.g., each including disabled data storage elements). For simplicity, only three dummy pixel driver arrays 261A-2, 261B-2 and 261C-2 are shown. The dummy pixel driver arrays 261A-2, 261B-2 and 261C-2 have lengths the same as the lengths of the bitlines in the pixel driver array 150 so as to replicate the RC characteristics of the bitlines in the pixel driver array 150.

Sections (or segments) of row drivers 261A-1, 261B-1, 261C-1 (which correspond with portions of the wordlines A, B, and C (marked with double-sided arrows) of the pixel driver array 150) are tapped, respectively, from the dummy pixel driver arrays 261A-2, 261B-2, and 261C-2. The sections of row drivers 261A-1, 261B-1, 261C-1 and the dummy pixel driver arrays 261A-2, 261B-2, and 261C-2 are disposed outside of the pixel driver array 150. As a specific example, the dummy pixel driver array 261A-2 can be used, along with a section of row drivers 261A-1 (e.g., row driver 140a, 140b shown in FIG. 1C) tapped from the dummy pixel driver arrays 261A-2 (e.g., dummy pixel driver array 198a shown in FIG. 1C) to drive wordlines A (marked with a double-sided arrow). The section of row drivers 261A-1 corresponds with the wordlines A. Similarly, the section of row drivers 261B-1 is tapped from the dummy pixel driver array 261B-2, and the section of row drivers 261C-1 is tapped from the dummy pixel driver array 261C-2. Although the connections are not shown in FIG. 7B, the sections of row drivers 261A-1, 261B-1, 261C-1 are connected to and configured to drive the various wordlines in the pixel driver array 150.

A dashed arrow illustrates one potential path for a trigger signal TRA through the dummy pixel driver array 261A-2 and the section of row drivers 261A-1 to drive a wordline associated with pixel of interest 280 in wordlines A. As shown in FIG. 7B, the dummy pixel driver arrays 261A-2, 261B-2, 261C-2 are aligned as close as possible to the pixel driver array 150 so that the RC characteristics can be matched as closely as possible. The dummy pixel driver arrays 261A-2, 261B-2, 261C-2 are disposed between the pixel driver array 150 and the sections (or segments) of row drivers 261A-1, 261B-1, 261C-1.

The configuration shown in FIG. 7B includes row drivers tapped along only portions of the dummy pixel driver array 261A-1 of the row select path 261, which can reduce RC effects (compared with including row drivers along the entirety of the dummy pixel driver array 261A-1). Specifically, row drivers 261A-1 are tapped along an upper portion only of the dummy pixel driver array 261A-1 (to drive the wordlines A in the upper portion of the pixel driver array 150) and row drivers are not tapped along a lower portion of the dummy pixel driver array 261A-1. Instead, for example, dummy pixel driver array 261C-2 has row drivers 261C-1 along a lower portion of the dummy pixel driver array 261C-1 (to drive the wordlines C in the lower portion of the pixel driver array 150).

As an example of loading that can be implemented for a configuration such as that shown in FIG. 7B, 8 sections of 8 row drivers each (to drive a total of 64 wordlines) can each be tapped to one of 16 dummy pixel driver arrays (which are arranged in parallel as shown in FIG. 7B). Accordingly, each one of the 16 dummy pixel driver arrays can be tapped 8 times with 8 different sections of row drivers (only one tap and one section of row drivers is shown for each dummy pixel driver array in FIG. 7B). This configuration can drive 1024 different wordlines within a pixel driver array.

Also, in this example implementation, the load data trigger path 271 (of the bitline path 270) includes several parallel dummy pixel driver arrays 271D-2, 271E-2 and 271F-2 (e.g., each including disabled data storage elements). For simplicity, only three dummy pixel driver arrays 271D-2, 271E-2 and 271F-2 are shown. The dummy pixel driver arrays 271D-2, 271E-2 and 271F-2 have lengths the same as the lengths of the wordlines in the pixel driver array 150 so as to replicate the RC characteristics of the wordlines in the pixel driver array 150.

Sections (or segments) of column drivers 271D-1, 271E-1, 271F-1 (which correspond with portions of the wordlines D, E, and F (marked with double-sided arrows) of the pixel driver array 150) are tapped, respectively, from the dummy pixel driver arrays 271D-2, 271E-2, and 271F-2. The sections of column drivers 271D-1, 271E-1, 271F-1 and the dummy pixel driver arrays 271D-2, 271E-2, and 271F-2 are disposed outside of the pixel driver array 150. As a specific example, the dummy pixel driver array 271D-2 can be used, along with a section of column drivers 271D-1 (e.g., column driver 160 shown in FIG. 1E) tapped from the dummy pixel driver arrays 271D-2 (e.g., dummy pixel driver array 199a shown in FIG. 1E) to drive wordlines D (marked with a double-sided arrow). The section of column drivers 271D-1 corresponds with the wordlines D. Similarly, the section of column drivers 271E-1 is tapped from the dummy pixel driver array 271E-2, and the section of column drivers 271F-1 is tapped from the dummy pixel driver array 271F-2. Although the connections are not shown in FIG. 7B, the sections of column drivers 271D-1, 271E-1, 271F-1 are connected to and configured to drive the various bitlines in the pixel driver array 150.

A dashed arrow illustrates one potential path for a trigger signal TRB through the dummy pixel driver array 271D-2 and the section of column drivers 271D-1 to drive a bitline associated with pixel of interest 280 in bitlines D. As shown in FIG. 7B, the dummy pixel driver arrays 271D-2, 271E-2, 271F-2 are aligned as close as possible to the pixel driver array 150 so that the RC characteristics can be matched as closely as possible. The dummy pixel driver arrays 271D-2, 271E-2, 271F-2 are disposed between the pixel driver array 150 and the sections (or segments) of column drivers 271D-1, 271E-1, 271F-1.

The configuration shown in FIG. 7B includes column drivers tapped along only portions of the dummy pixel driver array 271D-1 of the load data trigger path 271, which can reduce RC effects (compared with including column drivers along the entirety of the dummy pixel driver array 271D-1). Specifically, column drivers 271D-1 are tapped along an upper portion only of the dummy pixel driver array 271D-1 (to drive the bitlines D in the right portion of the pixel driver array 150) and column drivers are not tapped along a left portion of the dummy pixel driver array 271D-1. Instead, for example, dummy pixel driver array 271F-2 has column drivers 271F-1 along a left portion of the dummy pixel driver array 271F-1 (to drive the wordlines F in the left portion of the pixel driver array 150).

As an example of loading that can be implemented for a configuration such as that shown in FIG. 7B, 8 sections of 8 column drivers each (to drive a total of 64 bitlines) can each be tapped to one of 16 dummy pixel driver arrays (which are arranged in parallel as shown in FIG. 7B). Accordingly, each one of the 16 dummy pixel driver arrays can be tapped 8 times with 8 different sections of column drivers (only one tap and one section of column drivers is shown for each dummy pixel driver array in FIG. 7B). This configuration can drive 1024 different bitlines within a pixel driver array.

Figure 7C:
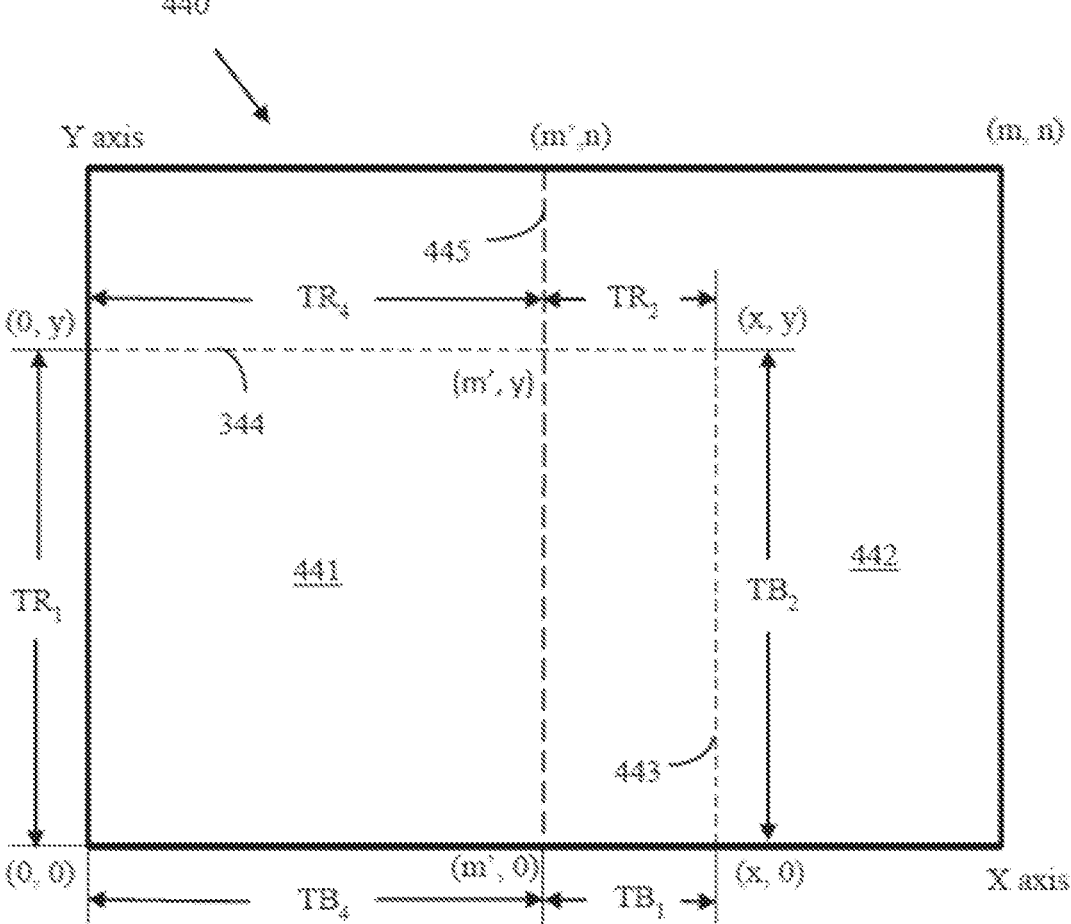
FIG. 7C is an illustration of time delays in a section of a display located further from its bit line drivers than other sections.

FIG. 7C depicts a case wherein the display is divided into vertical sections 441 and 442. Any of the features described in connection with FIG. 2A or 7B can be applied and included in FIG. 7C. Again SRAM array 440 comprises an array of pixel drivers, each comprising a memory cell, of m columns by n rows. The dividing line for vertical sections 441 and 442 is vertical dashed line 445 between coordinates (m', 0) and (m', n) M' is m prime. If m'=m/2, then the two vertical sections are of equal width. For engineering or other reasons, one vertical section may be wider than the other within the bounds of this invention. In one embodiment, the display comprises four vertical sections, of which the present example shows a left half. While the example emphasizes one pixel driver at coordinate (x, y) it is understood that pixel drivers at all coordinates must operate as the example does in order for the solution to be a general one.

The calculations for this example are an extension of those developed for FIG. 2A. The differences are in the presence on the word line of an extended section underneath a vertical section wherein the word line does not interact with the pixel drivers above it and a similarly long section caused by the display controller for that vertical section needing to reach the left edge of the display. The latter is required since the area comprising the array of pixel drivers must be continuous and cannot have gaps in it to accommodate other types of circuitry.

The general approach in this embodiment is to make the time required for the word line high signal to propagate from the word line driver at coordinate (0, y) to the target pixel driver at coordinates (x, y) equal to the time required for the bit line trigger signal to propagate from the circuit near coordinates (0, 0) to the bit line driver at coordinate (x, 0). A second part of the current approach is to make the time required for the word line trigger signal to propagate from the circuit near coordinates (0, 0) to the row decoder and word line select circuit at coordinate (0, y) substantially equal to the time required for the complementary bit line data to propagate up complementary bit lines 443 to the target pixel driver at coordinates (x, y).

Signals in FIG. 7C are started from a circuit near coordinate (0, 0) in the lower left corner of array 340 in one embodiment. The coordinates may should be considered as represent the rows and column of array 340.

Signal TR₁ represents the propagation time for a word line trigger signal. A word line trigger signal requiring time TR₁ to propagate originates in a circuit positioned near coordinate (0, 0) and is delivered to an AND gate (not shown) in the row decoder and word line circuit for each row. The second input to the AND gate is the signal from the row decoder circuit of the row select circuitry. Since only one row is selected, only one AND gate has its logic satisfied and holds the word line for that row high.

In one embodiment, the AND gate is not used and a tri-state buffer is used in its place. A tristate buffer has one input, which is the data from the word line decoder, and an enable signal, which in this case is the row decoder and word line trigger signal. Before the word line trigger signal is asserted on the enable terminal, the output of the tri-state buffer floats. Afterwards, the driver for the rows not selected are low and the drive for the selected row is high. This performs somewhat the same function logically as the AND gate but does not continuously drive the on state word line.

Once the word line driver output is pulled high, the word line signal propagates down word line 444 beginning at coordinate (0, y). The first segment requires time TR₄ to propagate across vertical section 441 of array 440. Wordline 444 does not interact with any of the pixel drivers of vertical section 441 but wordline 344 does interact with all of the pixel drivers of vertical section 442, thereby creating a condition where the RC characteristic of the part of word line 444 with vertical section 441 is different to the RC characteristic of the part of word line 444 within vertical section 442. It is estimated that the capacitance of the section within vertical section 441 is lower than the capacitance of the section of word line 444 within vertical section 442, although this is less important than the possibility that the RC time constant in the two vertical sections may be different. The portion of word line 344 within vertical 342 actually extends to coordinate (m, y). The termination at coordinate (x, Y) is to facilitate the remainder of the discussion regarding propagation delay.

The total time T_{TOT_WLINE} required for a word line signal to reach coordinate (x, y). The components are the time TR₁ required for the word line trigger signal to reach the selected row, TR₃ for the time required to satisfy the AND gate logic, TR₄ for the propagation time across vertical section 341, and TR₂ for the time required to reach coordinate (x, y) within vertical 342. This may be stated in closed form as T_{TOT_WLINE}=TR₁ TR₂+TR₃+TR₄

Releasing the bit line data onto the complementary bit lines for delivery to pixel drivers on a selected row creates a second timing issue that must be taken into account. The bit line trigger signal originates in a circuit near coordinate (0, 0) and propagates to a bit line driver (not shown) at coordinate (x, 0). Bit line data is loaded onto complementary bit lines in response to the receipt of the bit line trigger signal. The complementary data propagates on bit lines 443 to coordinate (x, y) where it can be loaded onto the SRAM memory cell located at that coordinate.

In one embodiment, the output of a bit line memory data cell is asserted on a tri-state buffer. A tristate buffer has one data input, which is the pixel driver data from the bit line memory cell, and an enable signal in the form of a bit line trigger signal. Before the bit line trigger signal is asserted on the enable terminal, the output of the tri-state buffer floats. This effectively prevents the new bit line data from encountering a word line that is still high from the previous row write sequence. All bit line drivers in all of the various embodiments of this disclosure may operate in this manner.

In order for the bit line trigger signal propagation delays TB₄ and TB₁ to match the propagation delays TR₄ and TR₂ on word line 444, it must match the RC time constant for the section of word line 344 that passes under vertical section 441 and the RC time constant for the section of word line 344 that passes under vertical section 442. In other words, TR₄=TB₄ and TR₂=TB₁ as close as possible.

Word line 444 propagation time TR₄ through vertical section 341 is invariant since all pixel drivers responsive to word line 344 lie within vertical section 342 and all signals directed to pixel drivers in vertical section 342 must transit vertical section 341. As a result, bit line trigger signal propagation time in a region parallel to vertical section 341 should be invariant as well. In one embodiment, TR₄ TB₄ and in fact TR₄≥TB₄. The inequality may result from using a direct line not parallel to vertical section 341. Additional delay elements located elsewhere may compensate for the inequality in that case.

The portion of word line 444 that serves the pixel drivers of vertical section 442 does interact with all the pixel drivers found along row y associated with coordinates (x, y). The time TR₂ required for the word line signal to propagate to coordinate (x, y) from coordinate (m', y), the point at which it enters vertical section 442, should be the same as time TB₁, the time required for the bit line trigger signal to propagate from a point adjacent to coordinate (m', 0) to coordinate (x, 0), the location of the bit line driver. Circumstances under which a shortened bit line driver trigger circuit delivers a trigger signal along a trigger circuit parallel to a part, but not all, of the lower base of vertical section 441 is conceived and can be accommodated by compensating delays generated by other circuits.

The most efficient way to match propagation delay is to match the RC characteristics and the length of word line 444 on the bit line trigger signal line. Applicant notes that using same type circuit in both locations will result in a similar RC characteristic provided the capacitances on the two circuits remain substantially the same. In the case of word line 444, the design requirements of the word line are dictated by the design whereas the design requirements of the bit line trigger circuit used to deliver the bit line signal are more flexible. By designing in the use of a circuit similar to the word line to deliver the bit line trigger signal to the bit line driver, the propagation characteristics of the two circuits should be substantially alike. The regular geometry of the array of pixel drivers supports that implementation.

In the case of the propagation of the complementary bit line data on the bit line, a similar approach can be taken with respect to the propagation of the word line trigger signal. The structure of the complementary bit lines 443 is determined by the data requirements for the SRAM memory cell and by the pitch of the pixel drivers. Again it is possible to use an identical structure to deliver the word line release signal to the row decoder and word line drive circuits. This case is simpler because bit line circuits 443 only propagate through active pixel drivers and has the potential to interact with a pixel driver on any row, although it will in a given instance only interact with the one for which the word line signal is high.

Example 1: A backplane forming part of a display system operative to drive an array of pixel drivers, the backplane comprising a plurality of rows and a plurality of columns of pixel drivers, wherein each pixel driver comprises a memory circuit operative to hold a bit of image data and each pixel driver operative to apply a drive waveform responsive to the image data state of the memory circuit, and wherein the backplane further comprises at least one row decoder for each row of the array of pixel drivers wherein each row decoder is operative to drive a single word line circuit arrayed on a single row segment to select the memory circuits of the pixel drivers to receive data over bit lines, and wherein the number of row segments for each row equals the number of row decoders for each row, and wherein the set of row decoder circuits comprises at least one row decoder circuit for each row of pixel drivers is arrayed along a side of the array of pixel drivers, and wherein a row decoder control circuit located near the row decoder circuits and in proximity to a bottom row of the array of pixel drivers releases signals to the row decoder circuits that determine which row is selected to receive data, and wherein a row decoder circuit, upon detecting that it is selected, passes a signal to a word line driver to enable its word line to be driven to a state wherein the memory circuits of the row segment that are connected to the word line are placed in a state to receive data from the column drivers over bit lines, and wherein the data to be loaded onto the pixel drivers of the row to be selected by the word line are placed on memory circuits, each forming part of a column driver circuit of a set of column driver circuits, by data handling circuits, and wherein a column driver control circuit located near the same corner of the array of pixel drivers at which the row decoder control circuit sends a signal to a logic circuit to assert the values on the memory circuits of the column drivers onto the bit lines, and wherein the circuit over which the column driver control circuit sends signals to assert the values on the memory circuits of the column drive circuits on the bit lines is substantially RC matched to and substantially coextensive with, the word line circuits of the array of pixel drivers, such that the propagation delays of the two circuits are substantially matched over any selected similar distance on the two circuits.

Example 2: The backplane of example 1, wherein the circuit over which the column driver control circuit sends trigger signals to the column driver circuits matches the layout of the selected word line circuit and at least one adjacent non-selected word line circuit.

Example 3: The backplane of example 2, wherein the word line driver circuit comprises a memory circuit, an optional level shifter, a bistable logic circuit operative to receive an input from the level shifter and to receive a second input from a trigger signal circuit and operative to assert an output to an associated word line.

Example 4: The backplane of example 3, wherein the trigger signal circuit over which the column driver control circuit sends trigger signals to the column driver circuits, comprises a series of conductor circuits that each tap the circuit over which the trigger signal is asserted and delivers those signals to the second inputs of a plurality of bistable logic circuits, and wherein the conductor circuits are substantially parallel to the circuit over which the column driver control circuit sends trigger signals with propagation in the same direction.

Example 5: The backplane of example 4, wherein each of the conductor circuits that tap the circuit over which the trigger signal is sent comprises a sample circuit positioned between the tap point on the circuit on which the trigger signal is asserted and the series of points on the conductor circuit at which it connects to the second input of the bistable logic circuits, wherein the sample circuit comprises a rising edge detector circuit element and an output circuit operative to hold its output high for a period of time sufficient to enable the column driver circuit to assert its output on a bit line and short enough to ensure the bistable logic circuit does not have a signal present on its second input when the next data is written to the memory circuit of the column driver.

Example 6: The backplane of example 1, where the word line driver circuit operative to control the word line for a single row segment comprises a logic circuit operative to release a signal when two valid inputs are received, an optional voltage level shifter and an optional isolating inverter circuit, and wherein the two inputs to the logic circuit are a signal from the row decoder circuit for the row and a release signal received over a conductor from a release timing circuit, thereby enabling the output of the selected row to place the word line controlled by the word line driver circuit to be placed in state so that the memory circuits of the pixel drivers attached to that word line are placed in a state to receive data asserted over bit lines from a group of column drivers associated with those bit lines.

Example 7: The backplane of example 6, wherein the logic circuit comprises one of an AND gate, a level sensitive D flip-flop, or an edge sensitive D latch.

Example 8: The backplane of example 6, wherein the conductor from the release timing circuit for the word line drivers comprises a main conductor and a plurality of shorter parallel conductors that connect to the main conductor at periodic tap points at which the shorter conductors connect to the main conductor and to an input to a subset of the logic circuits comprising at least a plurality, each forming a part of a word line driver circuit, and wherein the shorter conductors are substantially parallel to the main conductor and have the currents thereon flow in substantially the same direction as the direction of the current on the main conductor.

Example 9: The backplane of example 7, wherein each of the plurality of shorter parallel conductors comprises a sample circuit positioned between the tap point on the main conductor and the inputs to the subset of the logic circuits.

Example 10: The backplane of example 6, wherein the conductor over which the release signal is received is a bit line of at least one column of dummy pixel drivers substantially identical to the active pixel drivers and bit lines of the active array, and wherein the release signal to a dummy column driver circuit is controlled and generated by a control circuit that is operative to assert a timing release signal on the memory circuit of a dummy column driver circuit substantially identical to the active column driver circuit and wherein the memory circuit is set to a data state such that the signal propagating on the conductor is configured to satisfy the input requirements of the logic circuit for release of its signal.

Example 11: The backplane of example 10, wherein the memory circuit of the dummy column driver is configured such that the memory circuit is always in an ON state such that, when the release signal is received at the dummy column driver circuit from the control circuit, the conductor receives the release signal to be delivered to one input of each of the logic circuits of the associated word line driver circuits.

Example 12: The backplane of example 1, wherein the backplane that comprises at least one row decoder circuit for each row of the array of pixel drivers comprises at least two row decoder circuits for each row of the array of pixel drivers wherein each row decoder circuit is operative to drive a single word line circuit segment arrayed on a section of a single row to select the memory circuits of the pixel drivers of that section operated by the word line to receive data over bit lines, and wherein each row of the array of pixel drivers comprises a like number of pixel drivers, and wherein the rows of the array of pixel drivers are divided vertically into non-overlapping sections with distinct vertical boundaries, the number of vertical sections corresponding to the number of row decoder circuits, and wherein all pixel drivers of all rows are located in one and only one section, wherein all the pixel drivers of each row segment within each section are each operated by a single word line driver controlled by a single row decoder circuit, and wherein each row is controlled by the same number of row decoder circuits in the same positions relative to an edge of the array of pixel drivers, and wherein a first of the at least two row decoders for each row of the array of pixel drivers is positioned in proximity to an edge of the array of pixel drivers, and wherein the second of the at least two row decoder circuits for each row of the array of pixel drivers is positioned in proximity to the first of the at least two row decoder circuits with the first of at least two row decoder circuits between the second of at least two row decoder circuits and the edge of the array of pixel drivers, and wherein each of the at least two row decoders for each row connects to a word line for a different segment of that row through an intervening word line driver, and wherein the first of the at least two row decoder circuits positioned near to an edge of the array of pixel drivers controls a word line operative to control the memory circuits of an associated row of the first vertical section of the array of pixel drivers and wherein the second of the at least two row decoder circuits positioned near the first of the at least two row decoder circuits positioned near the edge of the array of pixel drivers controls a second word line operative to control the memory circuits of a row of the second vertical section of the array of pixel drivers, and wherein one of the first and second vertical sections of the array of pixel drivers is adjacent to the edge of the array of pixel drivers and the other of the first and second vertical sections of the array of pixel drivers is adjacent to the opposite edge of the other vertical section of pixel drivers, and wherein the word lines for the rows of the vertical section of the array of pixel drivers adjacent to the edge of the array of pixel drivers controls state of the memory circuits of that vertical section and wherein the word lines for the rows of the vertical section of the array of pixel drivers adjacent to the opposite edge of the vertical section of the array of pixel drivers adjacent to the edge of the array of pixel drivers each comprise a first word line segment that passes through the first vertical section without interacting with the memory circuits of the pixel drivers thereof and a second word line segment electrically connected to the non-interacting first word line segment that passes through the second vertical section and controls the state of the memory circuits of the pixel drivers thereof, and wherein a separate row decoder control circuit is present for each set of row decoder circuits operative to control the state of the memory circuits of the rows of one of the vertical sections of pixel drivers, and wherein each separate row decoder circuit receives a signal from the row decoder control circuit for that set of row decoder circuits, which signal determines which row is selected for data to be written to the memory circuits of the pixel drivers of that row that are controlled by the word line control circuit by the word line controlled by the row decoder circuit, and wherein each row decoder circuit, upon detecting that it is selected, passes a signal to its associated word line driver to enable the associated word line segment to be driven to a state wherein the memory circuits that are connected to that word line segment are placed in a state to receives data over bit lines, and wherein the data to be loaded onto the pixel drivers of the row segment to be selected by the word line are loaded on memory circuits, each forming part of a column driver circuit of a set of column driver circuits, by data handling circuits, and wherein a column driver control circuit is located near the bottom of the array of pixel drivers in a corner position to be able to deliver a release signal to logic circuit that enables the column drive circuits to assert the data values on the memory circuits of the column drivers onto the bit lines, and wherein the circuit over which each column driver control circuit sends signals to its associated column driver circuits to assert the values on the memory circuits of the column driver circuits onto the bit lines is substantially RC matched to the word line circuits of the array of pixel drivers of the array of pixel drivers, such that the propagation delays of the two circuits are substantially matched over any selected distance.

Example 13: The backplane of example 12, wherein the circuits over which each of the column driver control circuits sends a trigger signal to their respective column driver circuits matches the layout of the selected word lines for the respective word line circuits associated with the same section of the array of pixel drivers.

Example 14: The backplane of example 13, wherein each of the word line driver circuits comprises a memory circuit, an optional level shifter or alternatively a conductor, a bistable logic circuit operative to receive an input from the optional level shifter or conductor and to receive a second input from a trigger signal circuit and operative to assert an output onto one of a plurality of inverter circuits in series.

Example 15: The backplane of example 12, wherein each word line driver circuit operative to control the word line for a segment of a single row comprises a logic circuit operative to release a signal when two valid inputs are received, an optional voltage level shifter or direct conductor, and an optional isolating inverter circuit, and wherein the two inputs to the logic circuit are a signal from the row decoder circuit for the row and a release signal received over a conductor from a release timing circuit, thereby enabling the output of the selected word line driver circuit to place the word line controlled by the word line driver circuit in a state such that the memory circuits of the pixel drivers attached to those word lines to receive data asserted over bit lines from the group of column drivers associated with those bit lines.

Example 16: The backplane of example 15, wherein the logic circuit comprises one of an AND gate, a D flip-flop circuit that responds to signal levels, or a D latch that responds to the edges of the signals applied to it.

Example 17: The backplane of example 1, wherein the word line high signal operates at a lower voltage than the upper supply voltage for the array of pixel drivers.

Example 1A: An apparatus, comprising: a pixel driver of interest within a pixel driver array; a wordline path including a row select path and a wordline, the row select path including a plurality of row drivers and a first plurality of dummy pixel drivers; and a bitline path including a data load trigger path and a bitline, the wordline and the bitline intersecting at the pixel driver of interest within the pixel driver array, the data load trigger path includes a column driver and a second plurality of dummy pixel drivers.

Example 2A: The apparatus of example 1A, wherein the first plurality of dummy pixel drivers are adapted to mirror a configuration of the wordline.

Example 3A: The apparatus of any of examples 1A or 2A, wherein the first plurality of dummy pixel drivers are simulated by a plurality of disabled data storage elements.

Example 4A: The apparatus of example 3A, wherein the plurality of disabled data storage elements are adapted to introduce an RC characteristic along an enable line to a trigger source of a trigger initiating circuit.

Example 5A: The apparatus of example 4A, wherein the RC characteristic along the enable line is determined as RC characteristic of the data load trigger path.

Example 6A: The apparatus of example 1A, wherein the column driver includes a disabled data storage element.

Example 7A: The apparatus of any of examples 1A to 6A, wherein the row select path is aligned orthogonal to the wordline and aligned parallel to the bitline.

Example 8A: The apparatus of any of examples 1A to 7A, wherein the wordline follows the row select path within the wordline path, and the bitline follows the data load trigger path within the bitline path.

Example 9A: The apparatus of any of examples 1A to 8A, wherein the row select path is disposed outside of the pixel driver array and the wordline is disposed within the pixel driver array.

Example 10A: The apparatus of any of examples 1A to 9A, wherein the data load trigger path is disposed outside of the pixel driver array and the bitline is disposed within the pixel driver array.

Example 11A: The apparatus of any of examples 1A to 10A, wherein the row select path within the wordline path is aligned parallel to the bitline.

Example 12A: The apparatus of any of examples 1A to 11A, wherein the data load trigger path within the bitline path is aligned parallel to the wordline.

Example 13A: The apparatus of any of examples 1A to 12A, further comprising: a trigger initiating circuit configured to send image data via the wordline path and the bitline path.

Example 14A: The apparatus of any of examples 1A to 13A, wherein the row select path includes a first row select path portion parallel with a second row select path portion.

Example 15A: The apparatus of example 14A, wherein the first row select path portion includes a section of row drivers with dummy pixel drivers and a section of dummy pixel drivers without row drivers.

Example 16A: The apparatus of any of examples 1A to 15A, wherein the row select path and the data load trigger path are included within a backplane associated with the pixel driver array.

Example 17A: The apparatus of any of examples 1A to 16A, wherein the pixel driver array comprises a plurality of wordlines and a plurality of bitlines, and an array of dummy pixel drivers adapted to mirror a configuration of the plurality of wordlines and the plurality of bitlines.

The implementations described herein enable the development of a large scale array of pixel drivers based on memory elements with a predictable delay from the initiation of writing of a pixel driver to the writing of the pixel driver for both bitlines and wordlines by using design techniques to reduce time discrepancies between the time of arrival of the rising wordline and the time of arrive of data to be written on the bitlines. The design techniques described herein, when implemented, will result in accurate time tracking to all pixel drivers of the array and not to just a small subset in one location.

Other applications of the design techniques described herein are conceived within the implementations described herein.

Various implementations of the systems and techniques described here can be realized in digital electronic circuitry, integrated circuitry, specially designed ASICs (application specific integrated circuits), computer hardware, firmware, software, and/or combinations thereof. These various implementations can include implementation in one or more computer programs that are executable and/or interpretable on a programmable system including at least one programmable processor, which may be special or general purpose, coupled to receive data and instructions from, and to transmit data and instructions to, a storage system, at least one input device, and at least one output device.

These computer programs (also known as programs, software, software applications or code) include machine instructions for a programmable processor, and can be implemented in a high-level procedural and/or object-oriented programming language, and/or in assembly/machine language. As used herein, the terms "machine-readable medium" "computer-readable medium" refers to any computer program product, apparatus and/or device (e.g., magnetic discs, optical disks, memory, Programmable Logic Devices (PLDs)) used to provide machine instructions and/or data to a programmable processor, including a machine-readable medium that receives machine instructions as a machine-readable signal. The term "machine-readable signal" refers to any signal used to provide machine instructions and/or data to a programmable processor.

To provide for interaction with a user, the systems and techniques described here can be implemented on a computer having a display device (e.g., a CRT (cathode ray tube) or LCD (liquid crystal display) monitor) for displaying information to the user and a keyboard and a pointing device (e.g., a mouse or a trackball) by which the user can provide input to the computer. Other kinds of devices can be used to provide for interaction with a user as well; for example, feedback provided to the user can be any form of sensory feedback (e.g., visual feedback, auditory feedback, or tactile feedback); and input from the user can be received in any form, including acoustic, speech, or tactile input.

The systems and techniques described here can be implemented in a computing system that includes a back end component (e.g., as a data server), or that includes a middleware component (e.g., an application server), or that includes a front end component (e.g., a client computer having a graphical user interface or a Web browser through which a user can interact with an implementation of the systems and techniques described here), or any combination of such back end, middleware, or front end components. The components of the system can be interconnected by any form or medium of digital data communication (e.g., a communication network). Examples of communication networks include a local area network ("LAN"), a wide area network ("WAN"), and the Internet.

The computing system can include clients and servers. A client and server are generally remote from each other and typically interact through a communication network. The relationship of client and server arises by virtue of computer programs running on the respective computers and having a client-server relationship to each other.

In this specification and the appended claims, the singular forms "a," "an" and "the" do not exclude the plural reference unless the context clearly dictates otherwise. Further, conjunctions such as "and," "or," and "and/or" are inclusive unless the context clearly dictates otherwise. For example, "A and/or B" includes A alone, B alone, and A with B. Further, connecting lines or connectors shown in the various figures presented are intended to represent example functional relationships and/or physical or logical couplings between the various elements. Many alternative or additional functional relationships, physical connections or logical connections may be present in a practical device. Moreover, no item or component is essential to the practice of the implementations disclosed herein unless the element is specifically described as "essential" or "critical".

Terms such as, but not limited to, approximately, substantially, generally, etc. are used herein to indicate that a precise value or range thereof is not required and need not be specified. As used herein, the terms discussed above will have ready and instant meaning to one of ordinary skill in the art.

Moreover, use of terms such as up, down, top, bottom, side, end, front, back, etc. herein are used with reference to a currently considered or illustrated orientation. If they are considered with respect to another orientation, it should be understood that such terms must be correspondingly modified.

Although certain example computer-implemented methods, apparatuses and articles of manufacture have been described herein, the scope of coverage of this patent is not limited thereto. It is to be understood that terminology employed herein is for the purpose of describing particular aspects, and is not intended to be limiting. On the contrary, this patent covers all methods, apparatus and articles of manufacture fairly falling within the scope of the claims of this patent.

In one aspect, a non-transitory computer-readable medium stores instructions that, when executed by a processor on a receiving computing device, causes the receiving computing device to perform any of the methods disclosed herein.

In one aspect, a computing device can be configured with at least one processor and memory storing instructions that, when executed by the at least one processor, performs any of the methods disclosed herein.

The invention claimed is:

1. An apparatus, comprising:
a pixel driver of interest within a pixel driver array;
a wordline path including a row select path and a wordline; and
a bitline path including a data load trigger path and a bitline, the wordline and the bitline intersecting at the pixel driver of interest within the pixel driver array, the data load trigger path including a plurality of column drivers and a plurality of dummy pixel drivers disposed outside of the pixel driver array,
the plurality of column drivers including a first section tapped from a first portion of the plurality of dummy pixel drivers and including a second section tapped from a second portion of the plurality of dummy pixel drivers, the first portion of the plurality of dummy pixel drivers being aligned parallel to the second portion of the plurality of dummy pixel drivers, and
the plurality of dummy pixel drivers including a plurality of disabled data storage elements and configured to introduce a resistor-capacitor (RC) characteristic corresponding with an RC characteristic of at least a portion of the bitline.

2. The apparatus of claim 1, wherein the plurality of dummy pixel drivers are configured to correspond with a configuration of the wordline.

3. The apparatus of claim 1, wherein the plurality of disabled data storage elements introduce the resistor-capacitor (RC) characteristic along an enable line to a trigger source of a trigger initiating circuit.

4. The apparatus of claim 1, wherein the row select path is aligned orthogonal to the wordline and aligned parallel to the bitline.

5. The apparatus of claim 1, wherein the wordline follows the row select path within the wordline path, and the bitline follows the data load trigger path within the bitline path.

6. The apparatus of claim 1, wherein at least one of the wordline or the bitline is disposed within the pixel driver array.

7. The apparatus of claim 1, wherein the row select path within the wordline path is aligned parallel to the bitline.

8. The apparatus of claim 1, wherein the data load trigger path within the bitline path is aligned parallel to the wordline.

9. The apparatus of claim 1, further comprising:
a trigger initiating circuit configured to send image data via the wordline path and the bitline path.

10. The apparatus of claim 1, wherein the row select path includes a first row select path portion parallel with a second row select path portion.

11. The apparatus of claim 1, wherein the row select path and the data load trigger path are included within a backplane associated with the pixel driver array.

12. The apparatus of claim 1, wherein the pixel driver array includes a plurality of wordlines and a plurality of bitlines, and an array of dummy pixel drivers configured to correspond with a configuration of the plurality of wordlines and the plurality of bitlines.

13. The apparatus of claim 1, wherein the plurality of dummy pixel drivers have a length equal to a length of the bitline and to a length of the plurality of column drivers.

14. The apparatus of claim 1, wherein the data load trigger path includes the first portion of the plurality of dummy pixel drivers disposed between a trigger initiating circuit and the first section of the plurality of column drivers.

15. An apparatus, comprising:
a pixel driver of interest within a pixel driver array;
a wordline path including a row select path and a wordline, the row select path including a plurality of row drivers and a plurality of dummy pixel drivers, the plurality of row drivers including a first section tapped from a first portion of the plurality of dummy pixel drivers and including a second section tapped from a second portion of the plurality of dummy pixel drivers, the row select path including the first portion of the plurality of dummy pixel drivers disposed between a trigger initiating circuit and the first section of the plurality of row drivers; and
a bitline path including a data load trigger path and a bitline, the wordline and the bitline intersecting at the pixel driver of interest within the pixel driver array, and
the plurality of dummy pixel drivers including a plurality of disabled data storage elements configured to introduce an RC characteristic along an enable line to a trigger source of the trigger initiating circuit.

16. The apparatus of claim 15, wherein the trigger initiating circuit is configured to send image data via the wordline path and the bitline path.

17. The apparatus of claim 15, wherein the plurality of dummy pixel drivers includes a first dummy pixel driver array aligned parallel to a second dummy pixel driver array.

18. The apparatus of claim 15, wherein the plurality of dummy pixel drivers includes a first dummy pixel driver array aligned parallel to a second dummy pixel driver array and aligned parallel to plurality of row drivers.

19. An apparatus, comprising:
a pixel driver of interest within a pixel driver array;

a wordline path including a row select path and a word-line, the row select path including a plurality of row drivers and a first plurality of dummy pixel drivers; and a bitline path including a data load trigger path and a bitline, the wordline and the bitline intersecting at the pixel driver of interest within the pixel driver array, the data load trigger path including a plurality of column drivers and a second plurality of dummy pixel drivers, the plurality of row drivers including a first section of row drivers tapped from a first dummy pixel driver from the first plurality of dummy pixel drivers, the plurality of row drivers including a second section of row drivers tapped from a second dummy pixel driver from the first plurality of dummy pixel drivers, the first dummy pixel driver being disposed along the row select path between the first section of row drivers and a trigger initiating circuit, and the second plurality of dummy pixel drivers, including a disabled data storage element, configured to introduce an RC characteristic corresponding with an RC characteristic of at least a portion of the wordline.

20. The apparatus of claim 19, wherein the row select path and the data load trigger path are included within a back-plane associated with the pixel driver array.

21. The apparatus of claim 15, wherein the first portion of the plurality of dummy pixel drivers is included in a first dummy pixel driver array aligned parallel to a second dummy pixel driver array including the second portion of the plurality of dummy pixel drivers.

\* \* \* \* \*